United States Patent
Cho et al.

(10) Patent No.: US 12,117,613 B2
(45) Date of Patent: *Oct. 15, 2024

(54) DISPLAY DEVICE, ORGANIC LIGHT EMITTING DISPLAY DEVICE, AND HEAD-MOUNTED DISPLAY DEVICE

(71) Applicant: Samsung Display Co., Ltd., Yongin-si (KR)

(72) Inventors: Sang Hwan Cho, Suwon-si (KR); So Young Lee, Suwon-si (KR); Sun Young Jung, Suwon-si (KR); Chung Sock Choi, Seoul (KR); Sun Mi Kang, Cheonan-si (KR); Hyun Ho Kim, Hwaseong-si (KR); Cheol Jang, Uiwang-si (KR); Sang Hyun Han, Hwaseong-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 403 days.

This patent is subject to a terminal disclaimer.

(21) Appl. No.: 16/901,456

(22) Filed: Jun. 15, 2020

(65) Prior Publication Data

US 2020/0348520 A1 Nov. 5, 2020

Related U.S. Application Data

(63) Continuation of application No. 15/940,583, filed on Mar. 29, 2018, now Pat. No. 10,684,481.

(30) Foreign Application Priority Data

Apr. 28, 2017 (KR) .................... 10-2017-0055626

(51) Int. Cl.
*G02B 5/18* (2006.01)
*G02B 27/01* (2006.01)
(Continued)

(52) U.S. Cl.
CPC ......... *G02B 27/0172* (2013.01); *H10K 50/11* (2023.02); *H10K 50/844* (2023.02);
(Continued)

(58) Field of Classification Search
CPC ................ G02B 27/0172; G02B 27/02; G02B 27/0944; G02B 27/017; G02B 5/1842;
(Continued)

(56) References Cited

U.S. PATENT DOCUMENTS 5,737,042 A 4/1998 Shinohara et al.
5,991,083 A 11/1999 Shirochi
(Continued)

FOREIGN PATENT DOCUMENTS

CN 101541919 9/2009
CN 102918444 2/2013
(Continued)

OTHER PUBLICATIONS

Extended European Search Report—European patent application No. 18169414.2 dated Sep. 17, 2018, citing references listed within.
(Continued)

*Primary Examiner* — Lunyi Lao
*Assistant Examiner* — Jarurat Suteerawongsa
(74) *Attorney, Agent, or Firm* — CANTOR COLBURN LLP

(57) ABSTRACT

A display device includes a substrate, a first display element which is disposed on the substrate, and a plurality of diffraction patterns which are disposed on a path of light emitted from the first display element and arranged along a direction with a first period. when a width of a cross section of one of the plurality of diffraction patterns is defined as a first length, the first period and the first length satisfy Inequality (1):

$$0.4 \leq d1/DP1 \leq 1, \qquad (1)$$

where DP1 is the first period, and d1 is the first length.

20 Claims, 58 Drawing Sheets

(51) Int. Cl.
*H10K 50/11* (2023.01)
*H10K 50/844* (2023.01)
*H10K 50/85* (2023.01)
*H10K 77/10* (2023.01)

(52) U.S. Cl.
CPC ............ *H10K 50/85* (2023.02); *H10K 77/10* (2023.02); *G02F 2201/121* (2013.01); *G02F 2201/123* (2013.01)

(58) Field of Classification Search
CPC ... G02B 5/18; H01L 51/0096; H01L 51/5012; H01L 51/5253; H01L 51/5262; H01L 51/52; H01L 27/32; G02F 2201/121; G02F 2201/123; Y02E 10/549; H10K 50/11; H10K 50/844; H10K 50/85; H10K 77/10; H10K 59/00; H10K 50/80
See application file for complete search history.

(56) References Cited

U.S. PATENT DOCUMENTS

| | | | |
|---|---|---|---|
| 6,859,254 | B2 | 2/2005 | Kim et al. |
| 7,957,621 | B2 | 6/2011 | Zhang et al. |
| 9,306,189 | B2 | 4/2016 | Lee et al. |
| 2005/0024581 | A1 | 2/2005 | Kim et al. |
| 2010/0150513 | A1* | 6/2010 | Zhang .................... B82Y 30/00 385/131 |
| 2010/0164360 | A1 | 7/2010 | Kitamura et al. |
| 2010/0165465 | A1* | 7/2010 | Levola .................. G02B 27/42 359/576 |
| 2011/0084291 | A1* | 4/2011 | Jeong .................. H01L 51/5253 257/89 |
| 2012/0286258 | A1* | 11/2012 | Naraoka ................. C09B 57/00 257/40 |
| 2013/0100511 | A1 | 4/2013 | Yamamoto et al. |
| 2015/0123086 | A1 | 5/2015 | Lee et al. |
| 2015/0362634 | A1* | 12/2015 | Iwase ..................... G02B 1/118 359/601 |
| 2016/0118450 | A1 | 4/2016 | Lee et al. |
| 2016/0127717 | A1* | 5/2016 | Petrov ..................... G09G 3/36 345/100 |
| 2017/0221973 | A1 | 8/2017 | Lee et al. |
| 2017/0248789 | A1* | 8/2017 | Yokoyama ........... G02B 5/1842 |
| 2017/0271623 | A1 | 9/2017 | Wang et al. |
| 2017/0287990 | A1* | 10/2017 | Choi ........................ H04R 9/06 |
| 2018/0088349 | A1 | 3/2018 | Sakohira et al. |

FOREIGN PATENT DOCUMENTS

| | | |
|---|---|---|
| CN | 105552101 | 5/2016 |
| EP | 0409188 | 1/1991 |
| GB | 2544899 | 5/2017 |
| JP | 2005250478 | 9/2005 |
| JP | 2007264555 A | 10/2007 |
| JP | 201314679 | 1/2013 |
| JP | 2017199015 | 11/2017 |
| KR | 1020030058772 | 7/2003 |
| KR | 1020040071066 | 8/2004 |
| KR | 100873517 | 12/2008 |
| KR | 1020110039056 | 4/2011 |
| KR | 1020110106733 | 9/2011 |
| KR | 1020120138037 | 12/2012 |
| KR | 101318072 | 10/2013 |
| KR | 1020140088335 | 7/2014 |
| KR | 1020150052490 | 5/2015 |
| KR | 1020150074169 | 7/2015 |
| WO | 2007116745 | 10/2007 |
| WO | 2017002278 | 1/2017 |

OTHER PUBLICATIONS

India Office Action—India Applicatio No. 201814015993 dated Jan. 24, 2022, citing references listed within.
Japanese Office Action—Japanese Application No. 2018-085392 dated Feb. 28, 2022, citing references listed within.
Notice of Allowance—Korean Application No. 10-2017-0055626 dated Dec. 17, 2021, citing references listed within.
Yosuke Sakohira, et al., "Moiré reducing two-dimensional diffractive optical low-pass filter made from molded plastic", Proc. of SPIE, vol. 9770 97700A-1-97700A-7.
Korean Office Action for Application No. 10-2017-0055626 dated Jul. 27, 2021 enumerating the above listed reference.
Korean Office Action—Korean Application No. 10-2022-0031711, dated May 13, 2022, citing references listed within.
Korean Notice of Allowance—Application No. KR 10-2022-0031711 dated Nov. 28, 2022, citing references listed within.

* cited by examiner

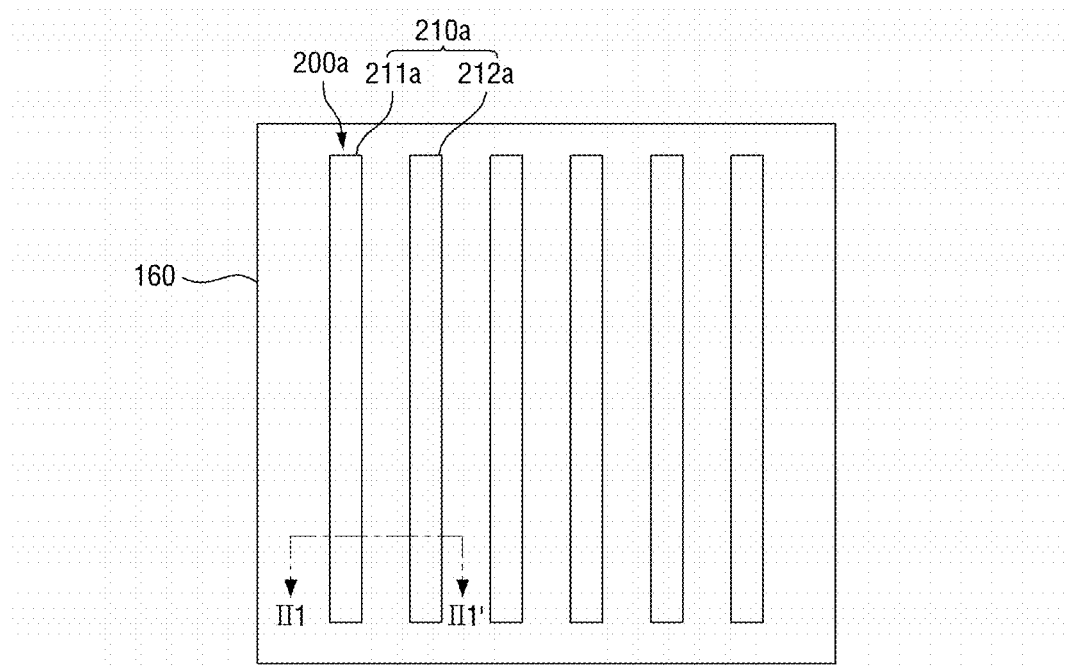
FIG. 39A
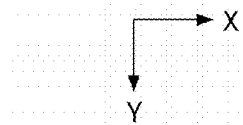
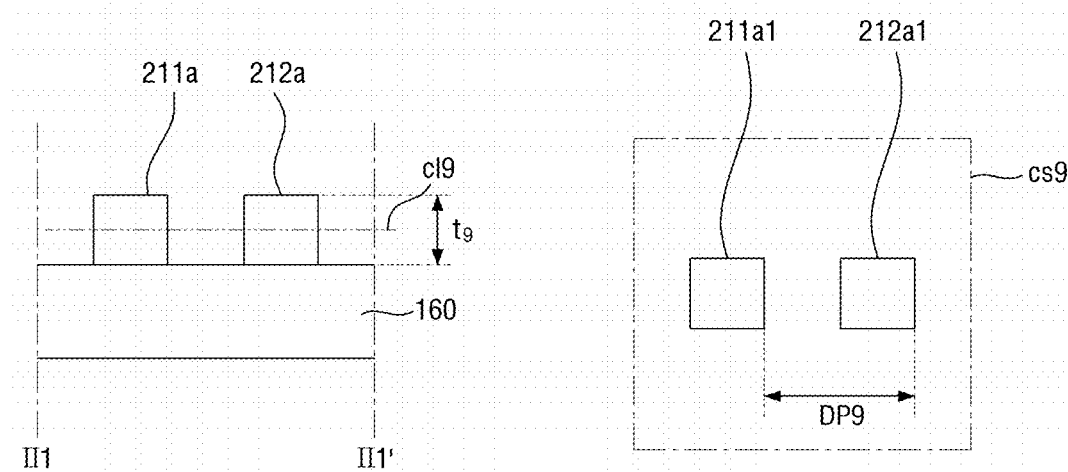
FIG. 39B
FIG. 39C

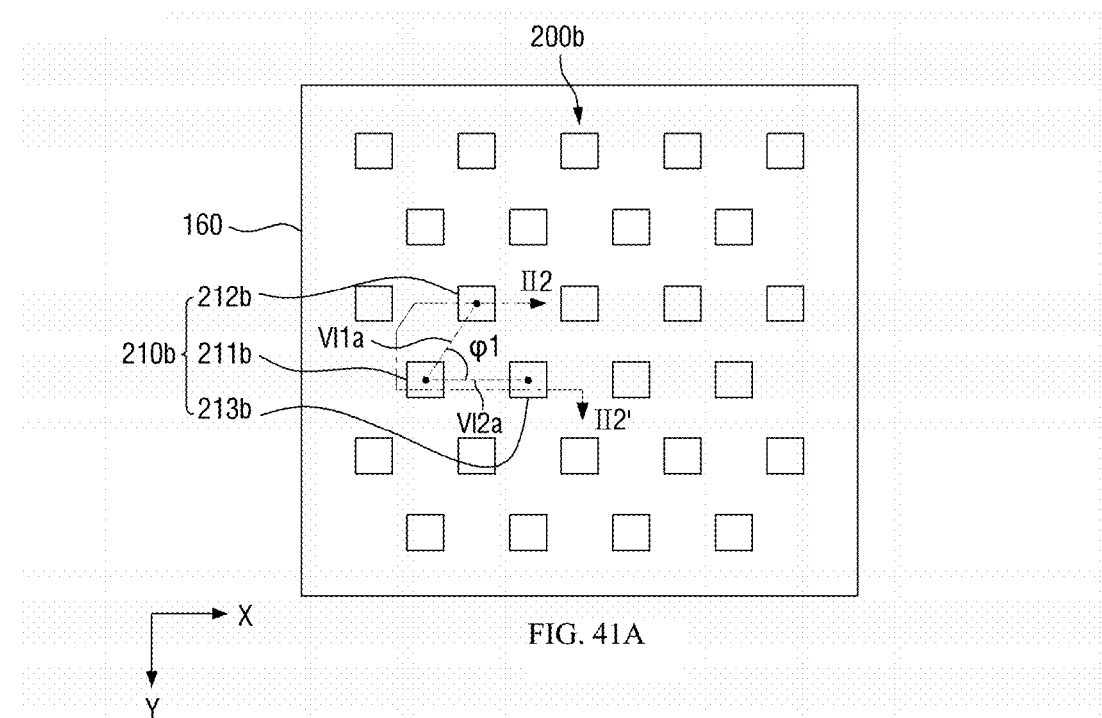
FIG. 41A
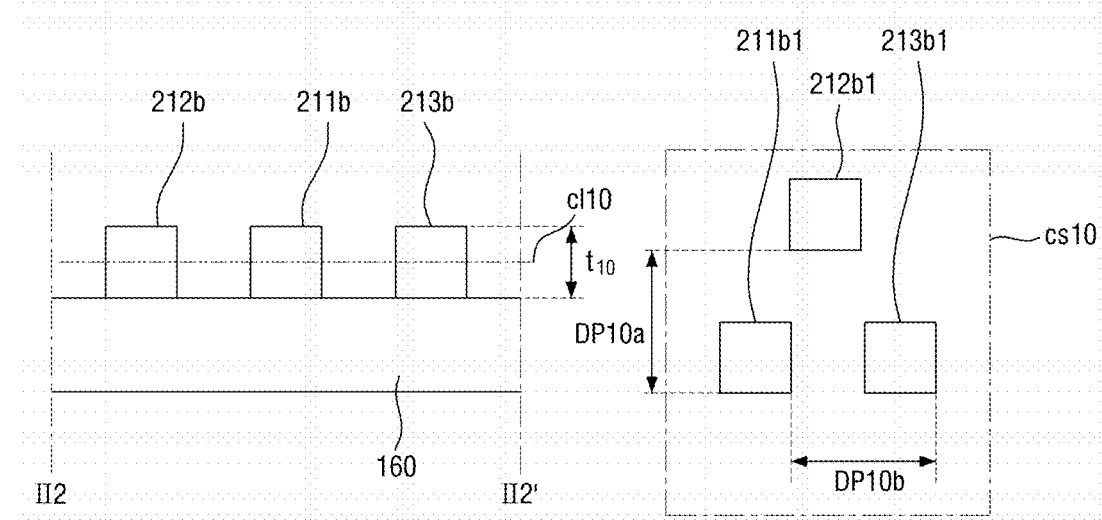
FIG. 41B
FIG. 41C

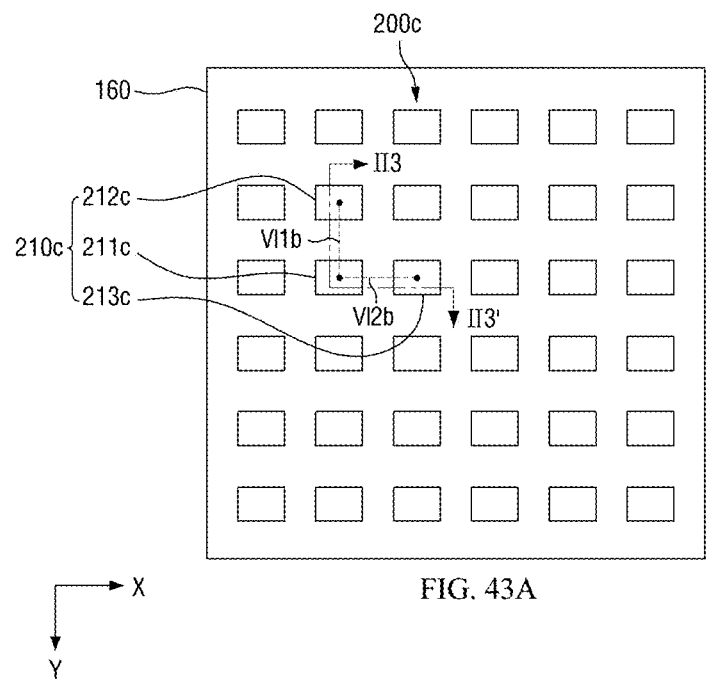
FIG. 43A
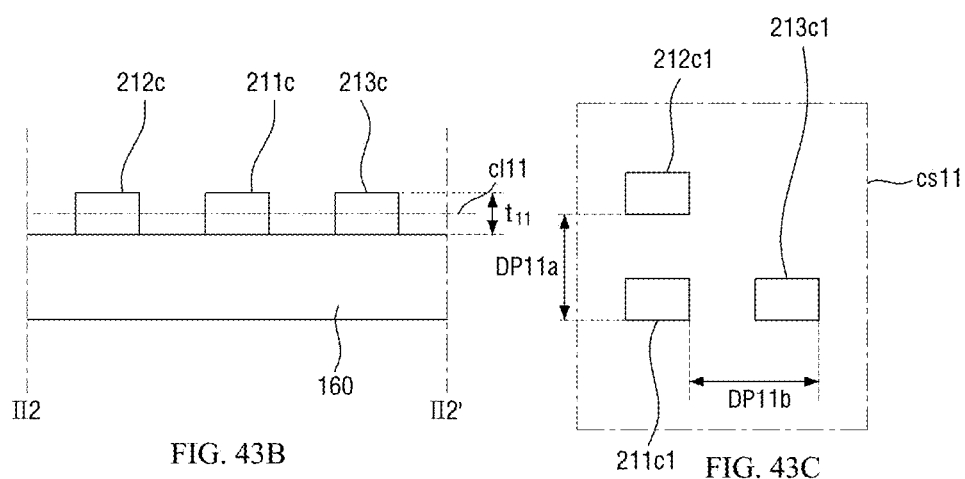
FIG. 43B
FIG. 43C

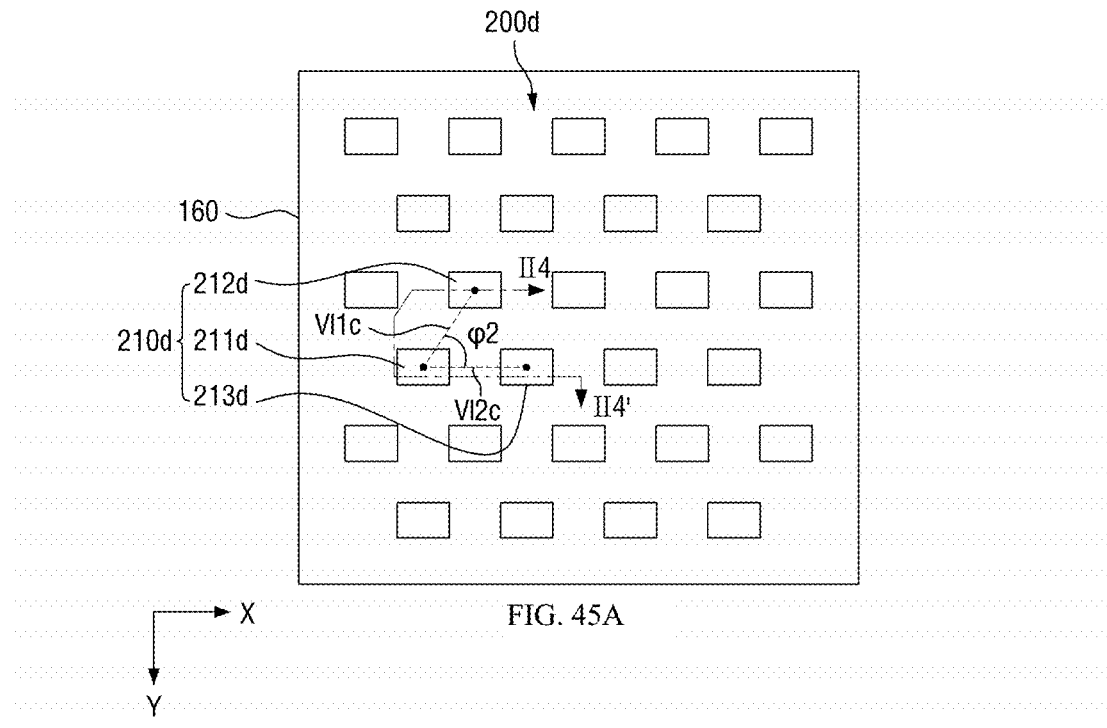
FIG. 45A
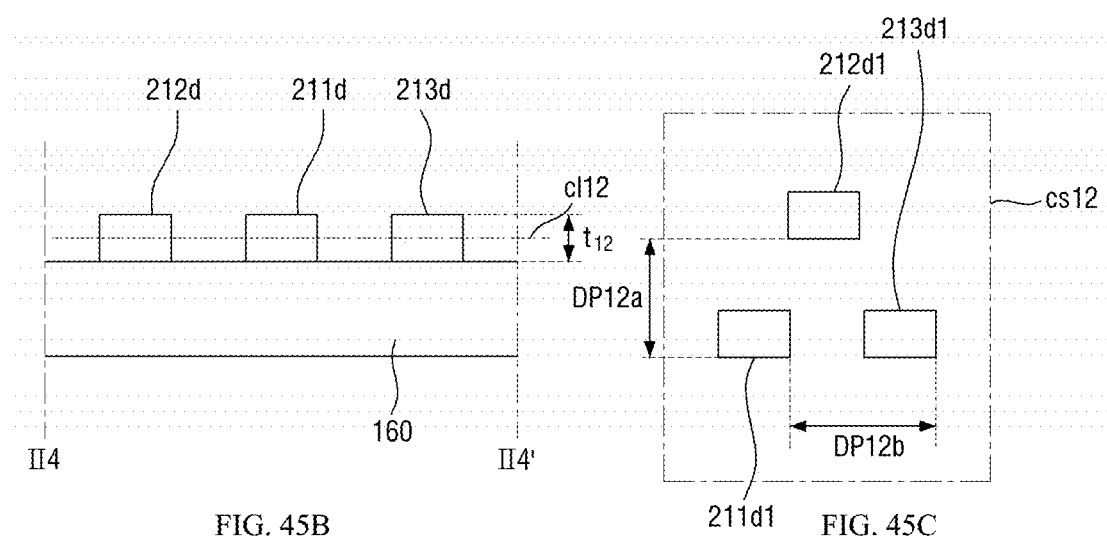
FIG. 45B
FIG. 45C

DISPLAY DEVICE, ORGANIC LIGHT EMITTING DISPLAY DEVICE, AND HEAD-MOUNTED DISPLAY DEVICE

This application is a continuation of U.S. patent application Ser. No. 15/940,583, filed on Mar. 29, 2018, which claims priority to Korean Patent Application No. 10-2017-0055626, filed on Apr. 28, 2017, and all the benefits accruing therefrom under 35 U.S.C. § 119, the content of which in its entirety is herein incorporated by reference.

BACKGROUND

1. Field

Exemplary embodiments of the invention relate to a display device, an organic light emitting display device, and a head-mounted display device.

2. Description of the Related Art

With a development of multimedia, an importance of display devices is increasing. Accordingly, various types of display devices such as liquid crystal displays and organic light emitting displays are being used.

Of these display devices, an organic light emitting display displays an image using an organic light emitting element which generates light through recombination of electrons and holes. Organic light emitting displays have advantages such as fast response speed, high luminance, wide viewing angle, and low power consumption.

A head-mounted display device may be mounted on a user's head and may be in a form of a pair of glasses or a helmet. The head-mounted display device allows the user to recognize an image by displaying the image in front of user's eyes.

SUMMARY

Exemplary embodiments of the invention provide a display device, an organic light emitting display device, and a head-mounted display device which may increase an effective emission area ratio.

Exemplary embodiments of the invention also provide a display device, an organic light emitting display device, and a head-mounted display device which may minimize the degree of blurring perceived.

Exemplary embodiments of the invention also provide a head-mounted display device which may improve a screen door effect ("SDE").

However, exemplary embodiments of the invention are not restricted to the one set forth herein. The above and other exemplary embodiments of the invention will become more apparent to one of ordinary skill in the art to which the invention pertains by referencing the detailed description of the invention given below.

An exemplary embodiment of the invention discloses a display device including a substrate, a first display element which is disposed on the substrate, and a plurality of diffraction patterns which are disposed on a path of light emitted from the first display element and arranged along a direction with a first period. when a width of a cross section of one of the plurality of diffraction patterns may be defined as a first length, the first period and the first length may satisfy Inequality (1):

$$0.4 \leq d1/DP1 \leq 1, \quad (1)$$

where DP1 may be the first period, and d1 is the first length.

An exemplary embodiment of the invention also discloses an organic light emitting display device including a substrate, a first organic light emitting element which is disposed on the substrate, an encapsulation layer which is disposed on the first organic light emitting element, and a plurality of diffraction patterns which are disposed on the encapsulation layer and generate a reference emission pattern and a first duplicate emission pattern by diffracting light emitted from the first organic light emitting element. The plurality of diffraction patterns may be arranged along a direction with a first period, and when a distance between the reference emission pattern and the first duplicate emission pattern may be defined as a diffraction distance and a distance between the first organic light emitting element and the plurality of diffraction patterns may be defined as a separation distance, the diffraction distance satisfies Equation (1):

$$\beta = z \cdot \tan\left[\sin^{-1}\left(\frac{\lambda}{DP1} \cdot \frac{1}{nEN}\right)\right], \quad (1)$$

where $\beta$ may be the diffraction distance, z may be the separation distance, DP1 may be the first period, $\lambda$ may be a wavelength of light emitted from the first organic light emitting element, and nEN may be a refractive index of the encapsulation layer.

An exemplary embodiment of the invention also discloses a head-mounted display device including a display unit which includes a first display element and a plurality of diffraction patterns disposed on a path of light emitted from the first display element, and a lens unit which is disposed on the path of the light emitted from the display unit. The plurality of diffraction patterns may be arranged along a direction with a first period, and when a width of a cross section of one of the plurality of diffraction patterns may be defined as a first length, the first period and the first length may satisfy Inequality (1):

$$0.4 \leq d1/DP1 \leq 1, \quad (1)$$

where DP1 may be the first period, and d1 may be the first length.

An exemplary embodiment of the invention discloses a head-mounted display device including a first display element, a second display element which displays the same color as that of the first display element, a plurality of diffraction patterns which are disposed on a path of light emitted from the first and second display elements and generate a reference emission pattern and a first duplicate emission pattern by diffracting light emitted from the first display element, and an intermediate layer which is disposed on the plurality of diffraction patterns and has a first refractive index. The plurality of diffraction patterns may be arranged along a direction with a first period and each have a second refractive index. when a width of a cross section of one of the plurality of diffraction patterns may be defined as a first length, the first period and the first length may satisfy Inequality (1) below, when a distance between the reference emission pattern and the first duplicate emission pattern may be defined as a diffraction distance and a distance between the first display element and the plurality of diffraction patterns may be defined as a separation distance, the diffraction distance may satisfy Equation (2) below, when a distance between the first display element and the second display element may be defined as an inter-display element distance, the inter-display element distance and the diffraction distance may satisfy Inequality (3) below, and the first refractive index, the second refractive index, and a thickness of one of the plurality of diffraction patterns may satisfy Inequality (4) below:

$$0.4 \le d1/DP1 \le 1, \quad (1)$$

where DP1 may be the first period, and d1 may be the first length, $$\beta = z \cdot \tan\left[\sin^{-1}\left(\frac{\lambda}{DP1} \cdot \frac{1}{nEN}\right)\right], \quad (2)$$

where β may be the diffraction distance, z may be the separation distance, DP1 may be the first period, λ may be a wavelength of light emitted from the first display element, and nEN may be a refractive index of an encapsulation layer, $$0.1 \le \beta/PP1 \le 1.9, \quad (3)$$

where PPI may be the inter-display element distance, and β may be the diffraction distance, $$(m^*\lambda)-60 \text{ (nm)} \le A \text{ (nm)} \le (m^*\lambda)+60 \text{ (nm)}$$

$$A \ne \Delta n \cdot t1 \text{ (nm)}, \quad (4)$$

where Δn=|n1−n2|, n1 may be the first refractive index, n2 may be the second refractive index, t1 may be the thickness of one of the plurality of diffraction patterns, λ may be the wavelength of the light emitted from the first display element, and m may be an integer of 0 or more.

It is to be understood that both the foregoing general description and the following detailed description are exemplary and explanatory and are intended to provide further explanation of the invention as claimed.

BRIEF DESCRIPTION OF THE DRAWINGS

These and/or other exemplary embodiments, features and advantages will become apparent and more readily appreciated from the following description of the exemplary embodiments, taken in conjunction with the accompanying drawings, in which:

FIGS. 39(a) through 46 illustrate the shape, period, and arrangement of a plurality of diffraction patterns of a diffraction pattern layer in organic light emitting display devices according to embodiments and the shape and diffraction distance of second emission patterns corresponding to the above exemplary embodiments;

DETAILED DESCRIPTION

Figure 1:
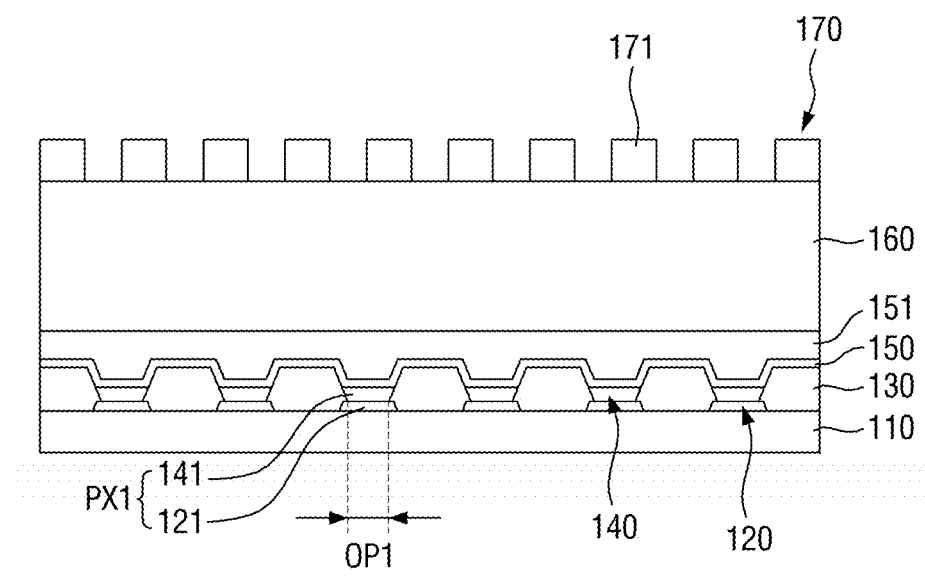
FIG. 1 is a cross-sectional view of an exemplary embodiment of an organic light emitting display device.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings.

Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" may encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, exemplary embodiments of the invention will be described with reference to the attached drawings.

Figure 2:
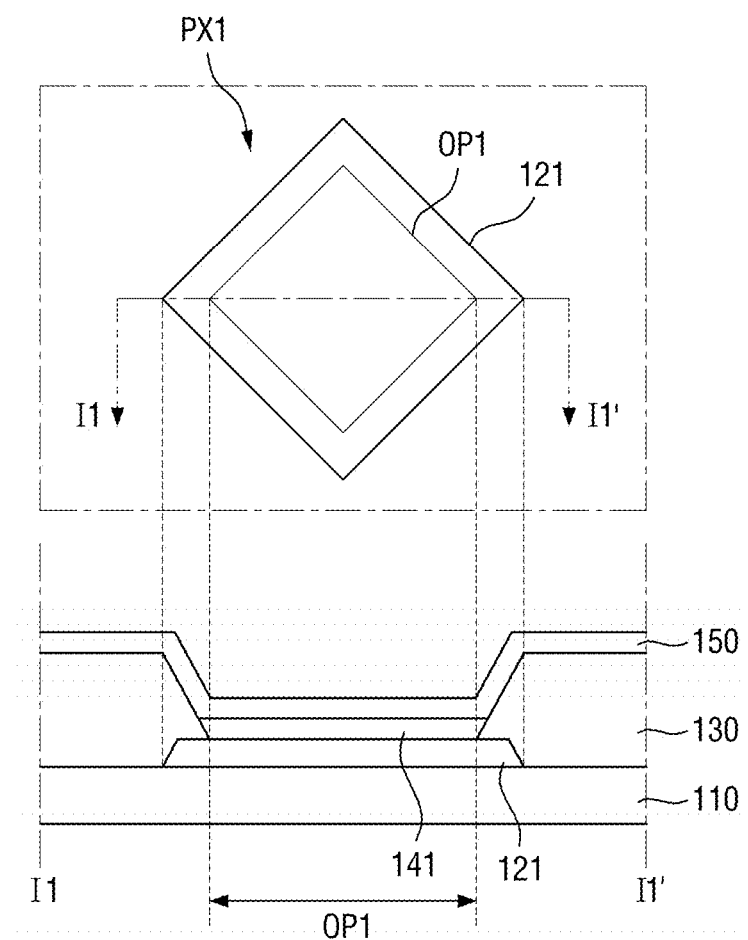
FIG. 2 illustrates both a plane and a cross section of a first pixel unit shown in FIG. 1.

FIG. 1 is a cross-sectional view of an organic light emitting display device according to an exemplary embodiment. FIG. 2 illustrates both a plane and a cross section of a first pixel unit PX1 shown in FIG. 1.

Referring to FIGS. 1 and 2, the organic light emitting display device according to the current embodiment includes a first substrate 110, a plurality of pixel electrodes 120 including a first pixel electrode 121, a pixel defining layer 130, a plurality of organic light emitting elements 140 including a first organic light emitting element 141, a common electrode 150, a buffer layer 151, an encapsulation layer 160, and a diffraction pattern layer 170. A pixel unit including the first pixel electrode 121 and the first organic light emitting element 141 will hereinafter be referred to as the first pixel unit PX1.

The first substrate 110 may be an insulating substrate. In an exemplary embodiment, the first substrate 110 may include a material such as glass, quartz, or polymer resin. In an exemplary embodiment, the polymer material may be polyethersulphone ("PES"), polyacrylate ("PA"), polyarylate ("PAR"), polyetherimide ("PEI"), polyethylene naphthalate ("PEN"), polyethylene terephthalate ("PET"), polyphenylenesulfide ("PPS"), polyallylate, polyimide ("PI"), polycarbonate ("PC"), cellulosetriacetate ("CAT"), cellulose acetate propionate ("CAP"), or a combination of these materials. In an exemplary embodiment, the first substrate 110 may be a flexible substrate including PI.

The pixel electrodes 120 may be disposed on the first substrate 110. Although not illustrated in the drawings, a plurality of components may be further disposed between the first substrate 110 and the pixel electrodes 120. In an exemplary embodiment, the components may include a buffer layer, a plurality of conductive wiring layers, an insulating layer, and a plurality of thin film transistors ("TFTs"). In an exemplary embodiment, each of the TFTs may use amorphous silicon, polysilicon, low temperature polysilicon ("LTPS"), an oxide semiconductor, an organic semiconductor, or the like as a channel layer. The types of the respective channel layers of the TFTs may be different from each other. In an exemplary embodiment, a TFT including an oxide semiconductor and a TFT including low-temperature polysilicon may all be included in one pixel unit in consideration of the role or process order of a TFT.

The pixel electrodes 120 will be described based on the first pixel electrode 121. The first pixel electrode 121 may be an anode in an exemplary embodiment. When the first pixel electrode 121 is an anode, the first pixel electrode 121 may include a reflective material. In an exemplary embodiment, the reflective material may include one or more reflective films selected from silver (Ag), magnesium (Mg), chromium (Cr), gold (Au), platinum (Pt), nickel (Ni), copper (Cu), tungsten (W) and aluminum (Al) and a transparent or translucent electrode disposed on the reflective films, for example.

In an exemplary embodiment, the transparent or translucent electrode may include one or more of indium tin oxide ("ITO"), indium zinc oxide ("IZO"), zinc oxide (ZnO), indium oxide ($In_2O_3$), indium gallium oxide ("IGO") and aluminum zinc oxide ("AZO"), for example.

The pixel defining layer 130 may be disposed on the first pixel electrode 121. An opening OP1 which exposes at least part of the first pixel electrode 121 is defined in the pixel defining layer 130. The pixel defining layer 130 may include an organic material or an inorganic material. In an exemplary embodiment, the pixel defining layer 130 may include a material such as photoresist, polyimide resin, acrylic resin, a silicon compound, or polyacrylic resin.

The first pixel electrode 121 may be rhombic in an exemplary embodiment. In an exemplary embodiment, the opening OP1 of the pixel defining layer 130 may be rhombic in an exemplary embodiment. However, the shape of the first pixel electrode 121 and the shape of the opening OP1 of the pixel defining layer 130 are not limited to those illustrated in FIG. 2. That is, the shape of the first pixel electrode 121 and the shape of the opening OP1 of the pixel defining layer 130 may vary depending on the arrangement of a plurality of pixel units.

The organic light emitting elements 140 may be disposed on the pixel electrodes 120 and the pixel defining layer 130. The organic light emitting elements 140 will be described based on the first organic light emitting element 141. The first organic light emitting element 141 may be disposed on a region of the first pixel electrode 121 which is exposed through the opening OP1 of the pixel defining layer 130. That is, the first organic light emitting element 141 may overlap the opening OP1 of the pixel defining layer 130. In an exemplary embodiment, the first organic light emitting element 141 may cover at least part of the opening OP1 of the pixel defining layer 130.

The first organic light emitting element 141 may emit one of red light, green light, and blue light in an exemplary embodiment. In an exemplary embodiment, the red light may have a wavelength of about 620 nanometers (nm) to about 750 nm, and the green light may have a wavelength of about 495 nm to about 570 nm, for example. In an exemplary embodiment, the blue light may have a wavelength of about 450 nm to about 495 nm, for example.

In an exemplary embodiment, the first organic light emitting element 141 may emit white light. When the first organic light emitting element 141 emits white light, it may have, in an exemplary embodiment, a structure in which a red light emitting layer, a green light emitting layer, and a blue light emitting layer are stacked. In addition, a color filter for displaying red, green, and blue colors may further be included. However, the invention is not limited thereto, and the first organic light emitting element 141 may emit various other color lights.

Although not illustrated in the drawings, the first organic light emitting element 141 may have a multilayer structure including a hole injection layer ("HIL"), a hole transport layer ("HTL"), an electron transport layer ("ETL"), and an electron injection layer ("EIL").

The common electrode 150 may be disposed on the first organic light emitting element 141 and the pixel defining layer 130. In an exemplary embodiment, the common electrode 150 may be disposed over the entire surface of the first organic light emitting element 141 and the pixel defining layer 130. The common electrode 150 may be a cathode in an exemplary embodiment. In an exemplary embodiment, the common electrode 150 may include any one or more of Li. Ca, Lif/Ca, LiF/Al, Al, Ag, and Mg, for example. In addition, the common electrode 150 may include a metal thin film having a low work function. In an exemplary embodiment, the common electrode 150 may be a transparent or translucent electrode including any one or more of ITO, IZO, zinc oxide (ZnO), indium oxide ($In_2O_3$), IGO and AZO, for example.

The buffer layer 151 may be disposed on the common electrode 150. The material of the buffer layer 151 is not particularly limited. In an exemplary embodiment, the buffer layer 151 may include an inorganic material or an organic material. In an alternative exemplary embodiment, the buffer layer 151 may have a structure in which at least one of an organic layer and an inorganic layer is stacked in a single-layer structure or a stacked layer structure. In an exemplary embodiment, the buffer layer 151 may be an air layer. Here, when the buffer layer 151 is an air layer, it means that no particular components are disposed between the common electrode 150 and the encapsulation layer 160.

Although not illustrated in the drawings, a capping layer may be disposed on the common electrode 150. The capping layer may prevent light incident on the common electrode 150 from being lost by total reflection. The capping layer may include an organic film or an inorganic film in an exemplary embodiment.

The encapsulation layer 160 may be disposed on the first substrate 110 to cover the organic light emitting elements 140. That is, the organic light emitting elements 140 may be disposed between the first substrate 110 and the encapsulation layer 160. The encapsulation layer 160 may block the organic light emitting elements 140 from external oxygen and moisture.

The encapsulation layer 160 may be a transparent insulating substrate in an exemplary embodiment. The encapsulation layer 160 may be a glass substrate, a quartz substrate, a transparent resin substrate, or the like. A sealing member may be provided between the encapsulation layer 160 and the first substrate 110 to bond the encapsulation layer 160 and the first substrate 110 together. A case where the encapsulation layer 160 is a transparent insulating substrate will hereinafter be described as an example.

The diffraction pattern layer 170 may be disposed on the encapsulation layer 160. More specifically, the diffraction pattern layer 170 may be disposed on the path of light emitted from the organic light emitting elements 140. The position of the diffraction pattern layer 170 is not limited as long as the diffraction pattern layer 170 is disposed on the path of light emitted from the organic light emitting elements 140. In an exemplary embodiment, the diffraction pattern layer 170 may be disposed on or under the encapsulation layer 160 based on FIG. 1, for example. In the specification, a case where the diffraction pattern layer 170 is disposed on the encapsulation layer 160 will be described as an example.

A plurality of diffraction patterns 171 may increase an emission area by diffracting light emitted from the organic light emitting elements 140. This will be described later with reference to FIGS. 7A to 7C.

The diffraction patterns 171 may have periodicity. All of the diffraction patterns 171 may have the same shape in an exemplary embodiment. The periodicity and shape of the diffraction patterns 171 will be described in more detail with reference to FIGS. 3 through 5.

Figure 3:
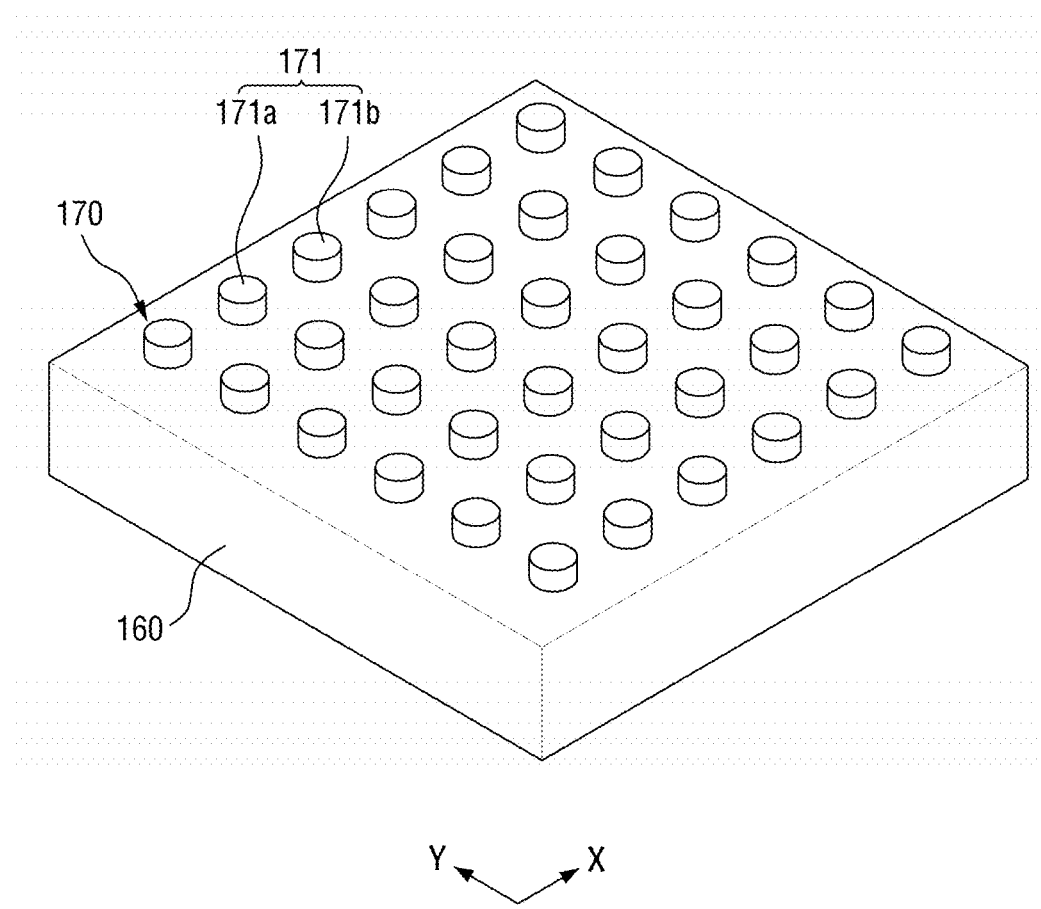
FIG. 3 is a perspective view of an encapsulation layer and a diffraction pattern layer illustrated in FIG. 1.
Figure 4:
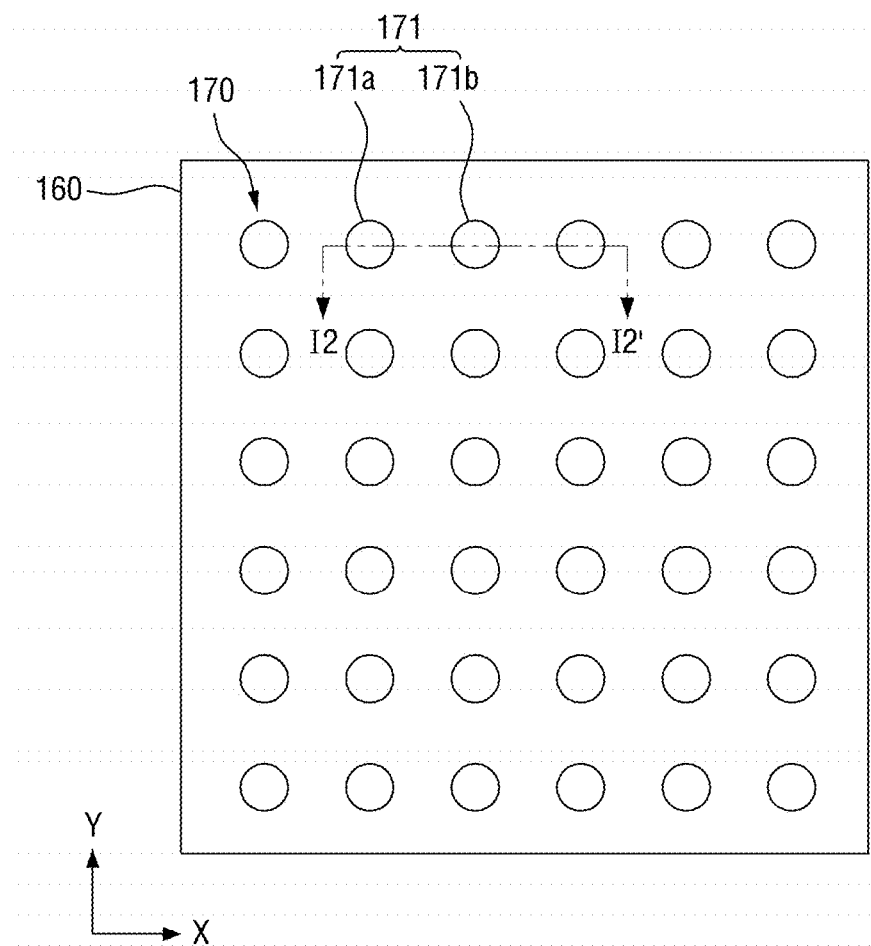
FIG. 4 is a plan view of the encapsulation layer and the diffraction pattern layer illustrated in FIG. 3.
Figure 5:
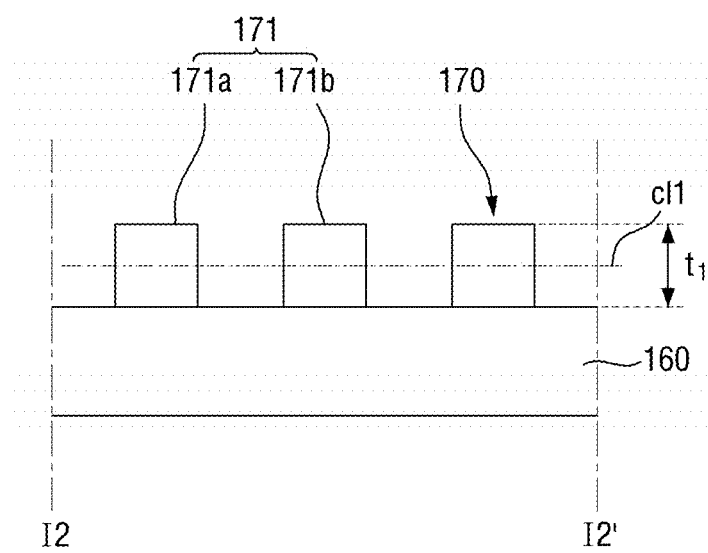
FIG. 5 is a cross-sectional view taken along line I2-I2' of FIG. 4.

FIG. 3 is a perspective view of the encapsulation layer 160 and the diffraction pattern layer 170 illustrated in FIG. 1. FIG. 4 is a plan view of the encapsulation layer 160 and the diffraction pattern layer 170 illustrated in FIG. 3. FIG. 5 is a cross-sectional view taken along line I2-I2' of FIG. 4.

Referring to FIGS. 3 through 5, the diffraction pattern layer 170 may include a plurality of diffraction patterns 171 disposed on the encapsulation layer 160.

The diffraction pattern layer 170 may include the diffraction patterns 171. In an exemplary embodiment, the diffraction patterns 171 may protrude upward from the encapsulation layer 160 based on FIG. 5. Here, the upward direction is the direction of the path of light emitted from the organic light emitting elements 140 (refer to FIG. 1).

The diffraction patterns 171 may be cylindrical in an exemplary embodiment. That is, upper and lower surfaces of the diffraction patterns 171 may be circular. Here, the circular shape is a concept including a shape substantially close to a circle in a plan view.

In an exemplary embodiment, the circle shape may include an ellipse or a polygon substantially close to a circle, for example.

The diffraction patterns 171 may have a first thickness t1. The first thickness t1 refers to a distance from the lower surfaces to the upper surfaces of the diffraction patterns 171 based on FIG. 5.

The diffraction patterns 171 may be arranged with a first period DP1. In addition, the diffraction patterns 171 may have a first length d1. The definition of the first period DP1 and the first length d1 will be described based on a first diffraction pattern 171a and a second diffraction pattern 171b by referring to FIGS. 5 and 6.

Figure 6:
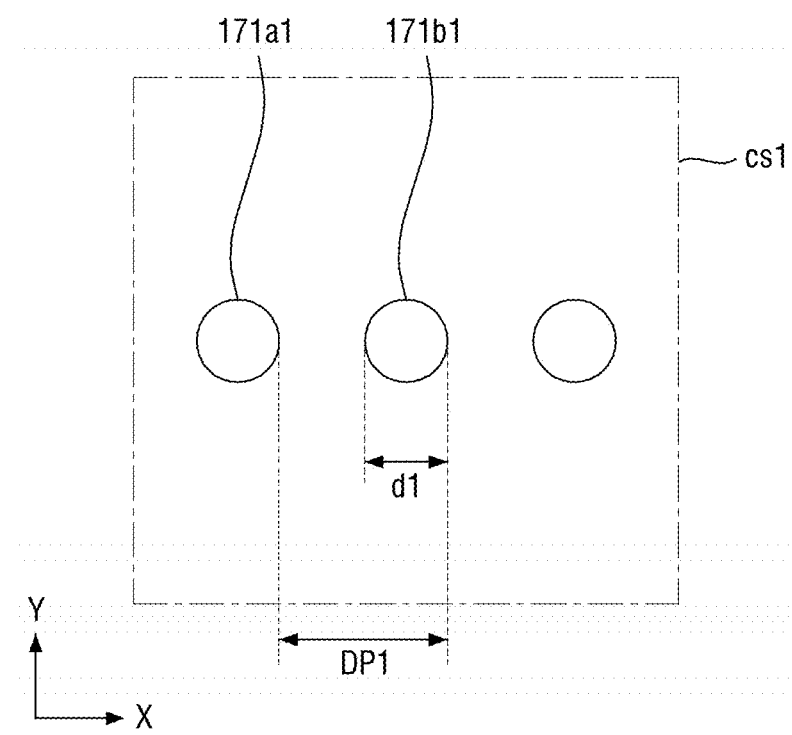
FIG. 6 is a cross-sectional view taken along a first virtual line of FIG. 5.

FIG. 6 is a cross-sectional view taken along a first virtual line cl1 of FIG. 5. More specifically, FIG. 6 illustrates a cross-sectional area cs1 taken along the first virtual line cl1 of FIG. 5. Here, the first virtual line cl1 refers to a line passing through a halfway point of the first thickness t1 of each of the diffraction patterns 171. Reference numeral 171a1 indicates a cross section of the first diffraction pattern 171a taken along the first virtual line cl1. Reference numeral 171b1 indicates a cross section of the second diffraction pattern 171b taken along the first virtual line cl1.

Referring to FIG. 6, the first period DP1 is defined as a distance from a side of the cross section 171a1 of the first diffraction pattern 171a adjacent to a side of the cross section 171b1 of the second diffraction pattern 171b to the other side of the cross section 171b1 of the second diffraction pattern 171b opposite the above side of the cross section 171b1 of the second diffraction pattern 171b. In addition, the first length d1 of, e.g., the second diffraction pattern 171b denotes a width of the cross section 171b1 of the second diffraction pattern 171b.

That is, the first period DP1 and the first length d1 of the diffraction patterns 171 are defined based on the cross sections of the diffraction patterns 171 taken along the first virtual line cl1.

Referring again to FIGS. 3 and 4, a period between diffraction patterns arranged along a first direction X among the diffraction patterns 171 and a period between diffraction patterns arranged along a second direction Y among the diffraction patterns 171 may all be the first period DP1 in an exemplary embodiment. In addition, the number of diffraction patterns arranged along the first direction X and the number of diffraction patterns arranged along the second direction Y may be equal to each other in an exemplary embodiment. Here, the first direction X is defined as a row direction based on FIGS. 3 and 4. The second direction Y is defined as a column direction perpendicular to the first direction X based on FIGS. 3 and 4.

When at least one of the first period DP1, the first length d1 and the first thickness t1 of the diffraction patterns 171 is changed, a first diffraction angle θ1 (refer to FIG. 7A) of light emitted from the organic light emitting elements 140, a second diffraction angle θ2 (refer to FIG. 7A) of the light passing through the diffraction pattern layer 170, a diffraction distance β (refer to FIG. 7B), and luminance may be changed. This will be described later.

Figure 7A:
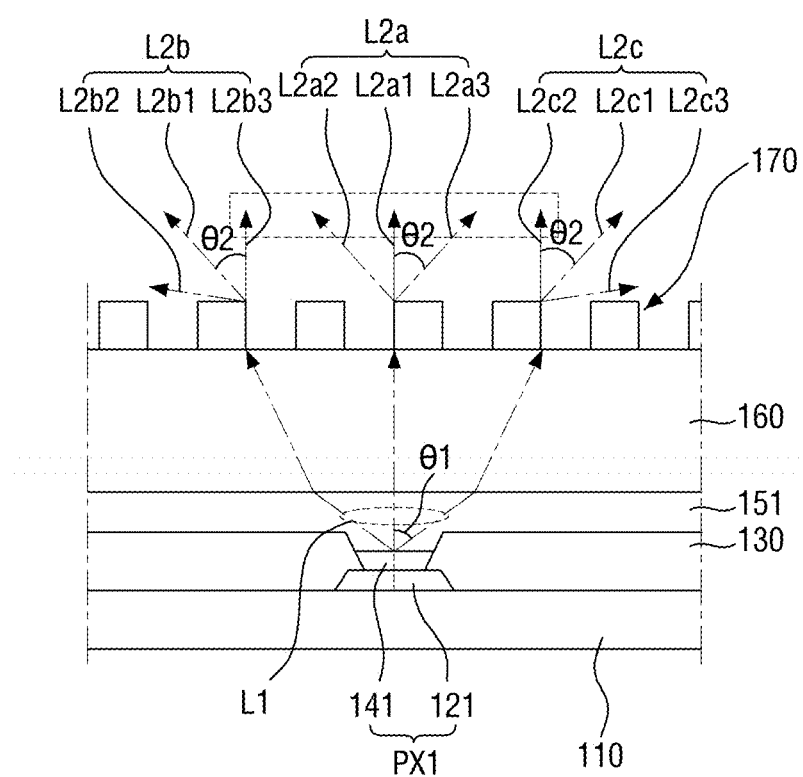
FIGS. 7A through 7C are views for explaining the enlargement of an emission area of the organic light emitting display device illustrated in FIG. 1.
Figure 7B:
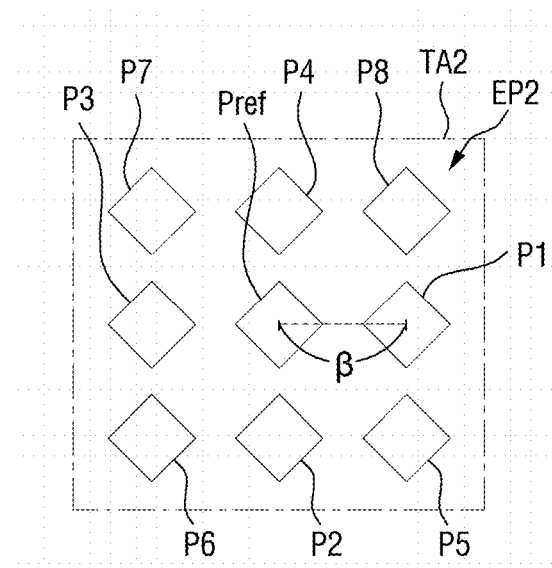
Figure 7C:
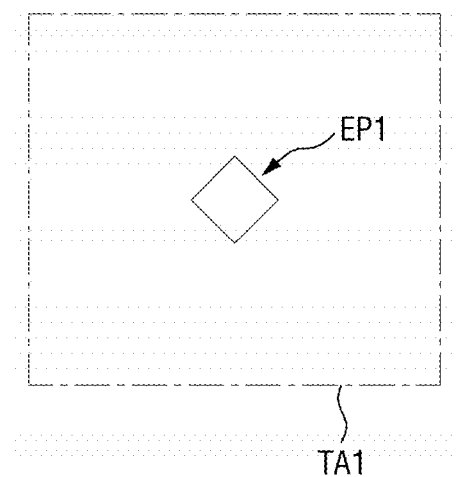

FIGS. 7A to 7C are views for explaining the enlargement of the emission area of the organic light emitting display device illustrated in FIG. 1.

With reference to FIGS. 1 and 7A to 7C, a case where the emission area is enlarged by the diffraction of light L1 emitted from the first organic light emitting element 141 will be described based on the first pixel unit PX1. For ease of description, some components illustrated in FIG. 1 are omitted from FIGS. 7A to 7C.

An emission pattern generated in a first region TA1 by the light L1 emitted from the first organic light emitting element 141 is defined as a first emission pattern EP1. In addition, emission patterns generated in a second region TA2 by lights L2a, L2b and L2c passing through the diffraction pattern layer 170 are defined as second emission patterns EP2. Here, the lights L2a, L2b and L2c passing through the diffraction pattern layer 170 will be referred to as diffracted lights.

The light L1 emitted from the first organic light emitting element 141 may be provided to the diffraction pattern layer 170 via the encapsulation layer 160. The path of the light L1 emitted from the first organic light emitting element 141 may be changed at a predetermined angle by refractive indices of the encapsulation layer 160 and the buffer layer 151. The change in the path of the light L1 by the refractive indices of the encapsulation layer 160 and the buffer layer 151 will be described later in relation to the diffraction distance D.

The diffraction pattern layer 170 may diffract the light L1 emitted from the first organic light emitting element 141, thereby generating the first through third diffracted lights L2a through L2c. Each of the first through third diffracted lights L2a through L2c may include zeroth- and first-order diffracted lights. Here, the zeroth-order diffracted light refers to light having the same path before and after being diffracted by the diffraction pattern layer 170. In addition, the first-order diffracted light refers to light having its path changed by the diffraction pattern layer 170 and having the second diffraction angle θ2 with respect to the zeroth-order diffracted light.

In FIG. 7A, for example, reference numerals L2b1, L2a1 and L2c1 indicate zeroth-order diffracted lights. In addition, reference numerals L2b2, L2b3, L2a2, L2a3, L2c2 and L2c3 indicate first-order diffracted lights. In an exemplary embodiment, each of the first through third diffracted lights L2a through L2c may further include a second or higher-order diffracted light. In the specification, a case where each of the first through third diffracted lights L2a through L2c includes the zeroth-order diffracted light and the first-order diffracted light will be described as an example.

The first, second and third diffracted lights L2a, L2b and L2c may include first, second and third effective lights L2a1, L2b3, and L2c2 having paths perpendicular to the first substrate 110, respectively. Here, the perpendicular direction may include not only a direction perfectly perpendicular to the first substrate 110 but also a direction substantially perpendicular to the first substrate 110. The order of diffracted light is not limited as long as effective light has a path perpendicular to the first substrate 110. That is, the effective light may include both the zeroth-order diffracted light and the first-order diffracted light as long as its path is perpendicular to the first substrate 110.

The diffraction pattern layer 170 may generate the first, second and third effective lights L2a1, L2b3 and L2c2 by diffracting the light L1 emitted from the first organic light emitting element 141. Accordingly, the second emission patterns EP2 may include a reference emission pattern Pref and a plurality of duplicate emission patterns P1 through P8 duplicated from the reference emission pattern Pref. However, the luminance of the reference emission pattern Pref may be different from that of the first duplicate emission pattern P1. The duplicate emission patterns P1 through P8 will hereinafter be described based on the first duplicate emission pattern P1.

The first region TA1 and the second region TA2 have the same area. The number of emission patterns included in the second region TA2 is larger than the number of emission patterns included in the first region TA1. This indicates that the area of an emission region is larger in the second region TA2 than in the first region TA1. That is, it may also be expressed that the area of a non-emission region is smaller in the second region TA2 than in the first region TA1.

A wide emission area may be expressed as a high effective emission area ratio. The effective emission area ratio is defined as a ratio of the area of emission patterns existing in a region to the area of the region. Here, the emission patterns used to calculate the effective emission area ratio may include both a reference emission pattern and duplicate emission patterns. In an exemplary embodiment, the second region TA2 has nine emission patterns including the reference emission pattern Pref and the duplicate emission patterns P1 through P8, while the first region TA1 has one emission pattern, for example.

Accordingly, the effective emission area ratio of the second region TA2 is greater than that of the first region TA1.

Here, the duplicate emission patterns used to calculate the effective emission area ratio may be defined as duplicate emission patterns having a luminance of about 3 percent (%) or more of the luminance of the reference emission pattern, for example. In an exemplary embodiment, when the duplicate emission patterns P1 through P8 have a luminance of about 3% or more of the luminance of the reference emission pattern Pref, the duplicate emission patterns P1 through P8 may be used to calculate the effective emission area ratio, for example. When the duplicate emission patterns have a luminance of about 3% or more of the luminance of the reference emission pattern, the luminance of the duplicate emission patterns may be higher than that of the reference emission pattern.

Figure 8A:
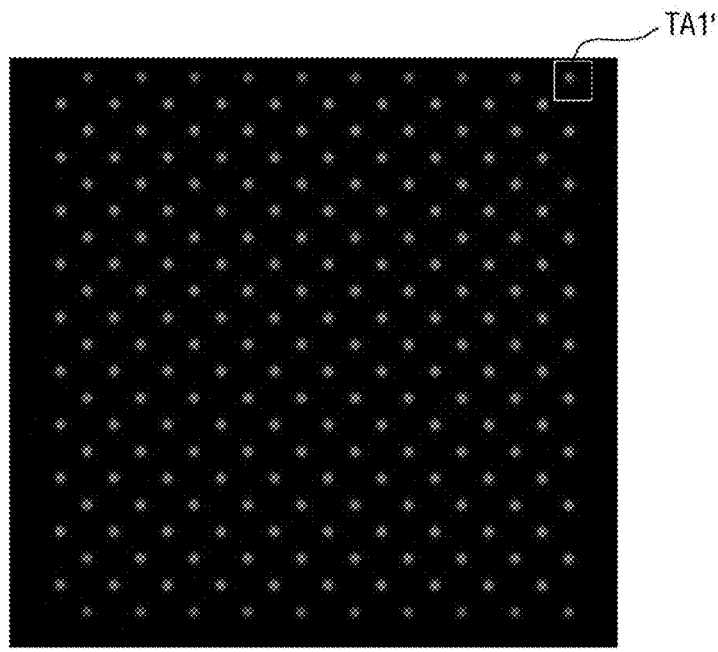
FIGS. 8(a) and 8(b) are views for explaining an increase in an effective emission area ratio of the organic light emitting display device illustrated in FIG. 1.
Figure 8B:
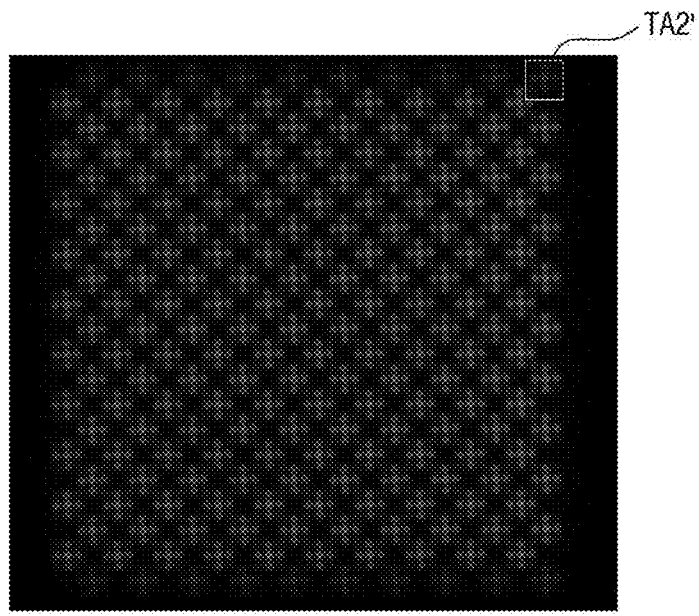

FIG. 8 is a view for explaining an increase in the effective emission area ratio of the organic light emitting display device illustrated in FIG. 1. FIG. 8(a) shows a region where emission patterns before light passes through the diffraction pattern layer 170 (refer to FIG. 7A) are arranged, and FIG. 8(b) shows a region where emission patterns after the light passes through the diffraction pattern layer 170 are arranged. Reference numeral TA1' indicates an example of the first region TA1 (refer to FIG. 7C). In addition, reference numeral TA2' illustrated in FIG. 8(b) indicates an example of the second region TA2 (refer to FIG. 7B). Hereinafter, the first region TA1' and the second region TA2' having the same area will be described as an example.

Referring to FIG. 8, it may be seen that the emission region has increased in the second region TA2' as compared to the first region TA1' having the same area as the second region TA2'. This indicates that the effective emission area ratio has increased. That is, the organic light emitting display device according to the exemplary embodiment may increase the effective emission area ratio by diffracting the light L1 (refer to FIG. 7A) emitted from the organic light emitting elements 140 (refer to FIG. 1). In addition, as the effective emission area ratio increases, the organic light emitting display device according to the exemplary embodiment may improve the luminous efficiency of the light L1 emitted from the organic light emitting elements 140.

Factors required for the luminance of at least one of the duplicate emission patterns P1 through P8 to satisfy at least about 3% of the luminance of the reference emission pattern Pref will now be described with reference to FIGS. 9 through 11.

Figure 9A:
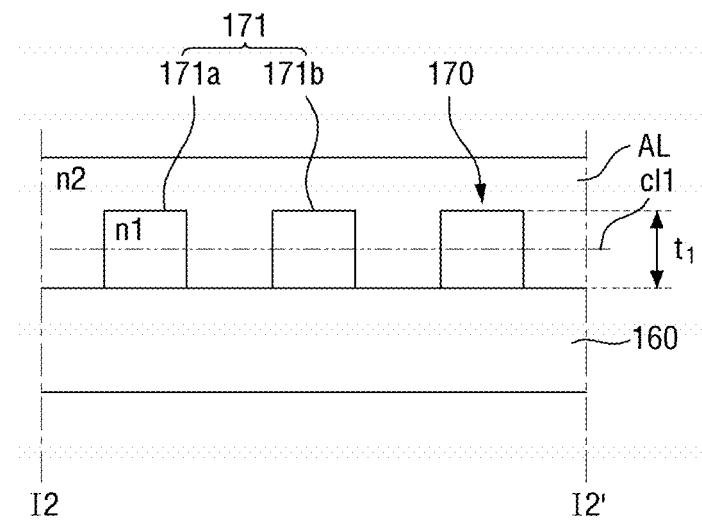
FIGS. 9(a) and 9(b) are more detailed cross-sectional views taken along line I2-I2' of FIG. 4.
Figure 9B:
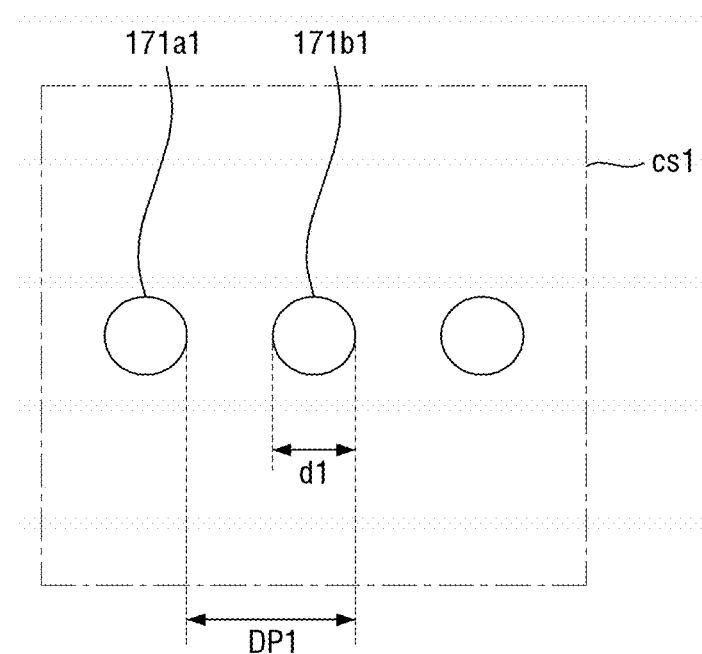

FIG. 9 is a more detailed cross-sectional view taken along line I2-I2' of FIG. 4. FIG. 10 shows graphs illustrating the luminance of each of the reference emission pattern Pref, the first duplicate emission pattern P1 and the fifth duplicate emission pattern P5 of FIG. 7 by display color in order to explain a luminance for satisfying the emission region. FIG. 11 shows graphs obtained by normalizing the luminance of each of the first duplicate emission pattern P1 and the fifth duplicate emission pattern P5 based on the luminance of the reference emission pattern Pref illustrated in FIG. 7B. In FIG. 9, a case where an air layer AL is disposed on the diffraction pattern layer 170 will be described as an example.

The luminance of each of the reference emission pattern Pref and the duplicate emission patterns P1 through P8 may be affected by the first period DP1, the first length d1, the first thickness t1, a refractive index n1 of each of the diffraction patterns 171, and a refractive index n2 of the air layer AL.

Here, when the relationship between the first period DP1 and the first length d1 satisfies Inequality (1) below and when the relationship between the first thickness t1, the refractive index n1 of each of the diffraction patterns 171 and the refractive index n2 of the air layer AL satisfies Inequality (2) below, the luminance of at least one of the duplicate emission patterns P1 through P8 may be about 3% or more of the luminance of the reference emission pattern Pref.

Of the duplicate emission patterns P1 through P8, the first through fourth duplicate emission patterns P1 through P4 arranged in the same row or column as the reference emission pattern Pref may have the same luminance in an exemplary embodiment. In addition, of the duplicate emission patterns P1 through P8, the fifth through eighth duplicate emission patterns P5 through P8 arranged diagonally to the reference emission pattern Pref may have the same luminance in an exemplary embodiment. However, the first through fourth duplicate emission patterns P1 through P4 may have different luminance from the fifth through eighth duplicate emission patterns P5 through P8 in an exemplary embodiment. The following description will be made based on the reference emission pattern Pref, the first duplicate emission pattern P1, and the fifth duplicate emission pattern P5.

First, the relationship between the first period DP1 and the first length d1 will be described. The first period DP1 and the first length d1 described above with reference to FIGS. 5 and 6 should satisfy Inequality (1) below:

$$0.4 \leq d1/DP1 \leq 1 \quad (1).$$

Figure 10A:
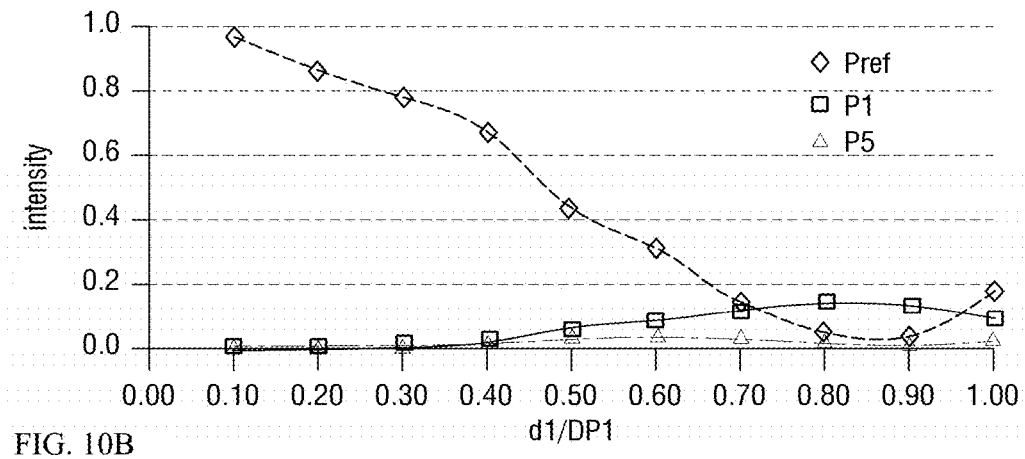
FIGS. 10(a) through 10(c) are graphs illustrating luminance with respect to a d1/DP1 value according to an emission color of an organic light emitting element.
Figure 10B:
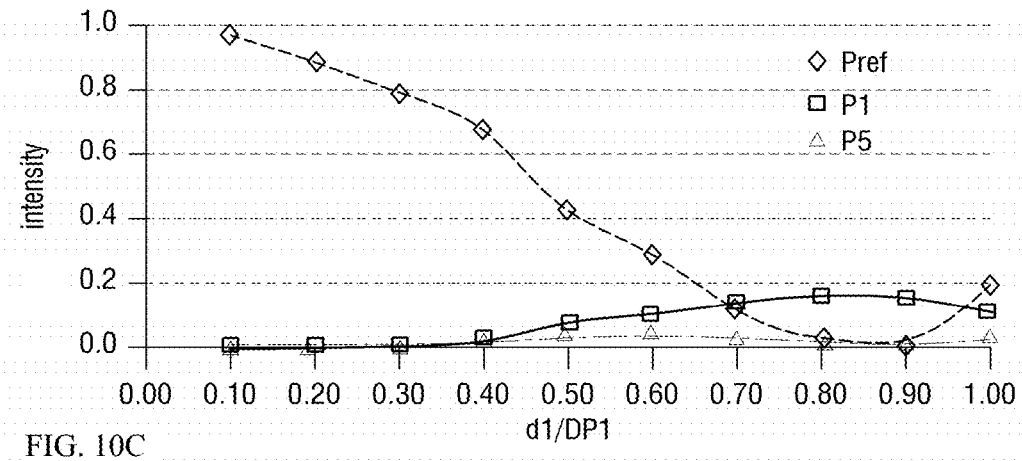
Figure 10C:
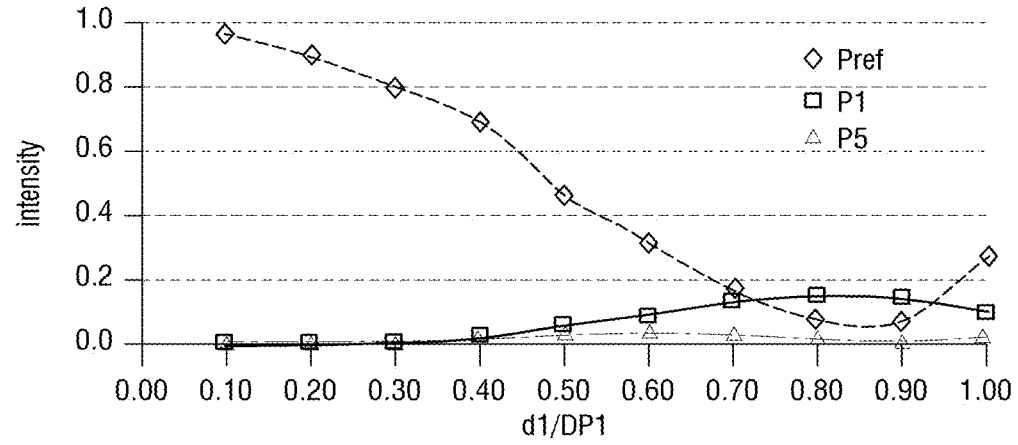

Inequality (1) will be described in more detail with reference to FIGS. 7A to 7C, 10 and 11. FIG. 10(a) is a graph illustrating luminance with respect to a d1/DP1 value when an organic light emitting element emits blue light. FIG. 10(b) is a graph illustrating luminance with respect to the d1/DP1 value when the organic light emitting element emits green light. FIG. 10(c) is a graph illustrating luminance with respect to the d1/DP1 value when the organic light emitting element emits red light. FIGS. 1(a) through 11(c) are graphs obtained by normalizing the luminances of the first duplicate emission pattern P1 and the fifth duplicate emission pattern P5 illustrated in FIGS. 10(a) through 10(c) based on the luminance of the reference emission pattern Pref. In FIGS. 10 and 11, intensity indicates the intensity of luminance.

Referring to FIGS. 10(a) through 10(c), when the d1/DP1 value increases, the luminance of the reference emission pattern Pref generally decreases, while the luminance of the first emission pattern P1 and the luminance of the fifth emission pattern P5 generally increase.

Figure 11A:
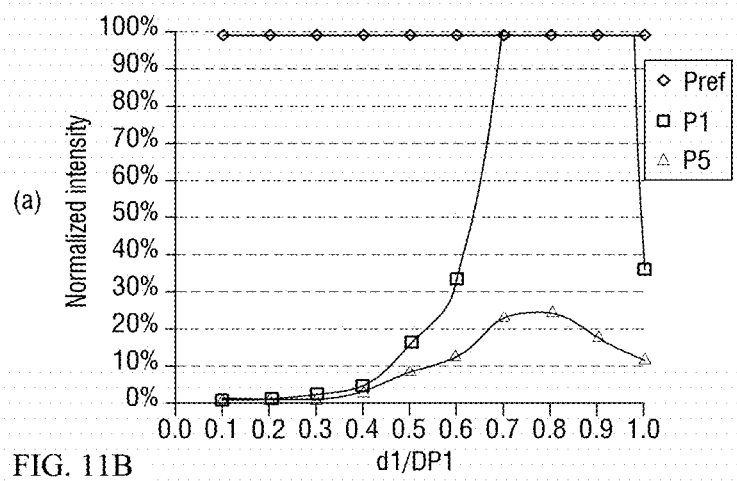
FIGS. 11(a) through 11(c) are graphs obtained by normalizing the luminances of a first duplicate emission pattern and a fifth duplicate emission pattern illustrated in FIGS. 10(a) through 10(c) based on the luminance of a reference emission pattern.
Figure 11B:
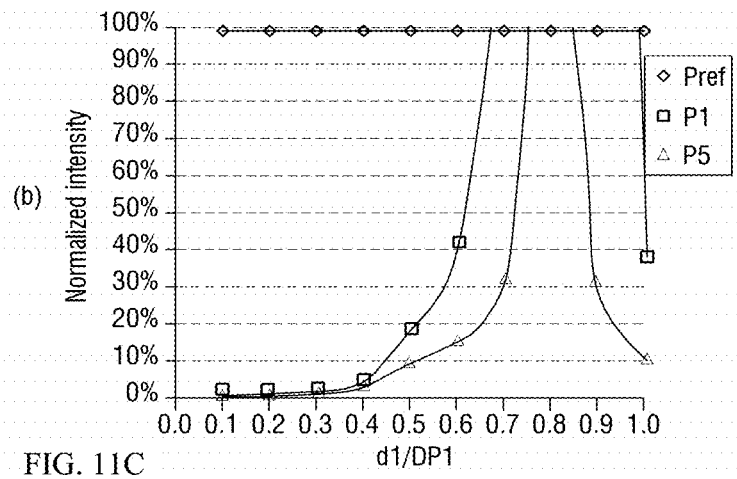
Figure 11C:
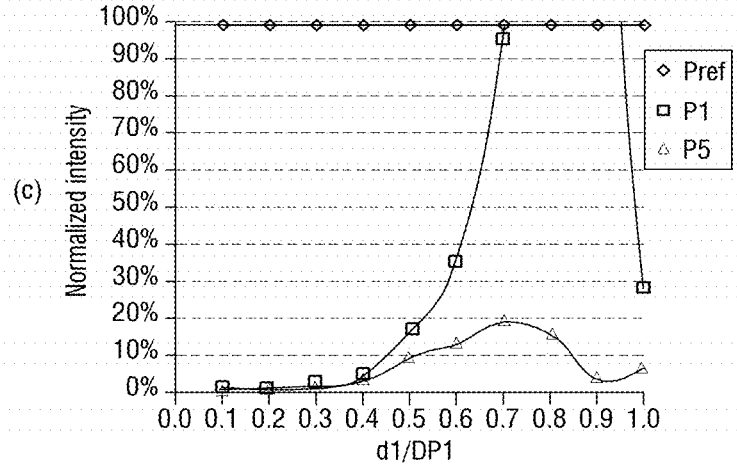

Referring to FIGS. 11(a) through 11(c) obtained by normalizing luminance based on the luminance of the reference emission pattern Pref, when the d1/DP1 value is about 0.4 or more, the luminance of the first duplicate emission pattern P1 is about 3% or more of the luminance of the reference emission pattern Pref. When the d1/DP1 value is about 0.7 to 0.9, the luminance of the first duplicate emission pattern P1 may be higher than the luminance of the reference emission pattern Pref.

When the d1/DP1 value is 1, it indicates that the first period DP1 and the first length d1 are equal to each other. However, since the diffraction patterns 171 of the organic light emitting display device according to the exemplary embodiment have circular cross sections, even when the first period DP1 and the first length d1 are equal to each other, the cross section of each of the diffraction patterns 171 has a region not in contact with the cross section of an adjacent diffraction pattern 171. Therefore, the d1/DP1 value may include 1.

Next, the first thickness t1 of each of the diffraction patterns 171, the refractive index n1 of each of the diffraction patterns 171, and the refractive index n2 of the air layer AL should satisfy Inequality (2) below. In FIG. 7, a case where the air layer AL is disposed on the diffraction patterns 171 is illustrated as an example. However, an intermediate layer, e.g., a protective layer 191 (refer to FIG. 49), may also be disposed on the diffraction patterns 171, instead of the air layer AL. When another component (the intermediate layer) instead of the air layer AL is disposed on the diffraction patterns 171, n2 may be replaced with a refractive index of the component.

$$(m^*\lambda)-60 \text{ (nm)} \leq A \leq (m^*\lambda)+60 \text{ (nm)}$$

$$A = \Delta n \cdot t1, \quad (2)$$

where units of $\Delta n \cdot t1$ and A are nm, $\Delta n = |n1-n2|$, $\lambda$ is a wavelength of light emitted from the first organic light emitting element 141, and m is an integer of 0 or more.

Inequality (2) will now be described in more detail with reference to FIGS. 7, 9, 12 and 13.

Figure 12A:
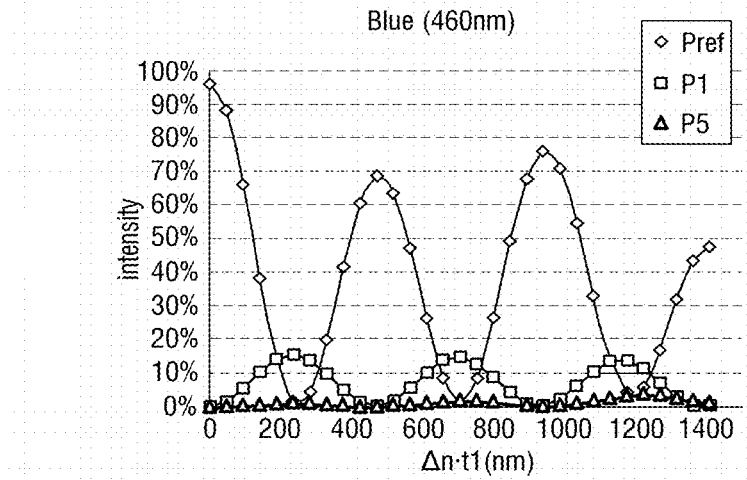
FIGS. 12(a) through 12(c) are graphs illustrating luminance with respect to a Δn·t1 value according to an emission color of an organic light emitting element.
Figure 12B:
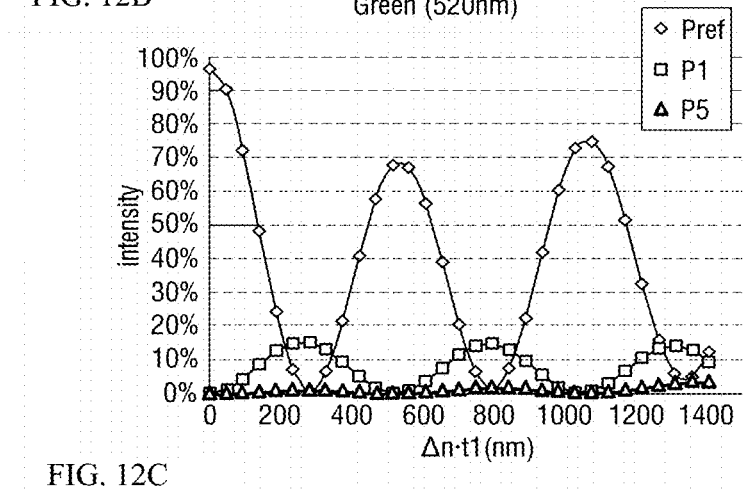
Figure 12C:
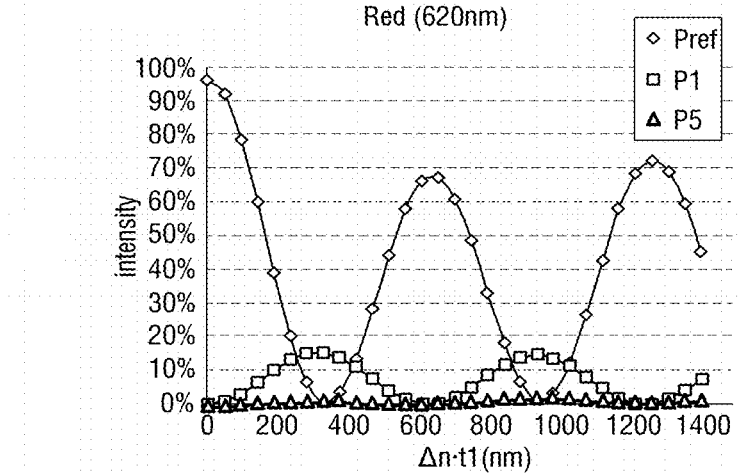
Figure 13A:
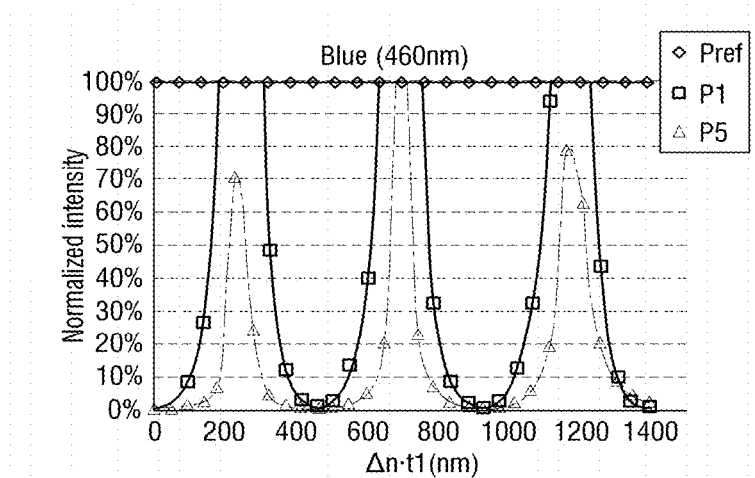
FIGS. 13(a) through 13(c) are graphs obtained by normalizing the luminances of a first duplicate emission pattern and a fifth duplicate emission pattern illustrated in FIGS. 12(a) through 12(c) based on the luminance of a reference emission pattern.
Figure 13B:
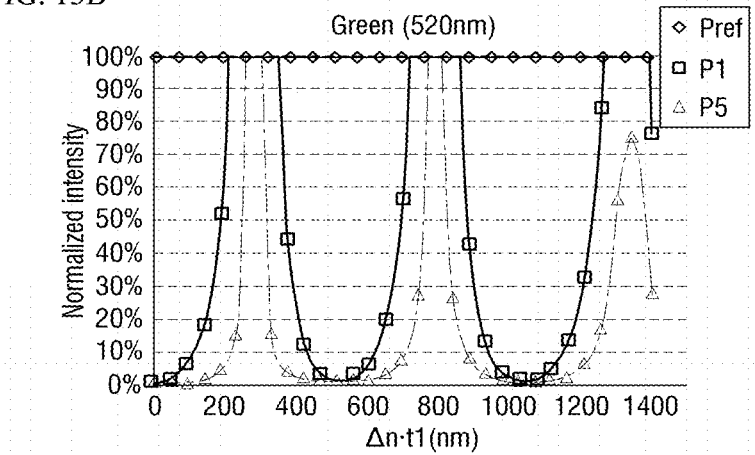
Figure 13C:
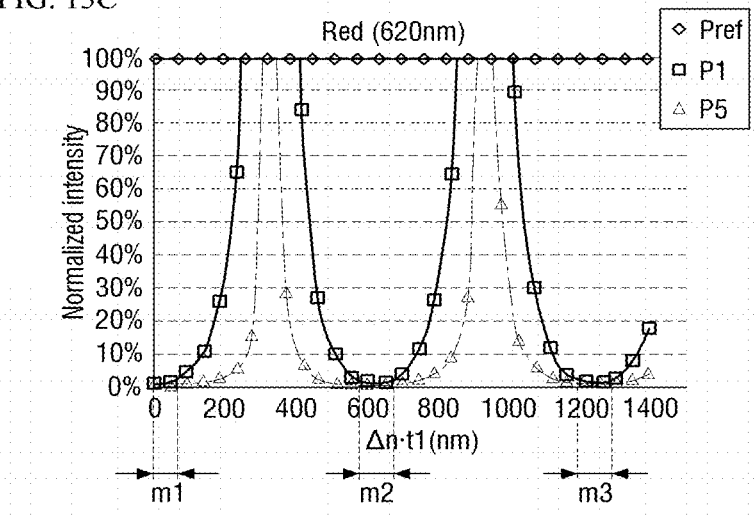

FIG. 12(a) is a graph illustrating luminance with respect to a $\Delta n \cdot t1$ value when an organic light emitting element emits blue light. FIG. 12(b) is a graph illustrating luminance with respect to the $\Delta n \cdot t1$ value when the organic light emitting element emits green light. FIG. 12(c) is a graph illustrating luminance with respect to the $\Delta n \cdot t1$ value when the organic light emitting element emits red light. FIGS. 13(a) through 13(c) are graphs obtained by normalizing the luminances of the first duplicate emission pattern P1 and the fifth duplicate emission pattern P5 illustrated in FIGS. 12(a) through 12(c) based on the luminance of the reference emission pattern Pref.

Referring to FIGS. 12(a) through 12(c), the luminance of the reference emission pattern Pref is repeatedly increased or decreased as the $\Delta n \cdot t1$ value increases. The luminance of the reference emission pattern Pref according to the $\Delta n \cdot t1$ value may generally have a sinusoidal shape on the graph.

Referring to FIGS. 13(a) through 13(c) obtained by normalizing luminance based on the luminance of the reference emission pattern Pref, as the $\Delta n \cdot t1$ value increases, the luminance of each of the first duplicate emission pattern P1 and the fifth duplicate emission pattern P5 is repeatedly increased or decreased. That is, the luminance of each of the first duplicate emission pattern P1 and the duplicate emission pattern P5 according to the Δn·t1 value may have a substantially sinusoidal shape on the graph.

The following description will be given based on FIG. 13(c). Referring to FIG. 13(c), sections m1 through m3 are regions in which both the luminance of the first duplicate emission pattern P1 and the luminance of the fifth duplicate emission pattern P5 are less than about 3% of the luminance of the reference emission pattern Pref. That is, the sections m1 through m3 are included in the range of A in Inequality (2) above. Therefore, the range of the Δn·t1 value corresponds to the range excluding the range of A in Inequality (2).

In an exemplary embodiment, the section m2 in FIG. 13(c) is a section indicating the range of the A value when m=1, for example. Since k is 620 nm in FIG. 13(c), the above values may be reflected in Inequality (2) as follows:

(1*620 nm)−60 (nm)≤A≤(1*620 nm)+60 (nm)=>560 nm≤A≤680 nm.

Referring to FIG. 13(c), it may be seen that both the luminance of the first duplicate emission pattern P1 and the luminance of the fifth duplicate emission pattern P5 are less than about 3% of the luminance of the reference emission pattern Pref within the range of A (560 nm≤A≤680 nm).

Accordingly, when the Δn·t1 value is within the range excluding the range of A of Inequality (2), at least one of the luminance of the first duplicate emission pattern P1 and the luminance of the fifth duplicate emission pattern P5 may be about 3% or more of the luminance of the reference emission pattern Pref.

That is, in the organic light emitting display device according to the exemplary embodiment, the relationship between the first period DP1 and the first length d1 may satisfy Inequality (1), and the relationship between the first thickness t1, the refractive index n1 of each of the diffraction patterns 171 and the refractive index n2 of the air layer AL may satisfy Inequality (2).

Accordingly, the luminance of at least one of the duplicate emission patterns P1 through P8 may be about 3% or more of the luminance of the reference emission pattern Pref.

The range of the first period DP1 and the range of the first length d1 are not particularly limited as long as the relationship between the first period DP1 and the first length d1 satisfies Inequality (1). In an exemplary embodiment, the first period DP1 may be in the range of about 3.5 micrometers (µm) to about 20 µm, for example. In this case, the first length d1 may be in the range of about 1.4 µm to about 20 µm, for example.

In addition, values of Δn and t1 are not particularly limited as long as the relationship between the first thickness t1, the refractive index n1 of each of the diffraction patterns 171 and the refractive index n2 of the air layer AL satisfies Inequality (2). In an exemplary embodiment, Δn may be about 0.47, for example. In addition, the first thickness t1 may be about 500 nm to about 650 nm, for example.

Referring to FIG. 11, when the d1/DP1 value is 0.45 to 1, both the luminance of the first duplicate emission pattern P1 and the luminance of the fifth duplicate emission pattern P5 may be about 3% or more of the luminance of the reference emission pattern Pref.

That is, when the d1/DP1 value is within the range of 0.45 to 1 and the value of Δn·t1 is outside the range of A of Inequality (2), both the luminance of the first duplicate emission pattern P1 and the luminance of the fifth duplicate emission pattern P5 may be about 3% or more of the luminance of the reference emission pattern Pref. This indicates that the luminances of all of the duplicate emission patterns P1 through P8 may be about 3% or more of the luminance of the reference emission pattern Pref.

Next, the relationship between the effective emission area ratio and the diffraction distance β will be described.

Referring to Table 1 below, it may be seen that the effective emission area ratio increases substantially as the diffraction distance β increases. Here, the diffraction distance β is defined as a shortest distance between the reference emission pattern Pref and one of the duplicate emission patterns P1 through P8 (refer to FIG. 7B). In an exemplary embodiment, the diffraction distance β may be defined as a distance from the reference emission pattern Pref to the first duplicate emission pattern P1, for example.

TABLE 1

| | Effective emission area ratio (%) | | |
|---|---|---|---|
| β(um) | Red (R) | Green (G) | Blue (B) |
| 0.0 | 5.8 | 6.6 | 6.9 |
| 2.4 | 13.4 | 19.1 | 14.8 |
| 4.8 | 19.5 | 32.1 | 27.7 |
| 7.2 | 24.7 | 48.6 | 39.0 |
| 9.6 | 47.8 | 82.6 | 61.1 |
| 12.1 | 74.4 | 93.9 | 83.8 |
| 14.5 | 77.1 | 86.6 | 89.0 |
| 16.9 | 79.5 | 97.9 | 93.8 |
| 19.3 | 89.1 | 85.6 | 96.5 |

That is, the effective emission area ratio may be affected by the diffraction distance β. Hereinafter, factors that affect the diffraction distance β will be described.

Figure 14:
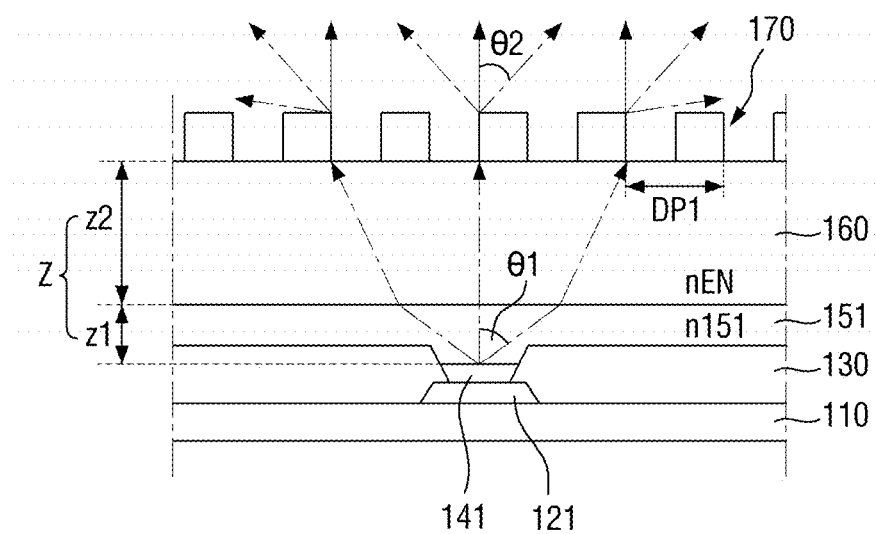
FIG. 14 is a view for explaining factors that determine a diffraction distance.

Factors that determine the diffraction distance β will be described with reference to FIG. 14. FIG. 14 is a view for explaining factors that determine the diffraction distance.

Referring to FIG. 14, in an exemplary embodiment, the diffraction distance R may be determined by an emission color of the first organic light emitting element 141, a distance Z between the diffraction pattern layer 170 and the organic light emitting elements 140, refractive indices of components disposed between the diffraction pattern layer 170 and the organic light emitting elements 140 (that is, a refractive index nEN of the encapsulation layer 160, a refractive index n151 of the buffer layer 151), the first period DP1 of the diffraction patterns 171, the first diffraction angle θ1, the second diffraction angle θ2, and the like. When the buffer layer 151 is an air layer as described above, the refractive index n151 of the buffer layer 151 may be expressed as a refractive index (about 1) of the air layer.

More specifically, the diffraction distance β may be given by Equation (3) below:

$$\beta = z1 \cdot \tan \theta1 + z2 \cdot \tan \theta2 \quad (3).$$

Here, the distance Z between the first organic light emitting element 141 and the diffraction pattern layer 170 is defined as the sum of z1 and z2. Here, z1 indicates a shortest distance between the first organic light emitting element 141 and the encapsulation layer 160, and z2 indicates a shortest distance between the encapsulation layer 160 and the diffraction pattern layer 170. That is, z2 may also be defined as a thickness of the encapsulation layer 160. As described above, θ1 and θ2 indicate the first diffraction angle and the second diffraction angle, respectively.

The first diffraction angle θ1 may be given by Equation (4) below;

$$\theta1 = \sin^{-1}\left(\frac{\lambda}{DP1} \cdot \frac{1}{n151}\right), \quad (4)$$

where λ indicates the wavelength of the emission color of the first organic light emitting element 141.

In addition, the second diffraction angle θ2 may be given by Equation (5) below:

$$\theta 2 = \sin^{-1}\left(\frac{\lambda}{DP1} \cdot \frac{1}{nEN}\right). \quad (5)$$

That is, the first diffraction angle θ1 may be determined by the first period DP1 and the refractive index n151 of the buffer layer 151. In addition, the second diffraction angle θ2 may be determined by the first period DP1 and the refractive index nEN of the encapsulation layer 160.

If Equations (4) and (5) are substituted into Equation (3), the diffraction distance β may be given by Equation (6) below:

$$\beta = z1 \cdot \tan\left[\sin^{-1}\left(\frac{\lambda}{DP1} \cdot \frac{1}{n151}\right)\right] + z2 \cdot \tan\left[\sin^{-1}\left(\frac{\lambda}{DP1} \cdot \frac{1}{nEN}\right)\right]. \quad (6)$$

In an exemplary embodiment, when another component instead of the buffer layer 151 is disposed between the encapsulation layer 160 and the first organic light emitting element 141, n151 of Equation (6) may be replaced with a refractive index of the component. In an exemplary embodiment, when the buffer layer 151 is omitted and an air layer is disposed between the encapsulation layer 160 and the first organic light emitting element 141, n151 of Equation 6 may be replaced with a refractive index (about 1) of the air layer.

In an exemplary embodiment, when the thickness of the buffer layer 151 is negligibly small, the shortest distance Z between the first organic light emitting element 141 and the diffraction pattern layer 170 may be defined as the thickness of the encapsulation layer 160. In this case, a diffraction distance β' may be given by Equation (7) below:

$$\beta' = z2 \cdot \tan\left[\sin^{-1}\left(\frac{\lambda}{DP1} \cdot \frac{1}{nEN}\right)\right]. \quad (7)$$

The organic light emitting display device according to the exemplary embodiment may control the diffraction distance β by adjusting the emission color of the first organic light emitting element 141, the distance Z between the diffraction pattern layer 170 and the organic light emitting elements 140, the refractive index nEN of the encapsulation layer 160, the first period DP1 of the diffraction patterns 171, the first diffraction angle θ1 and the second diffraction angle θ2.

As described above, the effective emission area ratio may generally increase when the diffraction distance β increases. However, the increased diffraction distance β can cause blurring. Blurring refers to an image blurring phenomenon caused by overlapping display colors of adjacent pixels. Therefore, it is required to calculate an appropriate diffraction distance R in order to balance an increase in effective emission area ratio and blurring.

Each of the effective emission area ratio and blurring may also be affected by the distance between pixels.

In an exemplary embodiment, even when the diffraction distance D is the same in two organic light emitting display devices having different pixel arrangements, the distance between adjacent pixels may be different due to the different pixel arrangements, for example. Accordingly, the two organic light emitting display devices may have different effective emission area ratios and different degrees of blurring.

That is, in order to strike a balance between the effective emission area ratio and the blurring, it is necessary to consider not only the diffraction distance β but also the distance between adjacent pixels.

Figure 15:
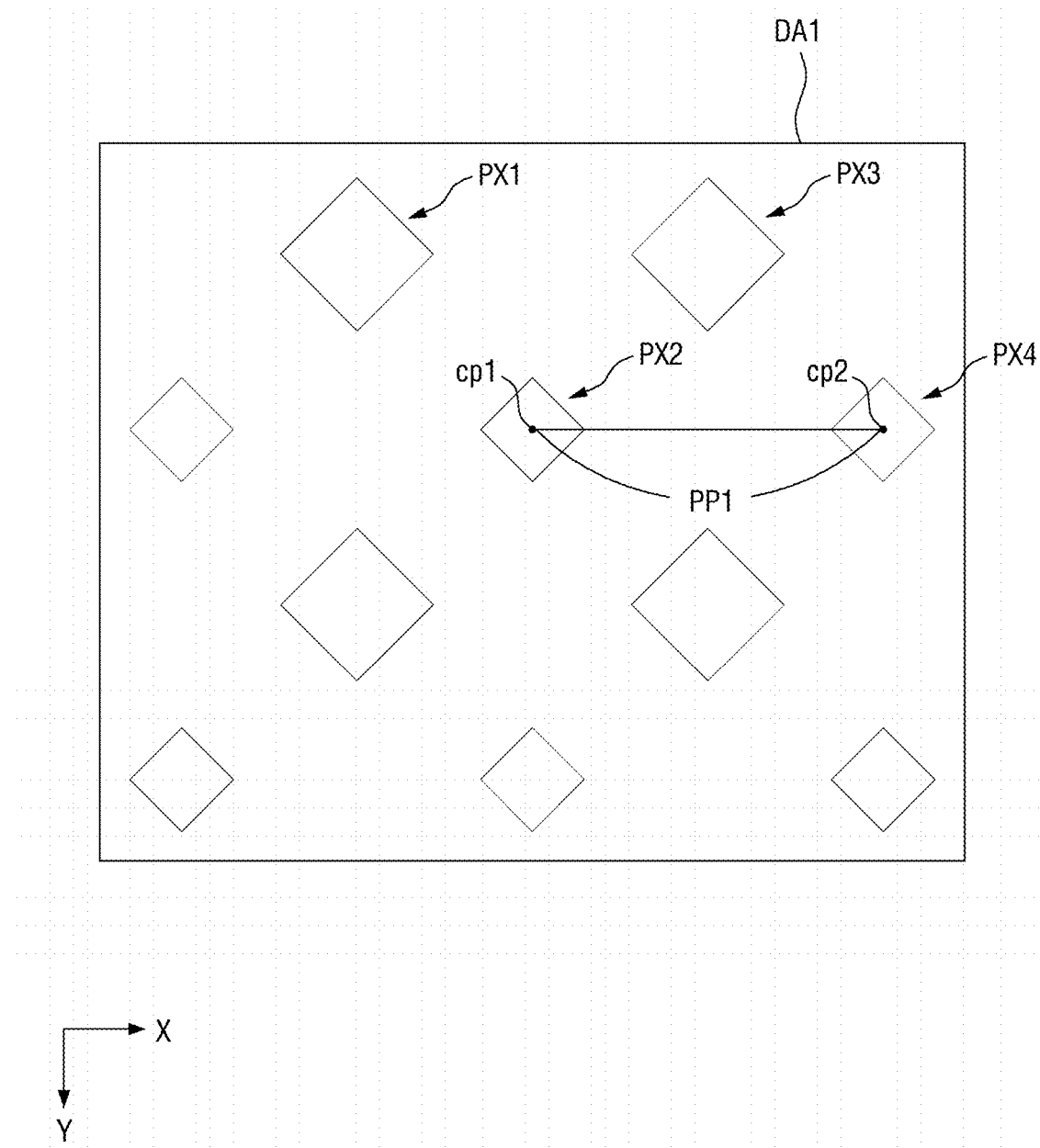
FIG. 15 is a plan view illustrating an exemplary embodiment of the pixel arrangement of an organic light emitting display device.

The distance between pixels will first be defined with reference to FIG. 15.

FIG. 15 is a plan view illustrating the pixel arrangement of an organic light emitting display device according to an exemplary embodiment. Although a first pixel unit PX1 is illustrated in FIG. 15 to explain the pixel arrangement structure, the first pixel unit PX1 illustrated in FIG. 1 and the first pixel unit PX1 illustrated in FIG. 15 do not have the same configuration.

Referring to FIG. 15, as for the arrangement relationship of first through fourth pixel units PX1 through PX4, the first pixel unit PX1 may neighbor the third pixel unit PX3 along the first direction X. The second pixel unit PX2 may neighbor the fourth pixel unit PX4 along the first direction X. The first pixel unit PX1 may neighbor the second pixel unit PX2 in a direction diagonal to the first direction X and the second direction Y The third pixel unit PX3 may neighbor the fourth pixel unit PX4 along the second direction Y. That is, the first through fourth pixel units PX1 through PX4 may be arranged in a parallelogram shape in an exemplary embodiment. In the specification, when it is expressed that "a first component and a second component neighbor each other", it means that the same component as the first component and the second component is not disposed between the first component and the second component.

Although the first through fourth pixel units PX1 through PX4 are all illustrated as being rhombic as an exemplary embodiment, the shape and size of each of the first through fourth pixel units PX1 through PX4 are not limited to those illustrated in FIG. 15.

The first pixel unit PX1 may display a red color in an exemplary embodiment. That is, the first pixel unit PX1 may include a red organic light emitting layer that emits red light. The second and fourth pixel units PX2 and PX4 may display a green color in an exemplary embodiment. That is, the second and fourth pixel units PX2 and PX4 may include a green organic light emitting layer that emits green light. The third pixel unit PX3 may display a blue color in an exemplary embodiment. That is, the third pixel unit PX3 may include a blue organic light emitting layer that emits blue light.

The first through fourth pixel units PX1 through PX4 may form one pixel unit.

That is, the first through fourth pixel units PX1 through PX4 may be arranged in a pixel area DA1 in an RGBG pentile manner. However, the arrangement relationship of a plurality of pixel units in the pixel area DA1 is not limited to that illustrated in FIG. 15. In an exemplary embodiment, the arrangement relationship of a plurality of pixel units may vary according to the display colors of the pixel units, the applied resolution and aperture ratio of an organic light emitting display device, and the like, for example.

Here, a distance PP1 between pixels is defined as a distance between pixel units that display the same color. More specifically, the inter-pixel distance PP1 is defined as a distance between center points of pixel electrodes included in pixel units displaying the same color. Hereinafter, the second pixel unit PX2 and the fourth pixel unit PX4 which emit green light will be described as an example.

The inter-pixel distance PP1 may be defined as a shortest distance between a first center point cp1 located in the second pixel unit PX2 and a second center point cp2 located in the fourth pixel unit PX4. In an exemplary embodiment, the first center point cp1 and the second center point cp2 may be center points of pixel electrodes included in the second pixel unit PX2 and the fourth pixel unit PX4, respectively.

Next, the relationship between the diffraction distance β, the inter-pixel distance PP1, and the effective emission area ratio will be described. Table 2 below shows the effective emission area ratio according to the value of the diffraction distance β/the inter-pixel distance PP1.

TABLE 2

| β/PP1 | Effective emission area ratio (%) | | |
|---|---|---|---|
| | Red (R) | Green (G) | Blue (B) |
| 0.00 | 5.8 | 6.6 | 6.9 |
| 0.05 | 13.4 | 19.1 | 14.8 |
| 0.10 | 19.5 | 32.1 | 27.7 |
| 0.15 | 24.7 | 48.6 | 39.0 |
| 0.21 | 47.8 | 82.6 | 61.1 |
| 0.26 | 74.4 | 93.9 | 83.8 |
| 0.31 | 77.1 | 86.6 | 89.0 |
| 0.36 | 79.5 | 97.9 | 93.8 |
| 0.41 | 89.1 | 85.6 | 96.5 |

Referring to Table 2, the effective emission area ratio may generally increase as the value of the diffraction distance β/the inter-pixel distance PP1 increases.

Next, the relationship between the diffraction distance β, the inter-pixel distance PP1, and blurring will be described with reference to Table 3. Table 3 below shows a blurring perception score according to the value of the diffraction distance β/the inter-pixel distance PP1. Here, the blurring perception score is the result of experimenting on the degrees of blurring perception of users while changing the value of the diffraction distance β/the inter-pixel distance PP. The blurring perception score is represented by an average value of the degrees of blurring reception of the users. Here, when the blurring perception score is 5 or more, blurring is perceived to such an extent that the users may feel discomfort when viewing the screen.

TABLE 3

| β/PP1 | Blurring perception score (out of 10 scores) |
|---|---|
| 0.2 | 1.3 |
| 0.45 | 1.2 |
| 0.89 | 2.4 |
| 1.33 | 4.0 |
| 1.89 | 5.1 |
| 2.26 | 6.4 |

Referring to Table 3, when the value of the diffraction distance β/the inter-pixel distance PP1 is about 1.89 or more, the blurring perception score of the users is 5 or more. This indicates that, when the value of the diffraction distance β/the inter-pixel distance PP1 is greater than about 1.9, most users perceive blurring and feel discomfort.

Therefore, in view of Tables 2 and 3, the value of the diffraction distance β/the inter-pixel distance PP1 may satisfy Inequality (8) below:

$$0.1 \leq \beta/PP1 \leq 1.9 \quad (8).$$

That is, the value of the diffraction distance β/the inter-pixel distance PP1 may be set to 0.1 to 1.9 in order to balance the effective emission area ratio and the degree of blurring perception. Accordingly, the organic light emitting display device according to the exemplary embodiment may improve luminous efficiency by increasing the effective emission area ratio without causing discomfort due to the perception of blurring.

If the value of the diffraction distance β/the inter-pixel distance PP1 is in the range of 0.1 to 1.9, the value of each of the diffraction distance β and the inter-pixel distance PP1 is not particularly limited. In an exemplary embodiment, the shortest distance z2 between the encapsulation layer 160 and the diffraction pattern layer 170, i.e., the thickness z2 of the encapsulation layer 160 and the first period DP1 may have values specified in Table 4 below.

TABLE 4

| Case | z2(mm) | DP1(um) |
|---|---|---|
| 1 | 0.2 | 0.88-15.3 |
| 2 | 0.3 | 1.24-22.7 |
| 3 | 0.5 | 2-37.4 |

Next, an exemplary embodiment of the diffraction pattern layer 170 will be described.

Figure 16:
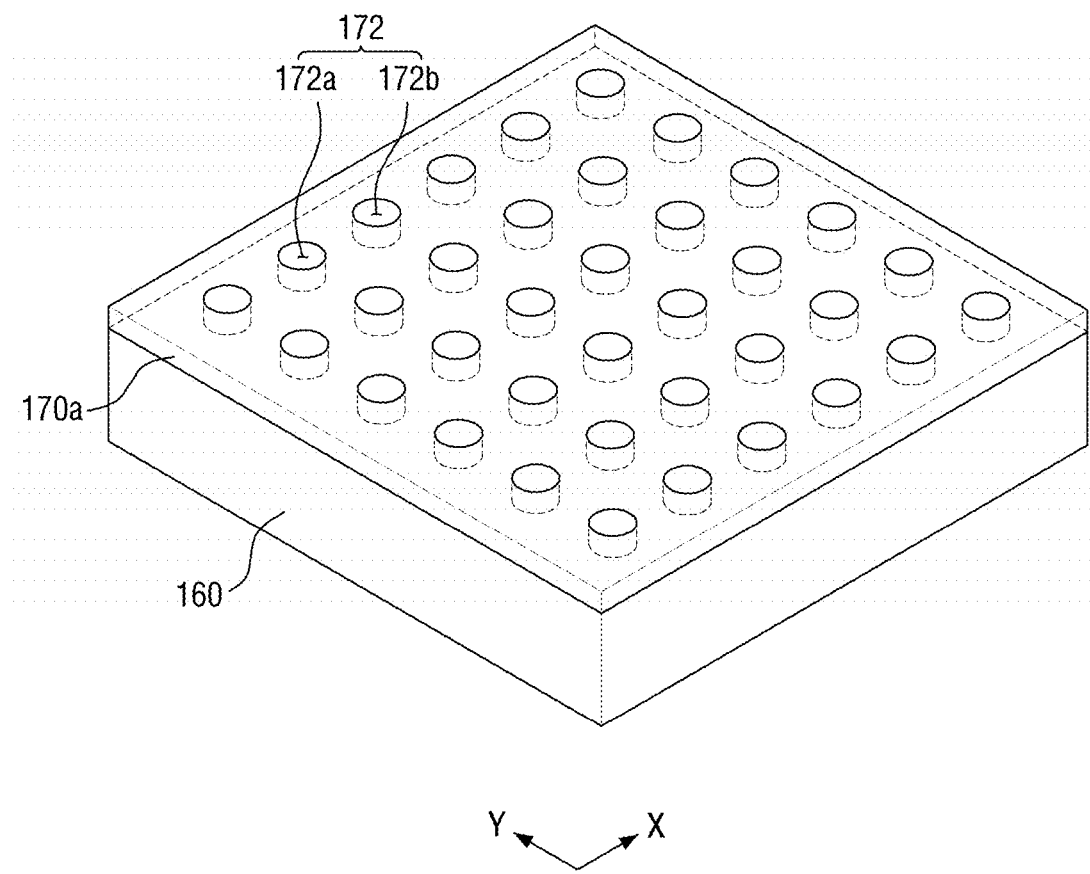
FIG. 16 is a perspective view of an exemplary embodiment of the diffraction pattern layer illustrated in FIG. 1.
Figure 17:
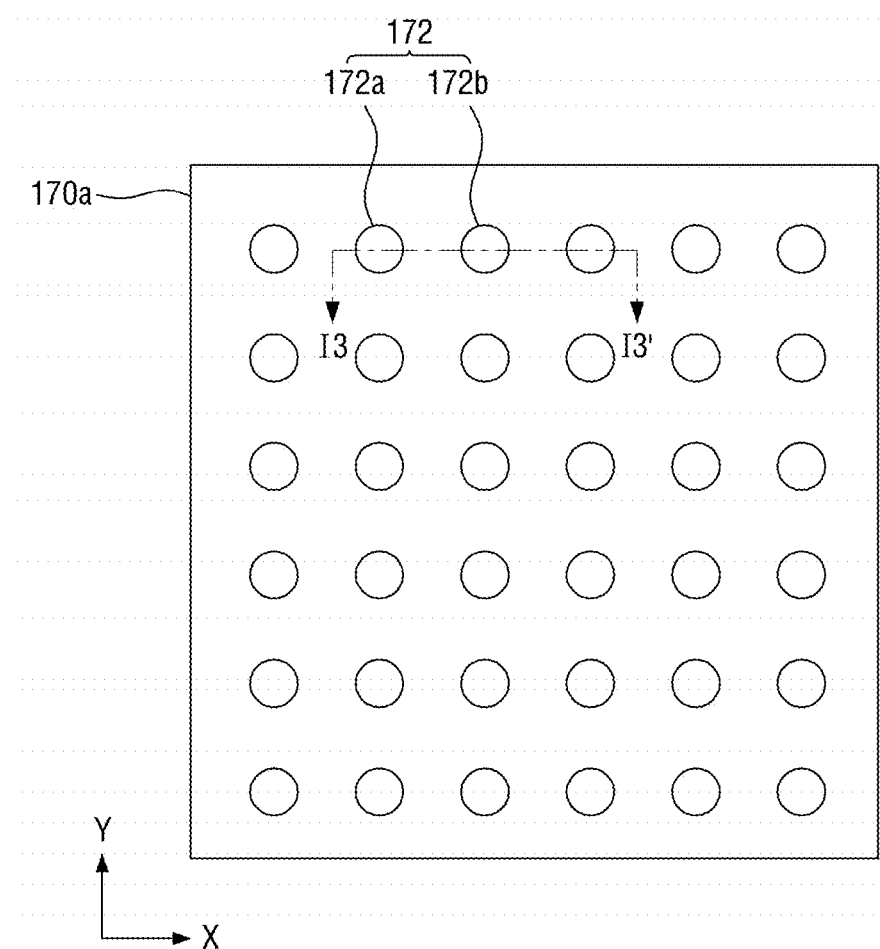
FIG. 17 is a plan view of a diffraction pattern layer illustrated in FIG. 16.
Figure 18:
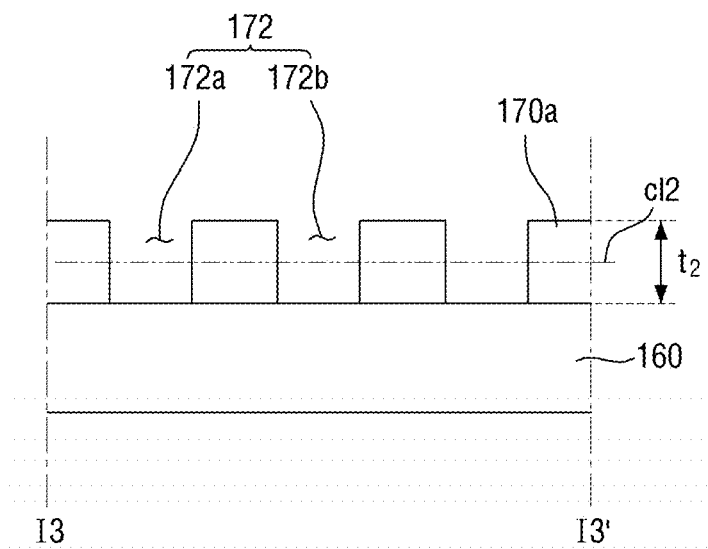
FIG. 18 is a cross-sectional view taken along line I3-I3' of FIG. 17.
Figure 19:
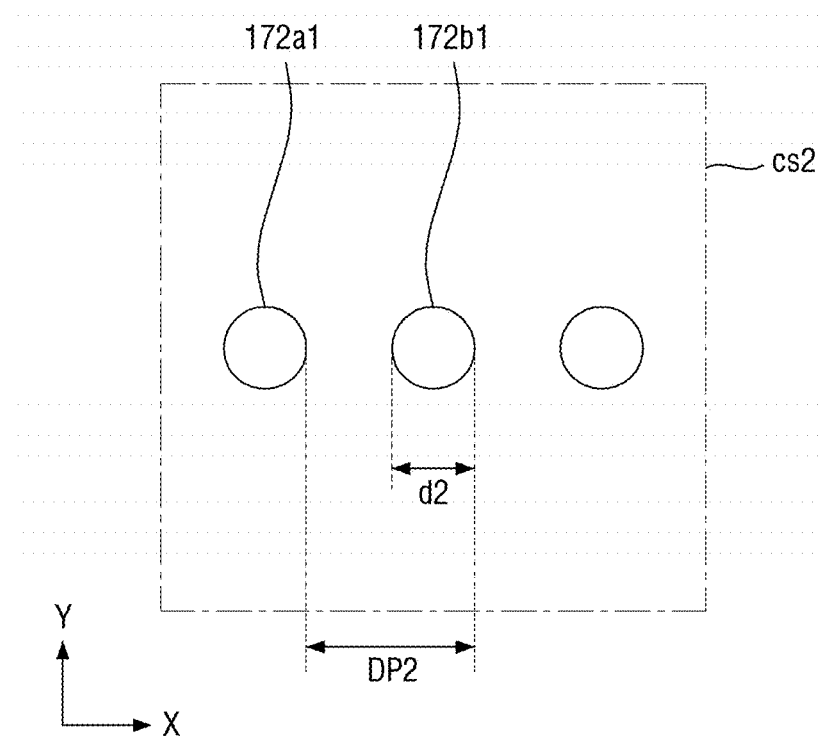
FIG. 19 is a cross-sectional view taken along a second virtual line of FIG. 18.

FIG. 16 is a perspective view of an exemplary embodiment of the diffraction pattern layer 170 illustrated in FIG. 1. FIG. 17 is a plan view of a diffraction pattern layer 170a illustrated in FIG. 16. FIG. 18 is a cross-sectional view taken along line I3-I3' of FIG. 17. FIG. 19 is a cross-sectional view taken along a second virtual line c2 of FIG. 18. For simplicity, a redundant description of components identical to those described above with reference to FIGS. 1 through 15 will be omitted.

Referring to FIGS. 16 through 19, the diffraction pattern layer 170a may be disposed on the encapsulation layer 160. A plurality of diffraction patterns 172 may penetrate the diffraction pattern layer 170a. The diffraction patterns 172 may be shaped like engraved cylinders in an exemplary embodiment. That is, while the diffraction patterns 171 illustrated in FIGS. 3 through 5 protrude from the encapsulation layer 160 in a light emission direction, the diffraction patterns 172 illustrated in FIGS. 16 through 18 may be in the form of holes penetrating from the diffraction pattern layer 170a toward the encapsulation layer 160.

The diffraction patterns 172 may have a second thickness t2. The second thickness t2 refers to a distance from lower surfaces of the diffraction patterns 172 (i.e., an upper surface of the encapsulation layer 160) to upper surfaces (i.e., upper surfaces of the diffraction patterns 172) based on FIG. 18.

The diffraction patterns 172 may be arranged with a second period DP2. In addition, the diffraction patterns 172 may have a second length d2. Here, the second period DP2 and the second length d2 are defined based on a cross-sectional area cs2 taken along the second virtual line cl2. The second virtual line cl2 refers to a line passing through a halfway point of the second thickness t2 of each of the diffraction patterns 172. Reference numeral 172a1 indicates a cross section of a first diffraction pattern 172a taken along the second virtual line c2. Reference numeral 172b1 indicates a cross section of a second diffraction pattern 172b taken along the second virtual line cl2.

Referring to FIG. 19, the second period DP2 is defined as a distance from a side of the cross section 172a1 of the first diffraction pattern 172a adjacent to a side of the cross section 172*b*1 of the second diffraction pattern 172*b* to the other side of the cross section 172*b*1 of the second diffraction pattern 172*b* opposite the above side of the cross section 172*b*1 of the second diffraction pattern 172*b*. In addition, the second length d2 of the second diffraction pattern 172*b* denotes, for example, a width of the cross section 172*b*1 of the second diffraction pattern 172*b*.

Referring again to FIGS. 16 through 18, a period between diffraction patterns arranged along the first direction X and a period between diffraction patterns arranged along the second direction Y among the diffraction patterns 172 may all be the second period DP2 in an exemplary embodiment. In addition, the number of diffraction patterns arranged along the first direction X and the number of diffraction patterns arranged along the second direction Y may be equal to each other in an exemplary embodiment.

Figure 20:
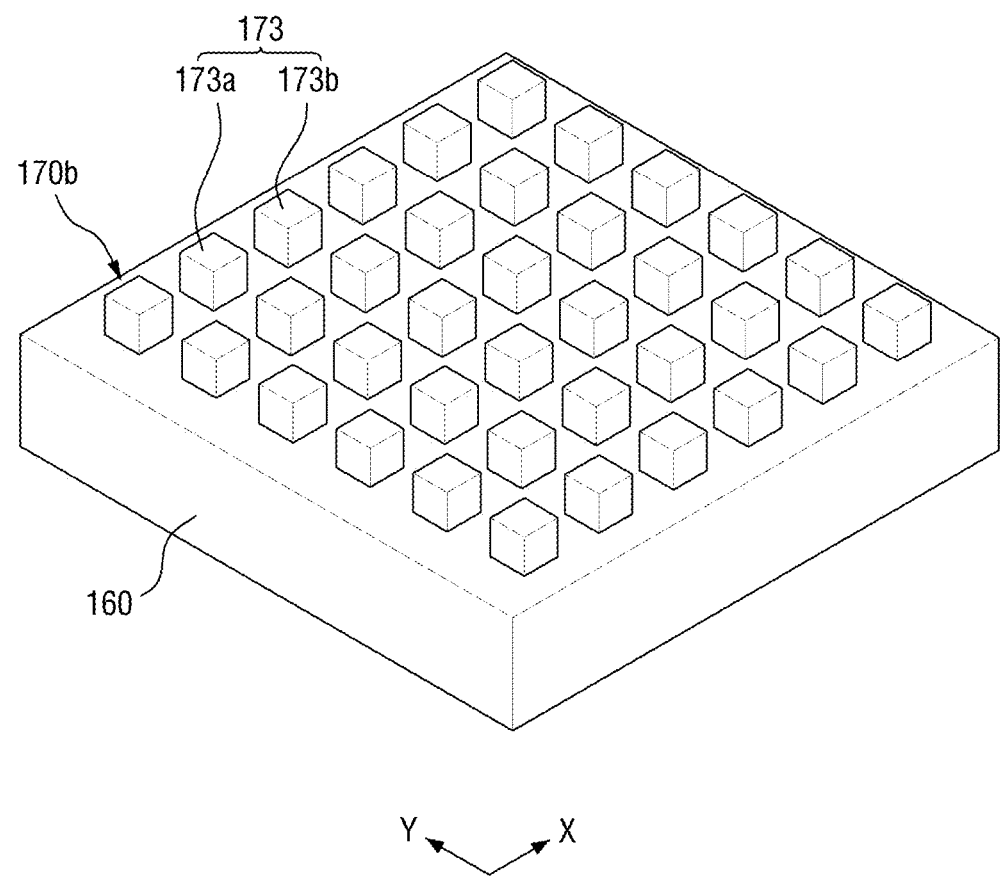
FIG. 20 is a perspective view of an exemplary embodiment of the diffraction pattern layer illustrated in FIG. 1.
Figure 21:
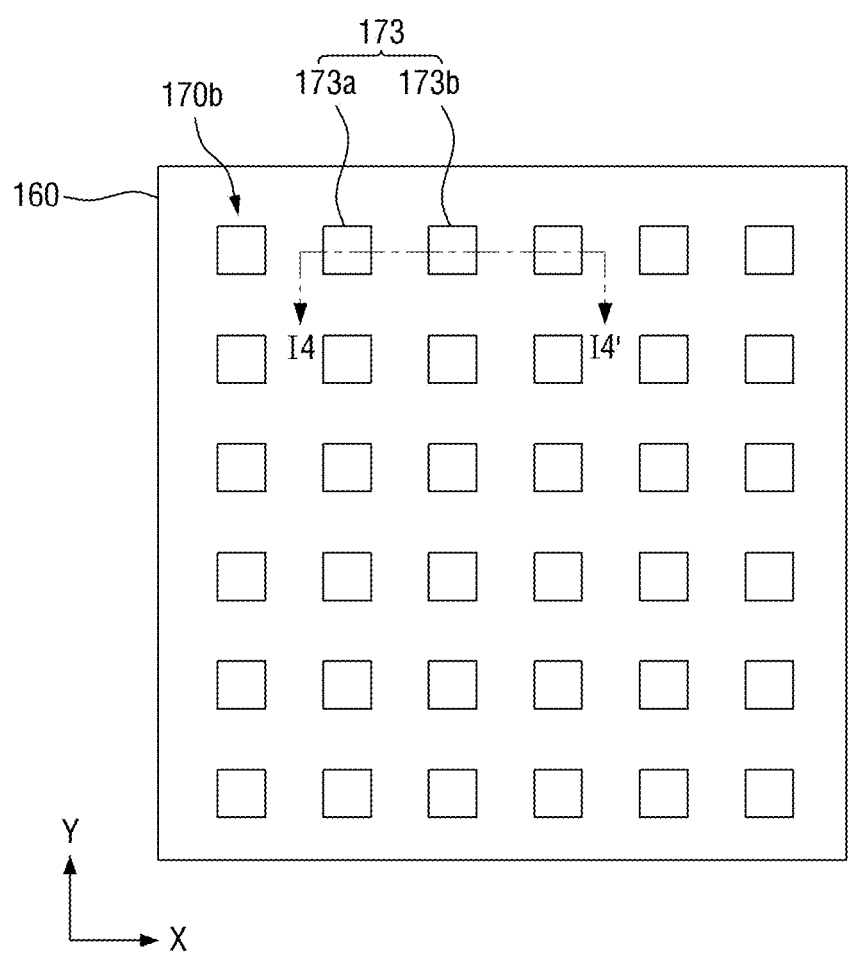
FIG. 21 is a plan view of a diffraction pattern layer illustrated in FIG. 20.
Figure 22:
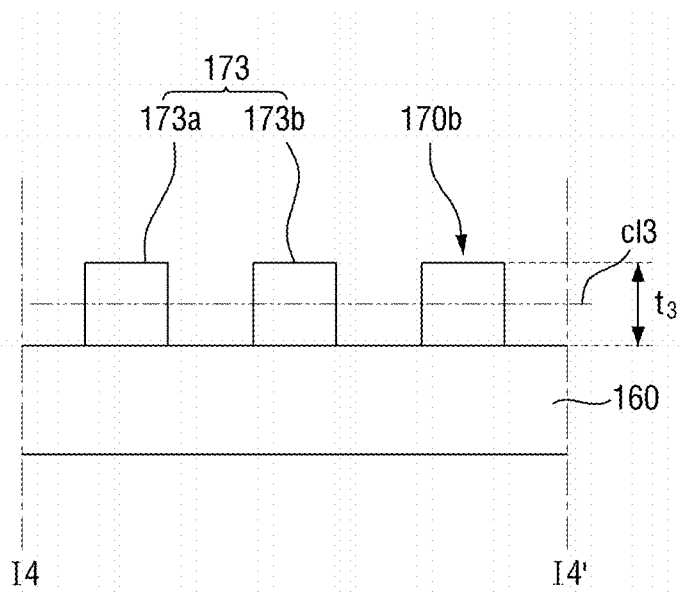
FIG. 22 is a cross-sectional view taken along line I4-I4' of FIG. 20.
Figure 23:
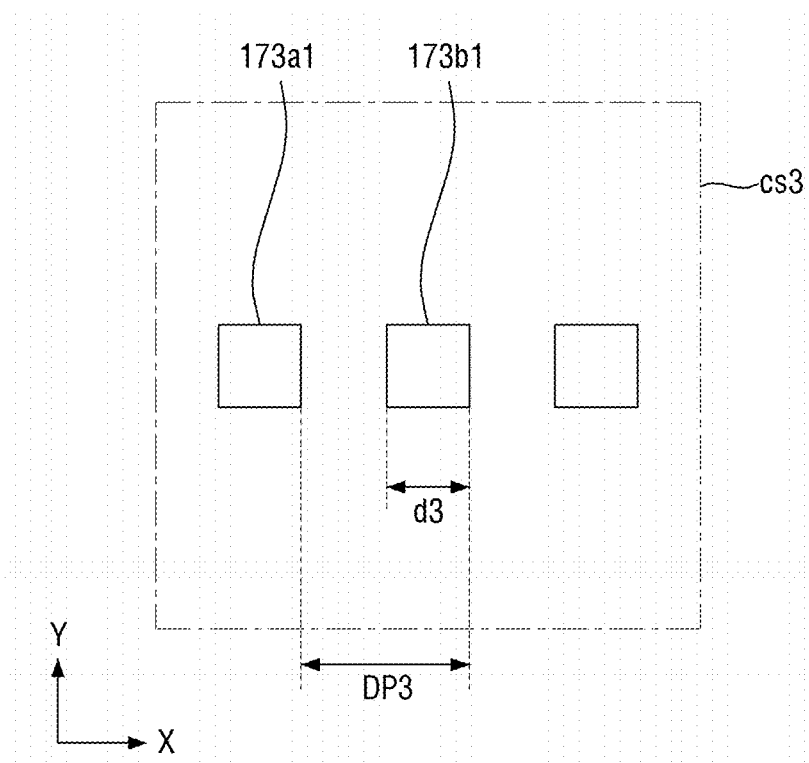
FIG. 23 is a cross-sectional view taken along a third virtual line of FIG. 22.

FIG. 20 is a perspective view of an exemplary embodiment of the diffraction pattern layer 170 illustrated in FIG. 1. FIG. 21 is a plan view of a diffraction pattern layer 170*b* illustrated in FIG. 20. FIG. 22 is a cross-sectional view taken along line I4-I4' of FIG. 21. FIG. 23 is a cross-sectional view taken along a third virtual line cl3 of FIG. 22. For simplicity, a redundant description of components identical to those described above with reference to FIGS. 1 through 19 will be omitted.

The diffraction pattern layer 170*b* may include a plurality of diffraction patterns 173. In an exemplary embodiment, the diffraction patterns 173 may protrude upward from the encapsulation layer 160 based on FIG. 20.

The diffraction patterns 173 may be quadrilateral in a plan view In an exemplary embodiment, the diffraction patterns 173 may be square in a plan view. That is, the diffraction patterns 173 may be cubic in an exemplary embodiment.

The diffraction patterns 173 may have a third thickness t3. The third thickness t3 refers to a distance from lower surfaces of the diffraction patterns 173 (i.e., the upper surface of the encapsulation layer 160) to upper surfaces (i.e., upper surfaces of the diffraction patterns 173) based on FIG. 22.

The diffraction patterns 173 may be arranged with a third period DP3. In addition, the diffraction patterns 173 may have a third length d3. Here, the third period DP3 and the third length d3 are defined based on a cross-sectional area cs3 taken along the third virtual line cl3. The third virtual line cl3 refers to a line passing through a halfway point of the third thickness 3 of each of the diffraction patterns 173. Reference numeral 173*a*1 indicates a cross section of a first diffraction pattern 173*a* taken along the third virtual line cl3. Reference numeral 173*b*1 indicates a cross section of a second diffraction pattern 173*b* taken along the third virtual line cl3.

Referring to FIG. 23, the third period DP3 is defined as a distance from a side of the cross section 173*a*1 of the first diffraction pattern 173*a* adjacent to a side of the cross section 173*b*1 of the second diffraction pattern 173*b* to the other side of the cross section 173*b*1 of the second diffraction pattern 173*b* opposite the above side of the cross section 173*b*1 of the second diffraction pattern 173*b*. In addition, the third length d3 of the second diffraction pattern 173*b* denotes, for example, a width of the cross section 173*b*1 of the second diffraction pattern 173*b*.

Referring again to FIGS. 20 through 22, a period between diffraction patterns arranged along the first direction X and a period between diffraction patterns arranged along the second direction Y among the diffraction patterns 173 may all be the third period DP3 in an exemplary embodiment. In addition, the number of diffraction patterns arranged along the first direction X and the number of diffraction patterns arranged along the second direction Y may be equal to each other in an exemplary embodiment.

As illustrated in FIGS. 20 through 23, when the cross sections of the diffraction patterns 173 are square, Inequality (1) may be changed to $0.4 \leq d1/DP1 \leq 1$.

Since the diffraction patterns 173 have quadrilateral cross sections, the organic light emitting display device according to the exemplary embodiment does not include a minimum space required for diffraction when the first period DP1 and the first length d1 are equal to each other. Thus, a case where the d1/DP1 value is 1 is excluded.

Figure 24:
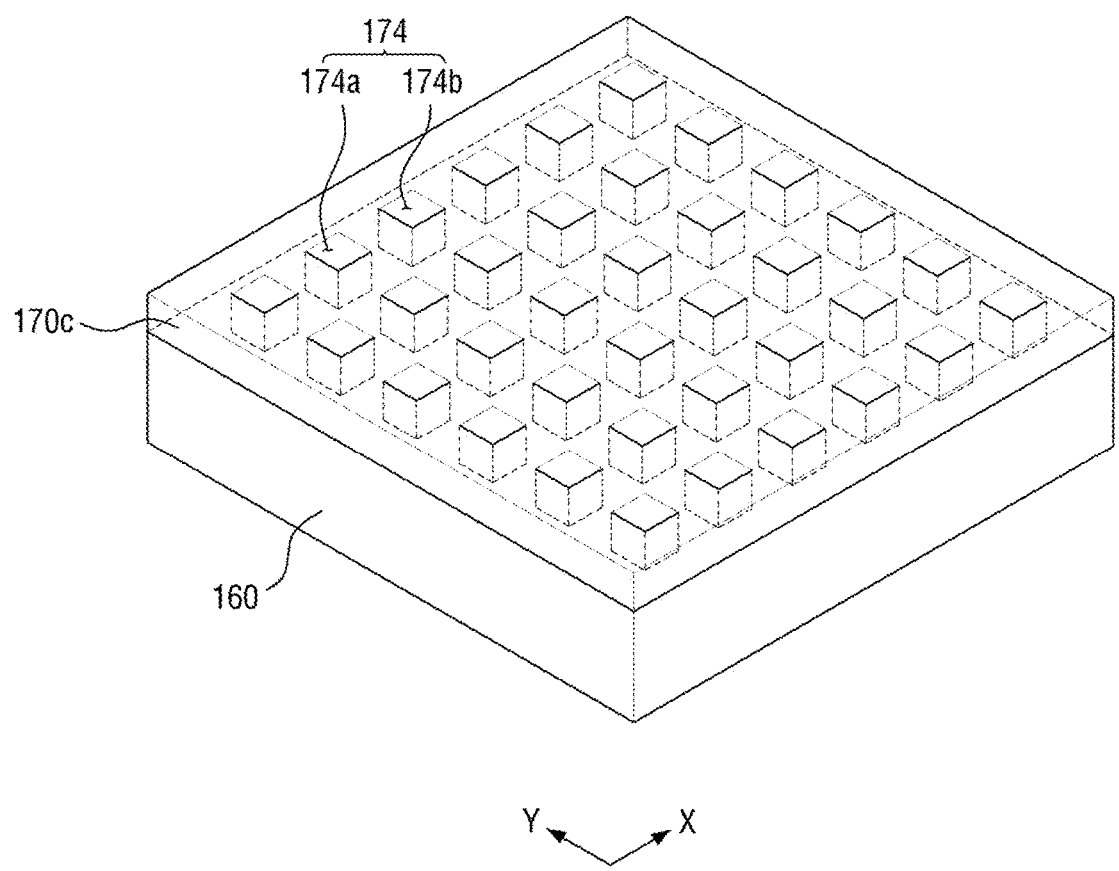
FIG. 24 is a perspective view of an exemplary embodiment of the diffraction pattern layer illustrated in FIG. 1.
Figure 25:
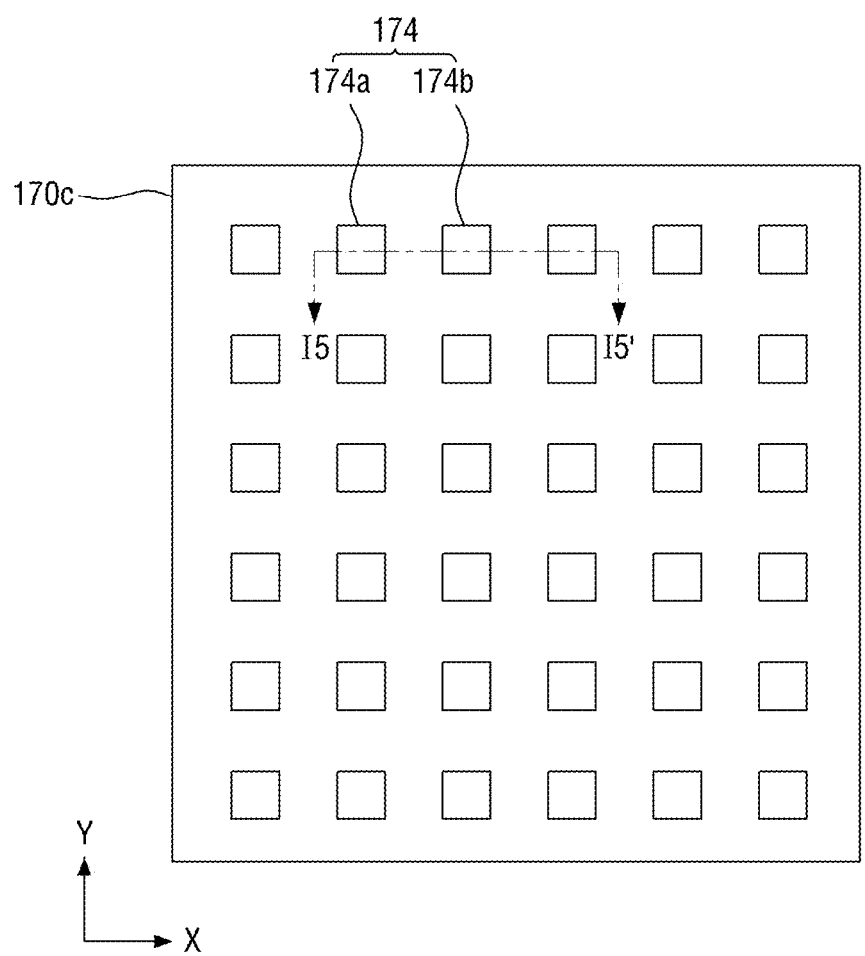
FIG. 25 is a plan view of a diffraction pattern layer illustrated in FIG. 24.
Figure 26:
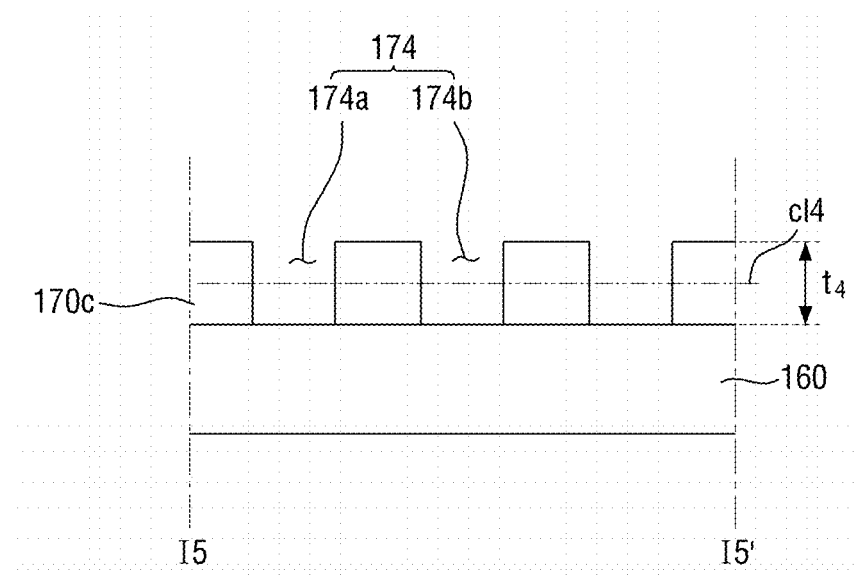
FIG. 26 is a cross-sectional view taken along line I5-I5' of FIG. 25.
Figure 27:
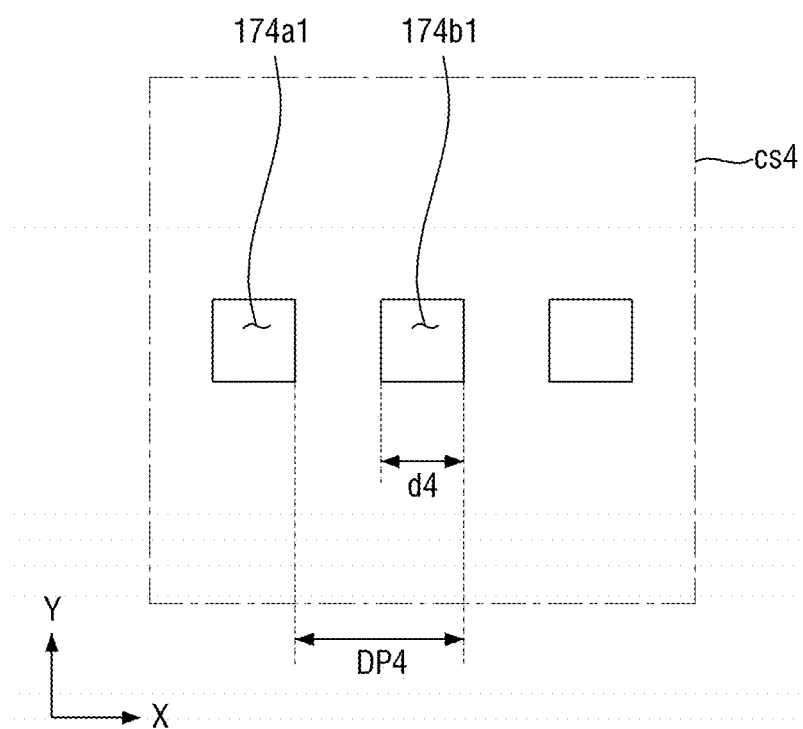
FIG. 27 is a cross-sectional view taken along a fourth virtual line of FIG. 26.

FIG. 24 is a perspective view of an exemplary embodiment of the diffraction pattern layer 170 illustrated in FIG. 1. FIG. 25 is a plan view of a diffraction pattern layer 170*c* illustrated in FIG. 24. FIG. 26 is a cross-sectional view taken along line I5-I5' of FIG. 25. FIG. 27 is a cross-sectional view taken along a fourth virtual line cl4 of FIG. 26. For simplicity, a description of components identical to those described above with reference to FIGS. 1 through 23 will be omitted.

Referring to FIGS. 24 through 27, the diffraction pattern layer 170*c* may be disposed on the encapsulation layer 160. A plurality of diffraction patterns 174 may penetrate the diffraction pattern layer 170*c*. The diffraction patterns 174 may be shaped like engraved quadrilateral pillars in an exemplary embodiment. That is, upper and lower surfaces of the diffraction patterns 174 illustrated in FIGS. 24 through 27 may have quadrilateral cross sections, and the diffraction patterns 174 may be in the form of holes penetrating from the diffraction pattern layer 170*c* toward the encapsulation layer 160.

The diffraction patterns 174 may have a fourth thickness 4. The fourth thickness t4 refers to a distance from the lower surfaces of the diffraction patterns 174 (i.e., the upper surface of the encapsulation layer 160) to upper surfaces (i.e., the upper surfaces of the diffraction patterns 174) based on FIG. 26.

The diffraction patterns 174 may be arranged with a fourth period DP4. In addition, the diffraction patterns 174 may have a fourth length d4. Here, the fourth period DP4 and the fourth length d4 are defined based on a cross-sectional area cs4 taken along the fourth virtual line c4. The fourth virtual line cl4 refers to a line passing through a halfway point of the fourth thickness t4 of each of diffraction patterns 174. Reference numeral 174*a*1 indicates a cross section of a first diffraction pattern 174*a* taken along the fourth virtual line c14. Reference numeral 174*b*1 indicates a cross section of a second diffraction pattern 174*b* taken along the fourth virtual line cl4.

Referring to FIG. 27, the fourth period DP4 is defined as a distance from a side of the cross section 174*a*1 of the first diffraction pattern 174*a* adjacent to a side of the cross section 174*b*1 of the second diffraction pattern 174*b* to the other side of the cross section 174*b*1 of the second diffraction pattern 174*b* opposite the above side of the cross section 174*b*1 of the second diffraction pattern 174*b*. In addition, the fourth length d4 of the second diffraction pattern 174*b* denotes, for example, a width of the cross section 174*b*1 of the second diffraction pattern 174*b*.

Referring again to FIGS. 24 through 26, a period between diffraction patterns arranged along the first direction X and a period between diffraction patterns arranged along the second direction Y among the diffraction patterns 174 may all be the fourth period DP4 in an exemplary embodiment. In addition, the number of diffraction patterns arranged along the first direction X and the number of diffraction patterns arranged along the second direction Y may be equal to each other in an exemplary embodiment.

The upper and lower surfaces of the diffraction patterns 171 through 174 described above with reference to FIGS. 3 through 6 and 16 through 27 may have the same area in an exemplary embodiment. Hereinafter, a case where the areas of the upper and lower surfaces of a plurality of diffraction patterns are different from each other will be described with reference to FIGS. 28 through 30.

FIGS. 28(a) through 30(b) illustrate embodiments of a case where the areas of upper and lower surfaces of a plurality of diffraction patterns of a diffraction pattern layer are different.

Figure 28A:
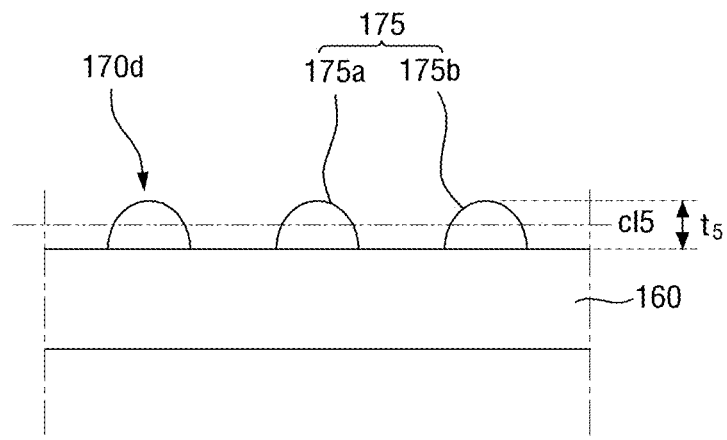
FIGS. 28(a) through 30(b) illustrate embodiments of a case where the areas of upper and lower surfaces of a plurality of diffraction patterns of a diffraction pattern layer are different.
Figure 28B:
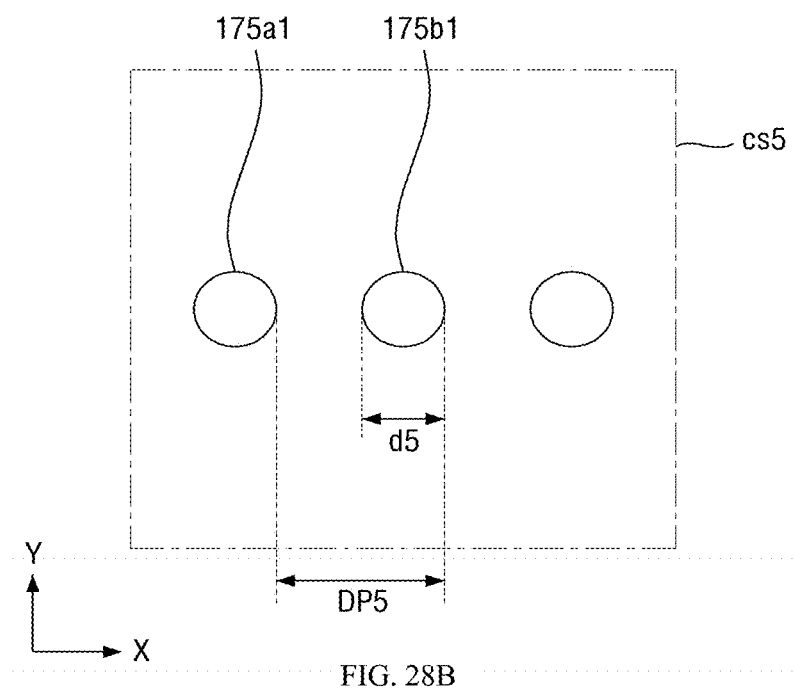

FIG. 28(a) is a cross-sectional view of a diffraction pattern layer 170d according to an exemplary embodiment. FIG. 28(b) is a cross-sectional view taken along a fifth virtual line cl5 of FIG. 28(a).

Referring to FIGS. 28(a) and 28(b), the diffraction pattern layer 170d may include a plurality of diffraction patterns 175 disposed on the encapsulation layer 160 and having a hemispherical shape. That is, the diffraction patterns 175 may protrude from the encapsulation layer 160 in a hemispheric shape in the light emission direction.

The diffraction patterns 175 may have a fifth thickness t5. The fifth thickness 5 refers to a distance from lower surfaces of the diffraction patterns 175 (i.e., the upper surface of the encapsulation layer 160) to upper surfaces (i.e., upper surfaces of the diffraction patterns 175) based on FIG. 28(a).

The diffraction patterns 175 may be arranged with a fifth period DP5. In addition, the diffraction patterns 175 may have a fifth length d5. Here, the fifth period DP5 and the fifth length d5 are defined based on a cross-sectional area cs5 taken along the fifth virtual line cl5. The fifth virtual line c5 refers to a line passing through a halfway point of the fifth thickness t5 of each of the diffraction patterns 175. Reference numeral 175a1 indicates a cross section of a first diffraction pattern 175a taken along the fifth virtual line cl5. Reference numeral 175b1 indicates a cross section of a second diffraction pattern 175b taken along the fifth virtual line cl5.

Referring to FIG. 28(b), the fifth period DP5 is defined as a distance from a side of the cross section 175a1 of the first diffraction pattern 175a adjacent to a side of the cross section 175b1 of the second diffraction pattern 175b to the other side of the cross section 175b1 of the second diffraction pattern 175b opposite the above side of the cross section 175b1 of the second diffraction pattern 175b. In addition, the fifth length d5 of the second diffraction pattern 175b denotes, for example, a width of the cross section 175b1 of the second diffraction pattern 175b.

Figure 29A:
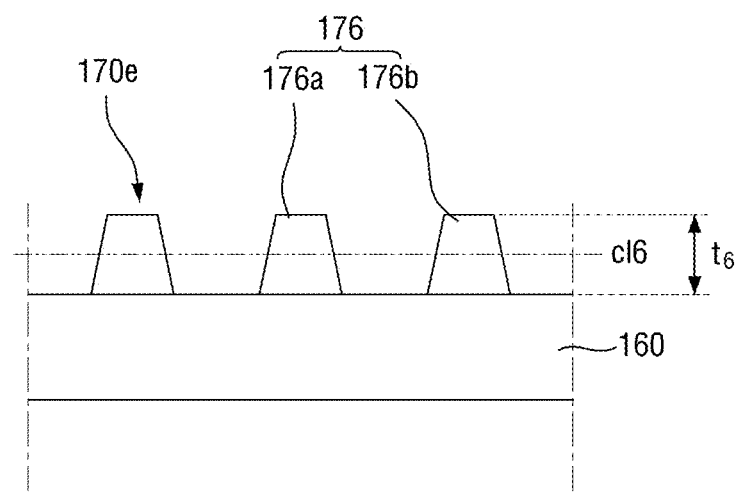
Figure 29B:
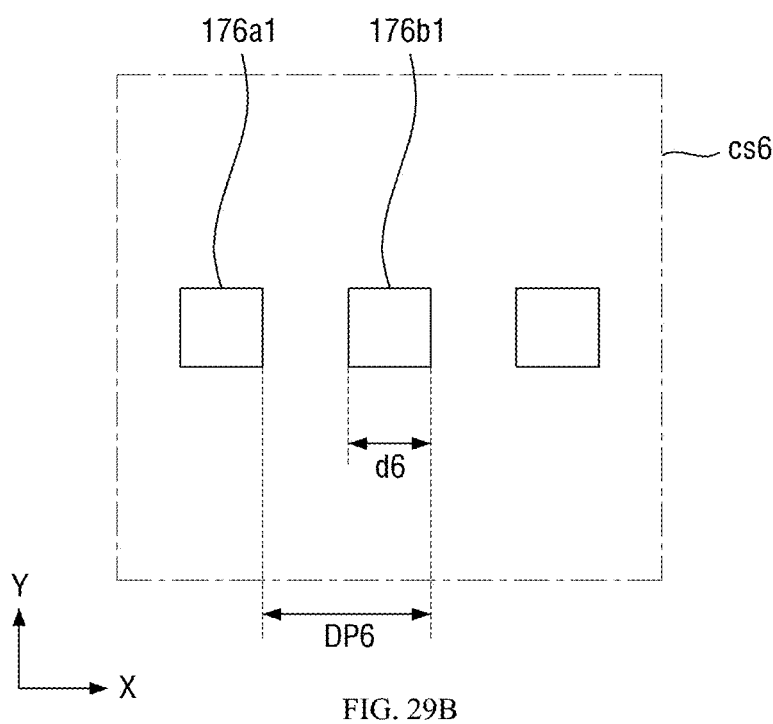

FIG. 29(a) is a cross-sectional view of a diffraction pattern layer 170e according to an exemplary embodiment. FIG. 29(b) is a cross-sectional view taken along a sixth virtual line cl6 of FIG. 29(a).

Referring to FIGS. 29(a) and 29(b), the diffraction pattern layer 170e may include a plurality of diffraction patterns 176 disposed on the encapsulation layer 160 and having a trapezoidal shape. That is, the diffraction patterns 176 may protrude from the encapsulation layer 160 in a trapezoidal shape in the light emission direction.

The diffraction patterns 176 may have a sixth thickness t6. The sixth thickness t6 refers to a distance from lower surfaces of the diffraction patterns 176 (i.e., the upper surface of the encapsulation layer 160) to upper surfaces (i.e., upper surfaces of the diffraction patterns 176) based on FIG. 29(a).

The diffraction patterns 176 may be arranged with a sixth period DP6. In addition, the diffraction patterns 176 may have a sixth length d6. Here, the sixth period DP6 and the sixth length d6 are defined based on a cross-sectional area cs6 taken along the sixth virtual line cl6. The sixth virtual line c6 refers to a line passing through a halfway point of the sixth thickness t6 of each of the diffraction patterns 176. Reference numeral 176a1 indicates a cross section of a first diffraction pattern 176a taken along the sixth virtual line c16. Reference numeral 176b1 indicates a cross section of a second diffraction pattern 176b taken along the sixth virtual line cl6.

Referring to FIG. 29(b), the sixth period DP6 is defined as a distance from a side of the cross section 176a1 of the first diffraction pattern 176a adjacent to a side of the cross section 176b1 of the second diffraction pattern 176b to the other side of the cross section 176b1 of the second diffraction pattern 176b opposite the above side of the cross section 176b1 of the second diffraction pattern 176b. In addition, the sixth length d6 of the second diffraction pattern 176b denotes, for example, a width of the cross section 176b1 of the second diffraction pattern 176b.

Figure 30A:
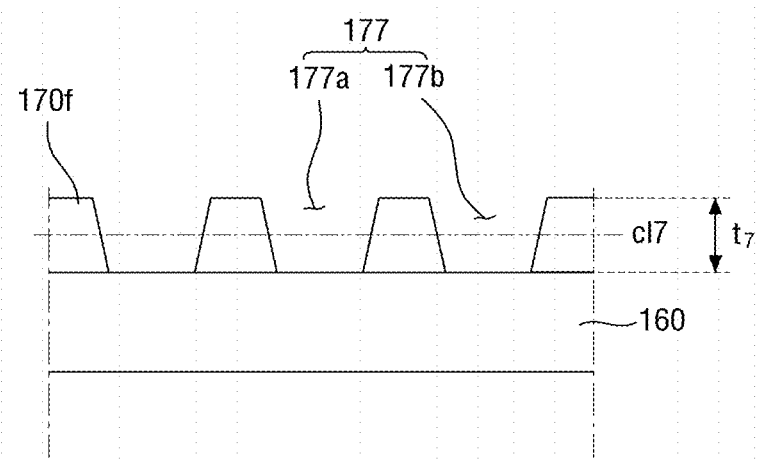
Figure 30B:
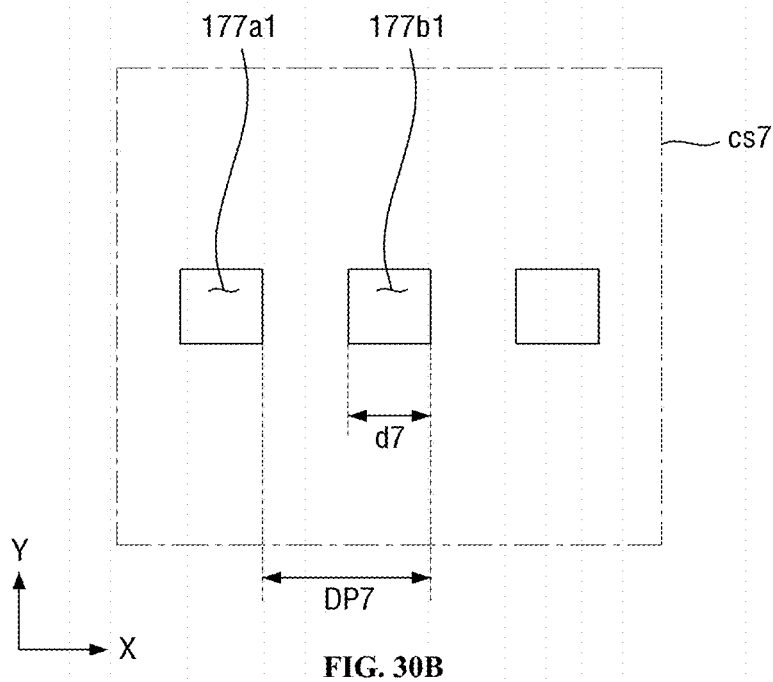

FIG. 30(a) is a cross-sectional view of a diffraction pattern layer 170f according to an exemplary embodiment. FIG. 30(b) is a cross-sectional view taken along a seventh virtual line cl7 of FIG. 30(a).

Referring to FIGS. 30(a) and 30(b), the diffraction pattern layer 170f may include a plurality of diffraction patterns 177 disposed on the encapsulation layer 160 and engraved in a trapezoidal shape. That is, while the diffraction patterns 176 illustrated in FIG. 29 protrude from the encapsulation layer 160 in the light emission direction, the diffraction patterns 177 illustrated in FIG. 30 may be in the form of holes penetrating from the diffraction pattern layer 170f toward the encapsulation layer 160.

Even when the diffraction patterns 177 are engraved, the seventh length d7 and the seventh period DP7 of the diffraction patterns 177 are defined based on a cross-sectional area cs7 taken along the seventh virtual line c7.

That is, even when the areas of lower and upper surfaces of diffraction patterns of a diffraction pattern layer are different from each other, the period and length of the diffraction patterns are defined based on a cross section taken along a virtual line passing through the middle of the thickness of the diffraction pattern layer.

A method of forming the diffraction pattern layers 170, 170a, 170b, 170c, 170d, 170e and 170f is not particularly limited. In an exemplary embodiment, the diffraction pattern layers 170, 170a, 170b, 170c, 170d, 170e and 170f may be provided by forming an inorganic layer on the encapsulation layer 160 and then performing an etching process. Here, the inorganic layer may include any one or more of silicon oxide (SiOx), silicon nitride (SiNx), and silicon oxynitride (SiONx). In addition, although the etching process is not particularly limited, dry etching may be used as an exemplary embodiment.

In FIGS. 1 through 30, a case where the diffraction pattern layers 170, 170a, 170b. 170c, 170d, 170e and 170f are provided separately from the encapsulation layer 160 has been described. However, the invention is not limited to this case. Hereinafter, a case where an encapsulation layer and a diffraction pattern layer are unitary with each other will be described with reference to FIGS. 31 through 36. In the specification, when it is expressed that "a first component and a second component are unitary," it means that the first and second components include the same material. However, when "the first component and the second component are unitary," it does not necessarily mean that they are provided at the same time by the same process.

Figure 31:
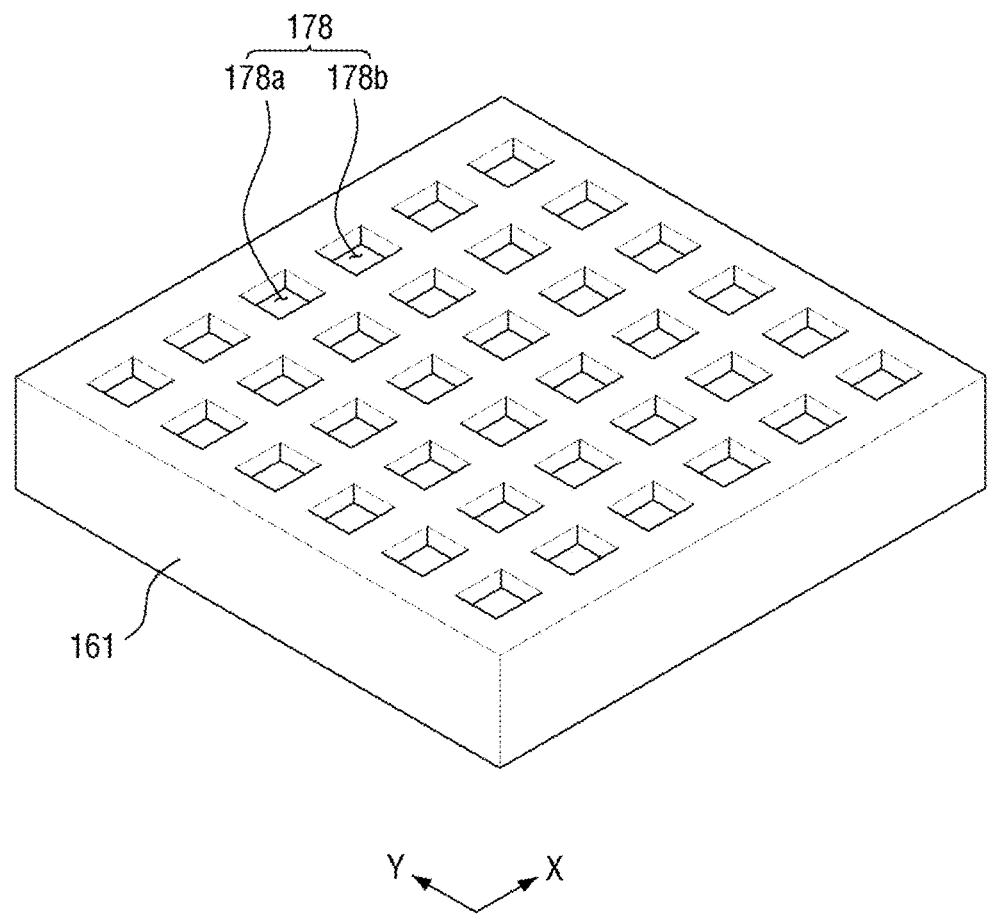
FIG. 31 is a perspective view of an exemplary embodiment of the encapsulation layer and the diffraction patterns illustrated in FIG. 1.
Figure 32:
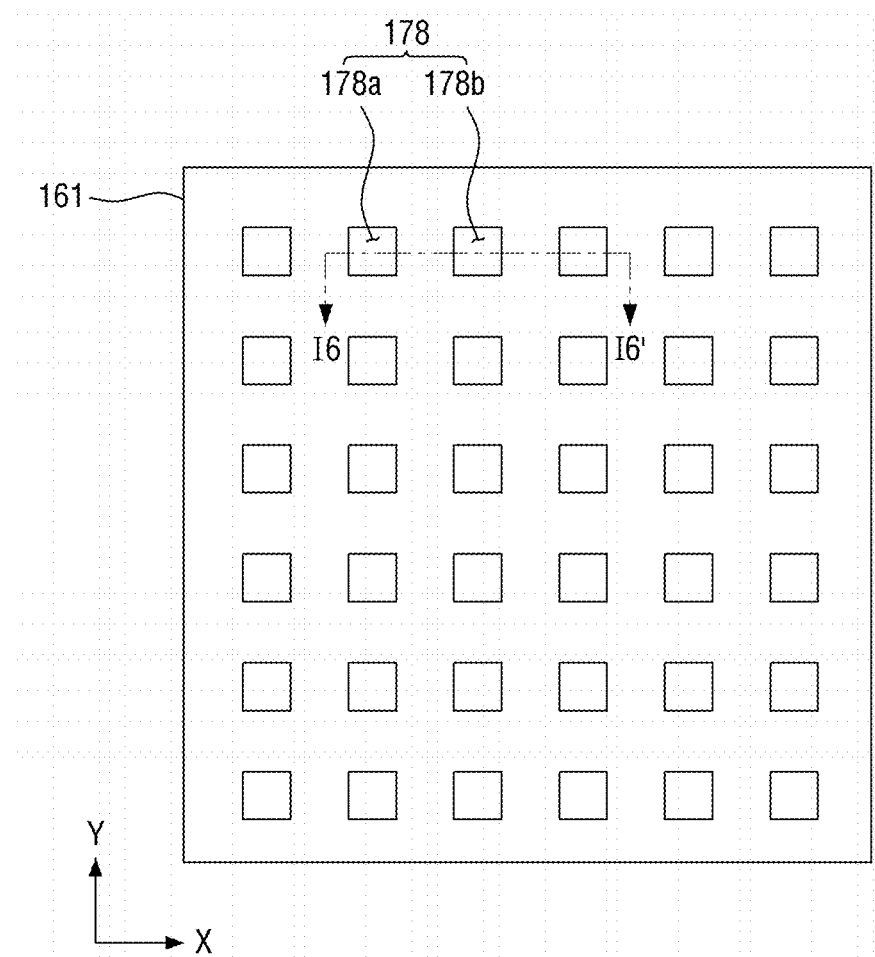
FIG. 32 is a plan view of an encapsulation layer unitary with a plurality of diffraction patterns illustrated in FIG. 31.
Figure 33:
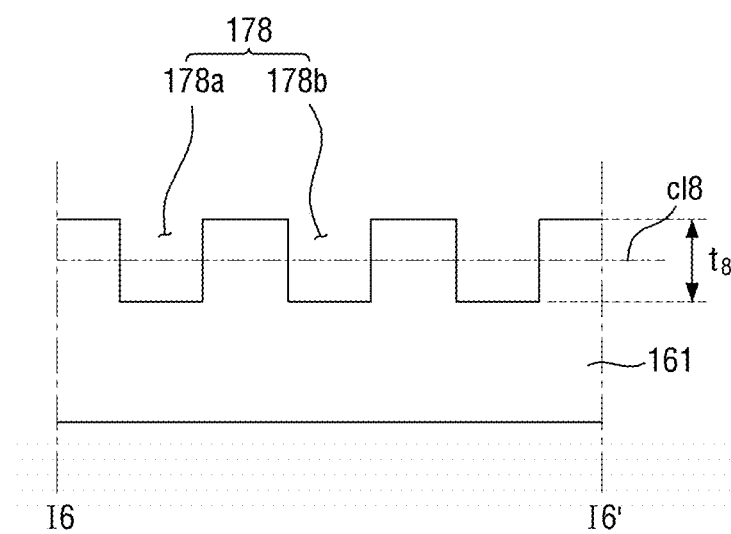
FIG. 33 is a cross-sectional view taken along line I6-I6' of FIG. 32.
Figure 34:
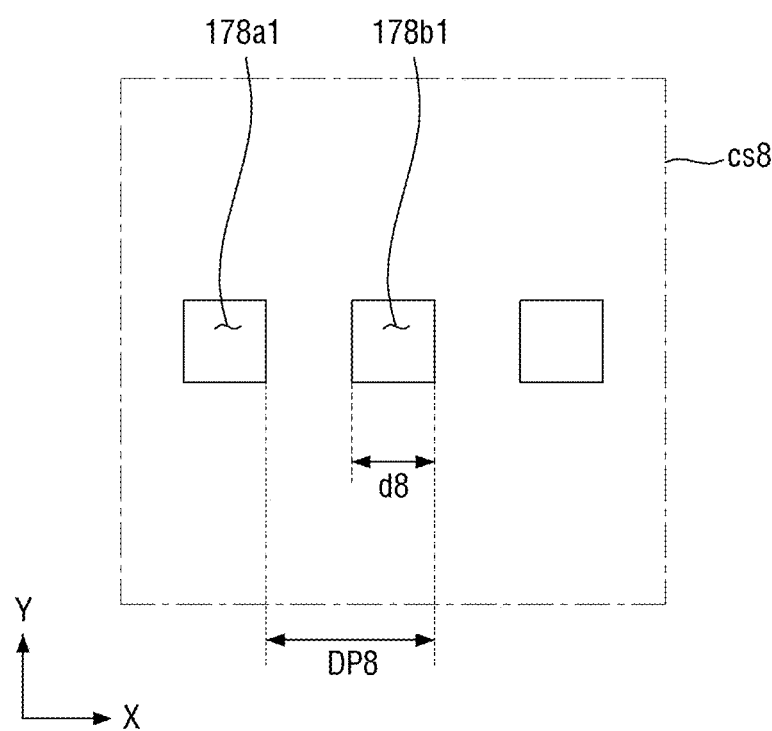
FIG. 34 is a cross-sectional view taken along an eighth virtual line of FIG. 33.

FIG. 31 is a perspective view of an exemplary embodiment of the encapsulation layer 160 and the diffraction patterns 171 illustrated in FIG. 1. FIG. 32 is a plan view of an encapsulation layer 161 unitary with a plurality of diffraction patterns 178 illustrated in FIG. 31. FIG. 33 is a cross-sectional view taken along line I6-I6' of FIG. 32. FIG. 34 is a cross-sectional view taken along an eighth virtual line c8 of FIG. 33. For simplicity, a redundant description of components identical to those described above with reference to FIGS. 1 through 30 will be omitted.

Referring to FIGS. 31 through 34, the diffraction patterns 178 may be unitary with the encapsulation layer 161. That is, the diffraction patterns 178 may be engraved on the encapsulation layer 161.

In an exemplary embodiment, the diffraction patterns 178 may be quadrilateral in a plan view. In addition, the diffraction patterns 178 may be cubic in an exemplary embodiment. However, the shape of the diffraction patterns 178 may also be circular in a plan view In addition, the diffraction patterns 178 may be cylindrical in an exemplary embodiment.

The diffraction patterns 178 may have an eighth thickness 18. The eighth thickness 18 refers to a distance from lower surfaces to upper surfaces of the diffraction patterns 178 based on FIG. 33.

The diffraction patterns 178 may be arranged with an eighth period DP8. In addition, the diffraction patterns 178 may have an eighth length d8. Here, the eighth period DP8 and the eighth length d8 are defined based on a cross-sectional area cs8 taken along the eighth virtual line cl8. The eighth virtual line cl8 refers to a line passing through a halfway point of the eighth thickness t8 of each of the diffraction patterns 178. Reference numeral 178a1 indicates a cross section of a first diffraction pattern 178a taken along the eighth virtual line cl8. Reference numeral 178b1 indicates a cross section of a second diffraction pattern 178b taken along the eighth virtual line cl8.

Referring to FIG. 34, the eighth period DP8 is defined as a distance from a side of the cross section 178a1 of the first diffraction pattern 178a adjacent to a side of the cross section 178b1 of the second diffraction pattern 178b to the other side of the cross section 178b1 of the second diffraction pattern 178b opposite the above side of the cross section 178b1 of the second diffraction pattern 178b. In addition, the eighth length d8 of the second diffraction pattern 178b denotes, for example, a width of the cross section 178b1 of the second diffraction pattern 178b.

Referring again to FIGS. 31 through 33, a period between diffraction patterns arranged along the first direction X and a period between diffraction patterns arranged along the second direction Y among the diffraction patterns 178 may all be the eighth period DP8 in an exemplary embodiment. In addition, the number of diffraction patterns arranged along the first direction X and the number of diffraction patterns arranged along the second direction Y may be equal to each other in an exemplary embodiment.

That is, even when the encapsulation layer 161 and the diffraction patterns 178 are unitary in an organic light emitting display device according to an exemplary embodiment, the period and length of the diffraction patterns 178 may be defined based on a cross section taken along the eighth virtual line cl8.

Figure 35:
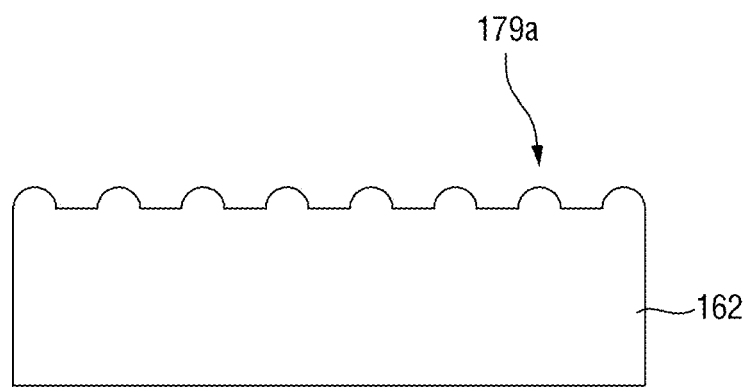
FIGS. 35 and 36 illustrate embodiments of a diffraction pattern layer unitary with the encapsulation layer illustrated in FIG. 31.
Figure 36:
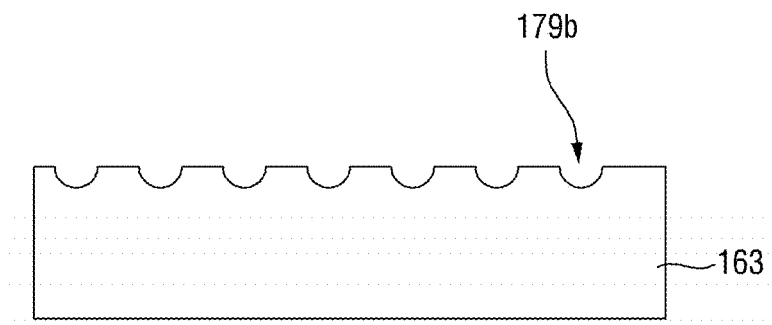

FIGS. 35 and 36 illustrate embodiments of a diffraction pattern layer unitary with the encapsulation layer 161 illustrated in FIG. 31.

Referring to FIG. 35, a plurality of diffraction patterns 179a may be unitary with an encapsulation layer 162 and may have a hemispherical shape as an exemplary embodiment. In addition, referring to FIG. 36, a plurality of diffraction patterns 179b may be unitary with an encapsulation layer 163 and may be engraved in a hemispherical shape as an exemplary embodiment. A plurality of diffraction patterns may also have a polygonal shape including a triangular shape, a pentagonal shape, and a hexagonal shape in a plan view. In an exemplary embodiment the diffraction patterns may have a sinusoidal shape, for example.

Figure 37:
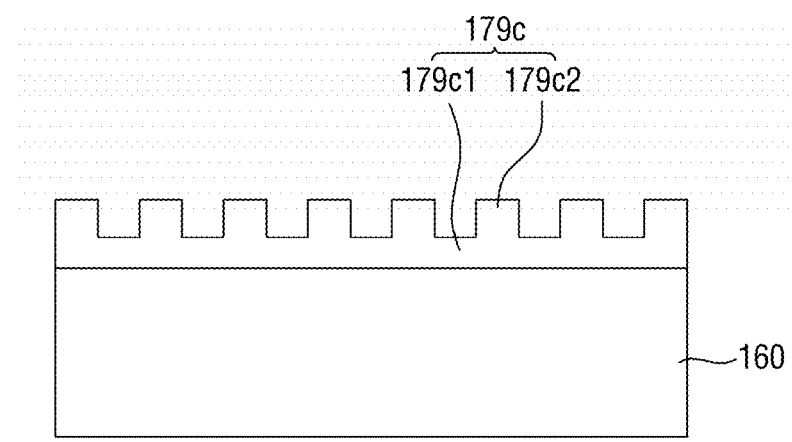
FIGS. 37 and 38 are cross-sectional views of embodiments of the diffraction pattern layer illustrated in FIG. 1.
Figure 38:
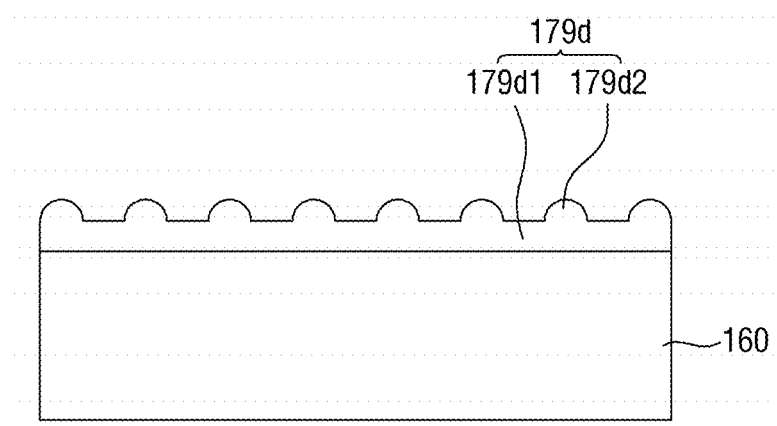

FIGS. 37 and 38 are cross-sectional views of embodiments of the diffraction pattern layer 170 illustrated in FIG. 1.

Referring to FIG. 37, a plurality of diffraction patterns 179c may include a base member 179c1 and a plurality of protruding patterns 179c2 protruding upward from the base member 179c1 based on FIG. 37. The base member 179c1 may be disposed on an encapsulation layer 160 and may be unitary with the protruding patterns 179c2. In an exemplary embodiment, the protruding patterns 179c2 may have quadrilateral cross sections, for example.

Referring to FIG. 38, a plurality of diffraction patterns 179d may include a base member 179d1 and a plurality of protruding patterns 179d2 protruding upward from the base member 179d1 based on FIG. 38. The base member 179d1 may be disposed on an encapsulation layer 160 and may be unitary with the protruding patterns 179d2. In an exemplary embodiment, the protruding patterns 179d2 may have hemispherical cross sections, for example.

That is, since the diffraction patterns 179c and 179d include the base members 179c1 and 179d1 as illustrated in FIGS. 37 and 38, an upper surface of the encapsulation layer 160 located between the protruding patterns 179c2 and 179d2 may be covered with the base member 179c1 and 179d1.

The size and shape of the diffraction patterns 179c and 179d are not limited to those illustrated in FIGS. 37 and 38.

A method of forming the diffraction patterns 178 and 179 is not particularly limited. In an exemplary embodiment, when the encapsulation layer 160 is a glass insulating substrate, the diffraction pattern layers 178 and 179 may be provided by etching an upper portion of the glass insulating substrate through an etching process. The etching process is not particularly limited, but wet etching may be used as an exemplary embodiment.

FIGS. 39(a) through 46 illustrate the shape, period, and arrangement of a plurality of diffraction patterns of a diffraction pattern layer in organic light emitting display devices according to embodiments and the shape and diffraction distance of second emission patterns corresponding to the above exemplary embodiments. For simplicity, a redundant description of components identical to those described above with reference to FIGS. 1 through 38 will be omitted.

An organic light emitting display device having a plurality of diffraction patterns 210a extending in the second direction Y will be described first with reference to FIGS. 39 and 40.

FIG. 39(a) is a plan view of a diffraction pattern layer 200a according to an exemplary embodiment. FIG. 39(b) is across-sectional view taken along line III-III' of FIG. 39(a). FIG. 39(c) is a cross-sectional view taken along a ninth virtual line cl9 of FIG. 39(b).

Referring to FIGS. 39(a) through 39(c), the diffraction pattern layer 200a may include the diffraction patterns 210a disposed on an encapsulation layer 160. The diffraction patterns 210a may extend along the second direction Y. In addition, the diffraction patterns 210a may neighbor each other along the first direction X. The diffraction patterns 210a may be shaped like rectangular parallelepipeds in an exemplary embodiment.

The diffraction patterns 210a may have a ninth thickness 9. In addition, the diffraction patterns 210a may have a ninth period DP9. Here, the ninth period DP9 is defined based on a cross-sectional area cs9 taken along the ninth virtual line cl9 as described above. That is, the ninth period DP9 is defined based on a cross section 211a1 of a first diffraction pattern 211a and a cross section 212a1 of a second diffraction pattern 212a.

Figure 40:
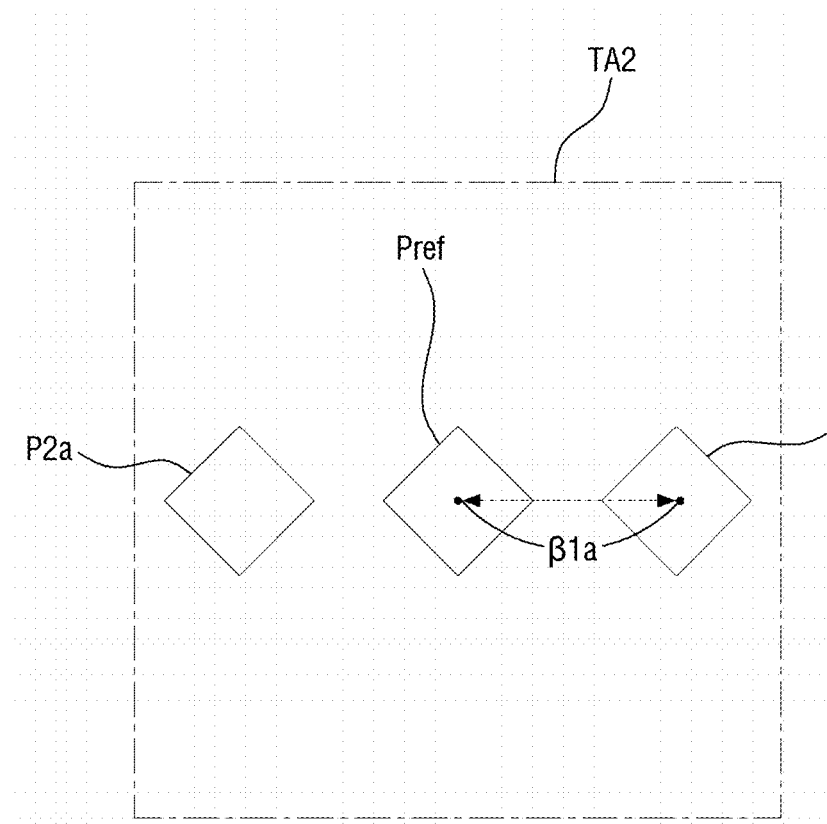

Referring to FIGS. 14 and 40, a first duplicate emission pattern P1a and a second duplicate emission pattern P2a, which are arranged in the same row as a reference emission pattern Pref, may be generated in a second region TA2. The following description will be given based on the first duplicate emission pattern P1a. A diffraction distance P1a between the reference emission pattern Pref and the first duplicate emission pattern P1a may be given by Equation (9) below:

$$\beta 1a = z1 \cdot \tan\left[\sin^{-1}\left(\frac{\lambda}{DP9} \cdot \frac{1}{n151}\right)\right] + z2 \cdot \tan\left[\sin^{-1}\left(\frac{\lambda}{DP9} \cdot \frac{1}{nEN}\right)\right]. \quad (9)$$

Figure 42:
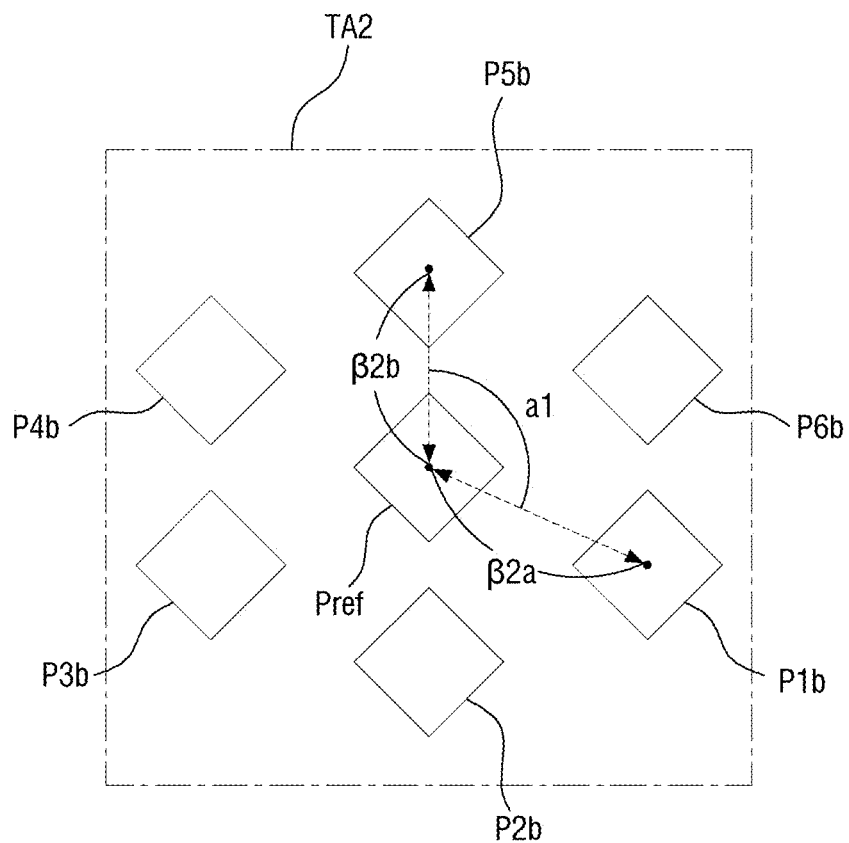

An organic light emitting display device including a plurality of diffraction patterns 210b having a predetermined period and arranged in an arbitrary form will be described with reference to FIGS. 14, 41, and 42. For simplicity, a redundant description of components identical to those described above with reference to FIGS. 39 and 40 will be omitted.

FIG. 41(a) is a plan view of a diffraction pattern layer 200b according to an exemplary embodiment. FIG. 41(b) is a cross-sectional view taken along line II2-II2' of FIG. 41(a). FIG. 41(c) is a cross-sectional view taken along a tenth virtual line cl10 of FIG. 41(b).

Referring to FIGS. 41(a) through 41(c), the diffraction pattern layer 200b may include the diffraction patterns 210b disposed on an encapsulation layer 160. The diffraction patterns 210b may include first through third diffraction patterns 211b through 213b.

The arrangement of the first through third diffraction patterns 211b through 213b will be described based on FIG. 41.

The first diffraction pattern 211b may neighbor the third diffraction pattern 213b along the first direction X. The first diffraction patterns 211b may neighbor the second diffraction pattern 212b along the diagonal direction. An angle defined between a virtual line vl1a connecting a center of the first diffraction pattern 211b and a center of the second diffraction pattern 212b and a virtual line vl2a connecting the center of the first diffraction pattern 211b and a center of the third diffraction pattern 213b may be represented by θ1. That is, the second diffraction pattern 212b and the third diffraction pattern 213b may be arranged to have an included angle of θ1 with respect to the first diffraction pattern 211b.

The diffraction patterns 210b may have a tenth thickness t10. Referring to FIGS. 41(b) and 41(c), a period between the first diffraction pattern 211b and the second diffraction pattern 212b may be a 10a$^{th}$ period DP10a. In addition, a period between the first diffraction pattern 211b and the third diffraction pattern 213b may be a 10b$^{th}$ period DP10b. Here, the 10a$^{th}$ period DP10a and the 10b$^{th}$ period DP10b are defined based on a cross-sectional area cs10 taken along the tenth virtual line cl10 as described above.

Accordingly, a first diffraction angle θ1a and a second diffraction angle θ2a may be given by Equations (10) and (11), respectively:

$$\theta 1a = \sin^{-1}\left(\frac{\lambda}{DP10a \cdot \sin\varphi 1} \cdot \frac{1}{n151}\right), \quad (10)$$

$$\theta 2a = \sin^{-1}\left(\frac{\lambda}{DP10b \cdot \sin\varphi 1} \cdot \frac{1}{nEN}\right). \quad (11)$$

As the first diffraction angle θ1a and the second diffraction angle θ2a vary, the form and the number of duplicate emission patterns disposed in a second region TA2 also vary. Referring to FIG. 42, a first duplicate emission pattern P1b may be separated from a reference emission pattern Pref by a first diffraction distance β2a. In addition, a fifth duplicate emission pattern P5b may be separated from the reference emission pattern Pref by a second diffraction distance β2b. An angle of a1 in FIG. 42 may be (180−φ1) degrees in an exemplary embodiment.

The first diffraction distance β2a and the second diffraction distance β2b may be given by Equations (12) and (13), respectively:

$$\beta 2a = z1 \cdot \tan\left[\sin^{-1}\left(\frac{\lambda}{DP10a \cdot \sin\varphi 1} \cdot \frac{1}{n151}\right)\right] + \quad (12)$$
$$z2 \cdot \tan\left[\sin^{-1}\left(\frac{\lambda}{DP10a \cdot \sin\varphi 1} \cdot \frac{1}{nEN}\right)\right],$$

$$\beta 2b = z1 \cdot \tan\left[\sin^{-1}\left(\frac{\lambda}{DP10b \cdot \sin\varphi 1} \cdot \frac{1}{n151}\right)\right] + \quad (13)$$
$$z2 \cdot \tan\left[\sin^{-1}\left(\frac{\lambda}{DP10b \cdot \sin\varphi 1} \cdot \frac{1}{nEN}\right)\right].$$

An organic light emitting display device including a plurality of diffraction patterns 210c that are rectangular in a plan view will be described with reference to FIGS. 14, 43 and 44.

FIG. 43(a) is a plan view of a diffraction pattern layer 200c according to an exemplary embodiment. FIG. 43(b) is a cross-sectional view taken along line II3-II3' of FIG. 43(a). FIG. 43(c) is a cross-sectional view taken along an eleventh virtual line cl11 of FIG. 43(b).

Referring to FIGS. 43(a) through 43(c), the diffraction pattern layer 200c may include the diffraction patterns 210c disposed on an encapsulation layer 160. The diffraction patterns 210c may include first through third diffraction patterns 211c through 213c.

Based on FIG. 43, the number of diffraction patterns arranged along the first direction X and the number of diffraction patterns arranged along the second direction Y may be equal to each other in an exemplary embodiment. The first diffraction pattern 211c may neighbor the third diffraction pattern 213c along the first direction X. The first diffraction pattern 211c may neighbor the second diffraction pattern 212c along the second direction Y. An angle defined between a virtual line vl1b connecting a center of the first diffraction pattern 211c and a center of the second diffraction pattern 212c and a virtual line vl2b connecting the center of the first diffraction pattern 211c and a center of the third diffraction pattern 213c may be about 90 degrees.

The diffraction patterns 210c may have an eleventh thickness t11. Referring to FIGS. 43(b) and 43(c), a period between the first diffraction pattern 211c and the second diffraction pattern 212c may be an 11a$^{th}$ period DP11a. In addition, a period between the first diffraction pattern 211c and the third diffraction pattern 213c may be an 11b$^{th}$ period DP11b. Here, the 11a$^{th}$ period DP11a and the 11b$^{th}$ period DP11b are defined based on a cross-sectional area cs11 taken along the eleventh virtual line cl11 as described above. In an exemplary embodiment, the 11a$^{th}$ period DP11a and the 11b$^{th}$ period DP11b may be different from each other.

Figure 44:
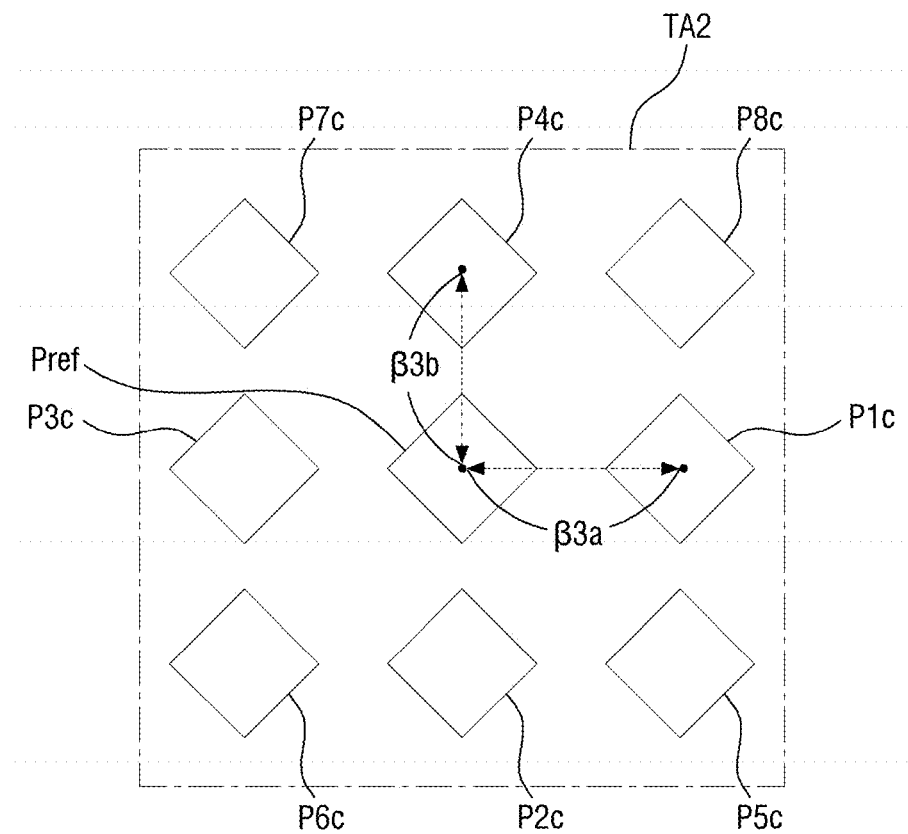

Referring to FIG. 44, a first duplicate emission pattern P1c separated from a reference emission pattern Pref by a first diffraction distance β3a and a fourth duplicate emission pattern P4c separated from the reference emission pattern Pref by a second diffraction distance β3b may be generated in a second region TA2.

The first diffraction distance β3a between the reference emission pattern Pref and the first duplicate emission pattern P1c may be given by Equation (14) below:

$$\beta 3a = z1 \cdot \tan\left[\sin^{-1}\left(\frac{\lambda}{DP11a} \cdot \frac{1}{n151}\right)\right] + z2 \cdot \tan\left[\sin^{-1}\left(\frac{\lambda}{DP11a} \cdot \frac{1}{nEN}\right)\right]. \quad (14)$$

In addition, the second diffraction distance β3b between the reference emission pattern Pref and the fourth duplicate emission pattern P4c may be given by Equation (15) below:

$$\beta 3b = z1 \cdot \tan\left[\sin^{-1}\left(\frac{\lambda}{DP11b} \cdot \frac{1}{n151}\right)\right] + z2 \cdot \tan\left[\sin^{-1}\left(\frac{\lambda}{DP11b} \cdot \frac{1}{nEN}\right)\right]. \quad (15)$$

Figure 46:
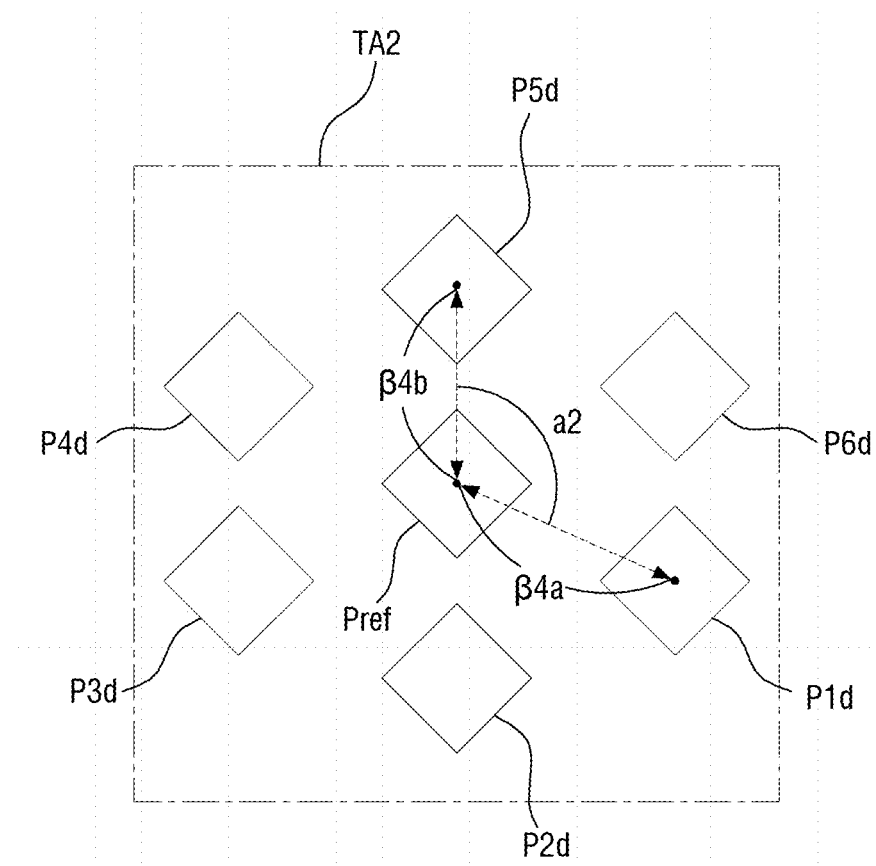

An organic light emitting display device including a plurality of diffraction patterns 210d arranged in a hexagonal shape will be described with reference to FIGS. 14, 45 and 46.

FIG. 45(a) is a plan view of a diffraction pattern layer 200d according to an exemplary embodiment. FIG. 45(b) is a cross-sectional view taken along line II4-II4' of FIG. 45(a). FIG. 45(c) is a cross-sectional view taken along a twelfth virtual line cl12 of FIG. 45(b).

Referring to FIGS. 45(a) through 45(c), the diffraction pattern layer 200d may include the diffraction patterns 210d disposed on an encapsulation layer 160. The diffraction patterns 210d may include first through third diffraction patterns 211d through 213d. The arrangement of the diffraction patterns 210d will be described based on the first through third diffraction patterns 211d through 213d.

The diffraction patterns 210d may be arranged in a hexagonal structure, for example. More specifically, the first diffraction pattern 211d may neighbor the third diffraction pattern 213d along the first direction X. The first diffraction pattern 211d may neighbor the second diffraction pattern 212d along the diagonal direction. An angle defined between a virtual line vl1c connecting a center of the first diffraction pattern 211d and a center of the second diffraction pattern 212d and a virtual line vl2c connecting the center of the first diffraction pattern 211d and a center of the third diffraction pattern 213d may be represented by φ2. In an exemplary embodiment, p2 may be about 60 degrees, for example. That is, the second diffraction pattern 212d and the third diffraction pattern 213d may be arranged to have an included angle of p2 (about 60 degrees) with respect to the first diffraction pattern 211d.

The diffraction patterns 210d may have a twelfth thickness 112. Referring to FIGS. 45(b) and 45(c), a period between the first diffraction pattern 211d and the second diffraction pattern 212d may be a 12a$^{th}$ period DP12a. In addition, a period between the first diffraction pattern 211d and the third diffraction pattern 213d may be a 12b$^{th}$ period DP12b. Here, the 12a$^{th}$ period DP12a and the 12b$_{th}$ period DP12b are defined based on a cross-sectional area cs12 taken along the twelfth virtual line cl12 as described above.

Accordingly, a first diffraction angle θ1b and a second diffraction angle θ2b may be given by Equations (16) and (17), respectively:

$$\theta 1b = \sin^{-1}\left(\frac{2\lambda}{\sqrt{3} \cdot DP12a} \cdot \frac{1}{n151}\right), \quad (16)$$

$$\theta 2b = \sin^{-1}\left(\frac{2\lambda}{\sqrt{3} \cdot DP12a} \cdot \frac{1}{n151}\right). \quad (17)$$

As the first diffraction angle θ1b and the second diffraction angle θ2b vary, the form and the number of duplicate emission patterns disposed in a second region TA2 vary. Referring to FIG. 46, a first duplicate emission pattern P1d may be separated from a reference emission pattern Pref by a first diffraction distance β4a. In addition, a fifth duplicate emission pattern P5d may be separated from the reference emission pattern Pref by a second diffraction distance β4b. Here, the 12a$^{th}$ period DP12a may be the same as the 12b$^{th}$ period DP12b. Accordingly, the first diffraction distance β4a may be the same as the second diffraction distance β4b.

Therefore, the first diffraction distance β4a (or the second diffraction distance β4b) may be given by Equation (18) below:

$$\beta 4a(\beta 4b) = z1 \cdot \tan\left[\sin^{-1}\left(\frac{2\lambda}{\sqrt{3} \cdot DP12a} \cdot \frac{1}{n151}\right)\right] + z2 \cdot \tan\left[\sin^{-1}\left(\frac{2\lambda}{\sqrt{3} \cdot DP12a} \cdot \frac{1}{nEN}\right)\right]. \quad (18)$$

That is, the first diffraction angle θ1 (refer to FIG. 7A) of light emitted from the organic light emitting elements 140 (refer to FIGS. 1 and 7A), the second diffraction angle θ2 (refer to FIG. 7A) of the light passing through the diffraction pattern layer 170, the diffraction distance β (refer to FIG. 7B), and luminance may be controlled by changing the period, shape and arrangement structure of a plurality of diffraction patterns.

As described above, when the distance between pixels is changed, at least one of the effective emission area ratio and blurring may be changed. Hereinafter, embodiments of pixel arrangement for defining the distance between pixels will be described with reference to FIGS. 47 and 48.

Figure 47:
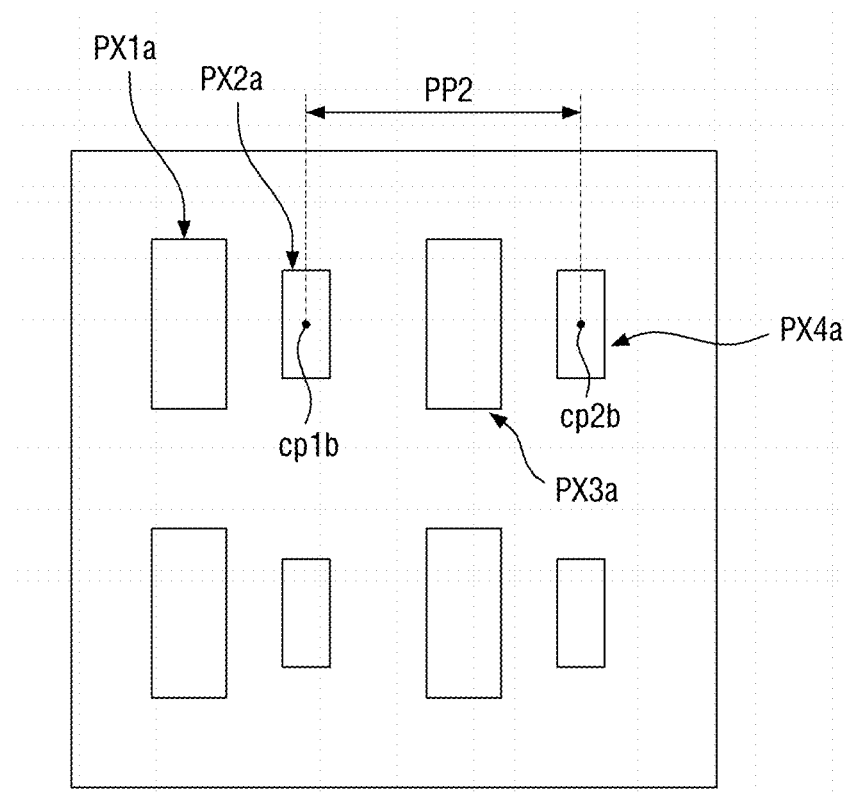
FIGS. 47 and 48 are plan views of exemplary embodiments of pixel arrangements of organic light emitting display devices.
Figure 48:
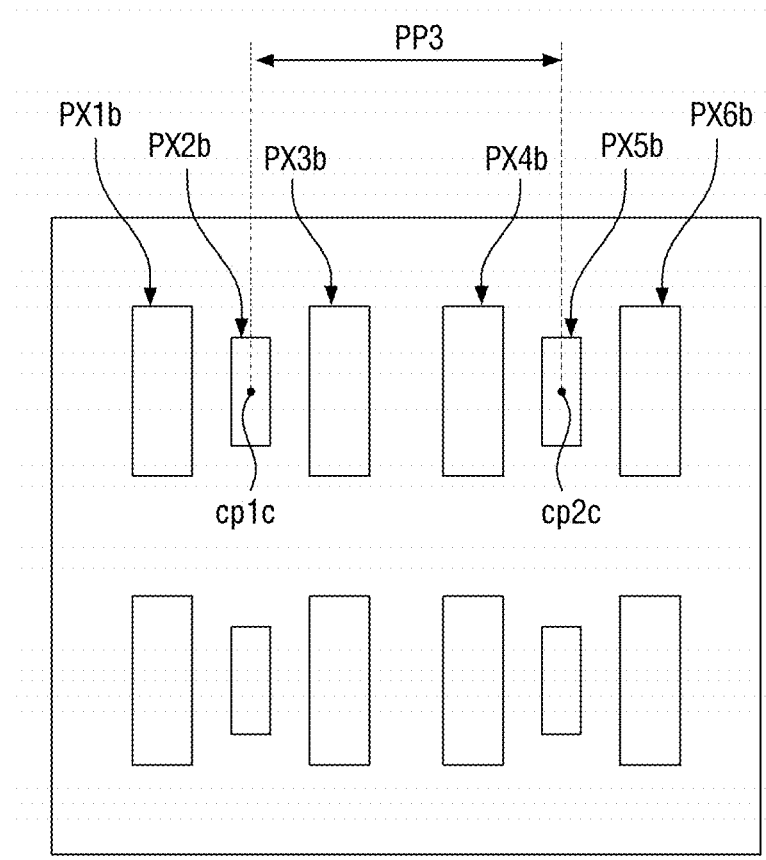

FIGS. 47 and 48 are plan views of pixel arrangements of organic light emitting display devices according to embodiments.

Referring to FIG. 47, first through fourth pixel units PX1a through PX4a may be arranged to neighbor each other in the same row. The first through fourth pixel units PX1a through PX4a may be rectangular in an exemplary embodiment. However, the shape and size of each of the first through fourth pixel units PX1a through PX4a are not limited to those illustrated in FIG. 47.

The first pixel unit PX1a may display a red color in an exemplary embodiment. That is, the first pixel unit PX1a may include a red organic light emitting layer that emits red light. The second and fourth pixel units PX2a and PX4a may display a green color in an exemplary embodiment. That is, the second and fourth pixel units PX2a and PX4a may include a green organic light emitting layer that emits green light. The third pixel unit PX3a may display a blue color in an exemplary embodiment. That is, the third pixel unit PX3a may include a blue organic light emitting layer that emits blue light.

The first through fourth pixel units PX1a through PX4a may form one pixel unit. That is, the first through fourth pixel units PX1 through PX4 may be arranged in an RGBG pentile manner.

A distance PP2 between pixels is defined as a distance between pixel units that display the same color. Hereinafter, the second pixel unit PX2a and the fourth pixel unit PX4a that emit green light will be described as an example.

The inter-pixel distance PP2 may be defined as a shortest distance between a first virtual center point cp1b located in the second pixel unit PX2a and a second virtual center point cp2b located in the fourth pixel unit PX4a.

Referring to FIG. 48, first through sixth pixel units PX1b through PX6b may be arranged to neighbor each other in the same row. The first through sixth pixel units PX1b through PX6b may be rectangular in an exemplary embodiment. The first through third pixel units PX1b through PX3b may display red, green, and blue colors, respectively, in an exemplary embodiment. In addition, the fourth through sixth pixel units PX4b through PX6b may display red, green, and blue colors, respectively, in an exemplary embodiment.

The first through third pixel units PX1b through PX3b may form one pixel unit. In addition, the fourth through sixth pixel units PX4b through PX6b may form one pixel unit.

A distance PP3 between pixels is defined as a distance between pixel units that display the same color. Accordingly, the inter-pixel distance PP3 may be defined as a shortest distance between a first virtual center point cp1c located in the second unit PX2b and a second virtual center point cp2c located in the fifth pixel unit PX5b.

That is, the shortest distance between pixels is defined as the shortest distance between pixel units that display the same color, and the value of the shortest distance between pixels may vary according to the form of pixel arrangement.

Figure 49:
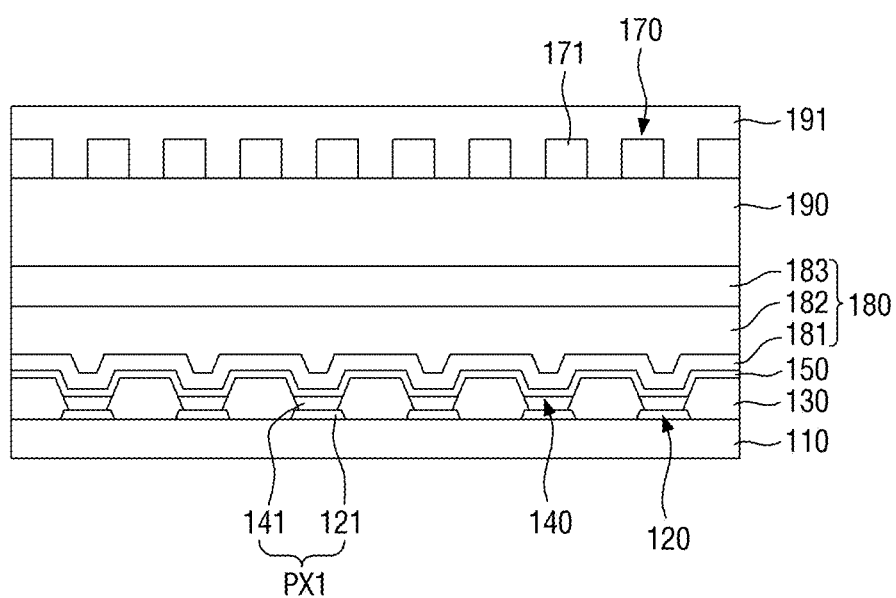
FIG. 49 is a cross-sectional view of an exemplary embodiment of an organic light emitting display device.

FIG. 49 is a cross-sectional view of an organic light emitting display device according to an exemplary embodiment. For simplicity, a redundant description of components identical to those described above with reference to FIGS. 1 through 48 will be omitted. In addition, an exemplary embodiment applicable to the exemplary embodiments described above with reference to FIGS. 16 through 48 is also applicable to the organic light emitting display device illustrated in FIG. 49. That is, the organic light emitting display device according to the exemplary embodiment of FIG. 49 also includes a diffraction pattern layer 170 to increase the effective emission area ratio. In addition, a first diffraction angle θ1 (refer to FIG. 7A) of light emitted from a plurality of organic light emitting elements 140 (refer to FIGS. 1 and 7A), a second diffraction angle θ2 (refer to FIG. 7A) of the light passing through the diffraction pattern layer 170, a diffraction distance β (refer to FIG. 7B), and luminance may be controlled by changing the period, shape, length, thickness, distance from the organic light emitting elements and arrangement structure of a plurality of diffraction patterns.

Referring to FIG. 49, the organic light emitting display device according to the current embodiment may include an encapsulation layer 180, a buffer layer 190, and a protective layer 191.

The encapsulation layer 180 may be provided by stacking at least one of an organic layer and an inorganic layer in a single-layer structure or in a multilayer structure. More specifically, the encapsulation layer 180 may include a first inorganic layer 181, an organic layer 182, and a second inorganic layer 183.

The first inorganic layer 181 may be disposed on a common electrode 150. In an exemplary embodiment, the first inorganic layer 181 may include any one or more of silicon oxide (SiOx), silicon nitride (SiNx), and silicon oxynitride (SiONx), for example.

The organic layer 182 may be disposed on the first inorganic layer 181. In an exemplary embodiment, the organic layer 182 may include any one of epoxy, acrylate, and urethane acrylate, for example. The organic layer 182 may planarize a step provided by a pixel defining layer 130.

The second inorganic layer 183 may be disposed on the organic layer 182. In an exemplary embodiment, the second inorganic layer 183 may include at least one of silicon oxide (SiOx), silicon nitride (SiNx), and silicon oxynitride (SiONx), for example.

In FIG. 49, each of the first inorganic layer 181, the organic layer 182 and the second inorganic layer 183 is illustrated as a single layer. However, each of the first inorganic layer 181, the organic layer 182 and the second inorganic layer 183 may also be provided in a multilayer structure The buffer layer 190 may be disposed on the second inorganic layer 183. The material of the buffer layer 190 is not particularly limited. That is, the buffer layer 190 may include an inorganic material or an organic material. In an alternative exemplary embodiment, the buffer layer 190 may be provided by stacking at least one of an organic layer and an inorganic layer in a single-layer structure or in a multi-layer structure. The buffer layer 190 may have a predetermined thickness to maintain a predetermined distance between a plurality of organic light emitting elements 140 and the diffraction pattern layer 170. The buffer layer 190 may have a thickness of about 200 μm or less in an exemplary embodiment. In another exemplary embodiment, the buffer layer 190 may also be omitted.

The protective layer 191 may be disposed on the diffraction pattern layer 170. The protective layer 191 may cover a plurality of diffraction patterns 171 in an exemplary embodiment. The material of the protective layer 191 is not particularly limited In an exemplary embodiment, the protective layer 191 may include at least one of LiF, MgF2, and CaF2, for example.

In the specification, the diffraction pattern layer 170 is disposed on the encapsulation layer 180. However, the invention is not limited to this case. That is, the diffraction pattern layer 170 may include the same material as that of the encapsulation layer 180 and may be disposed on an upper surface of an organic or inorganic layer included in the encapsulation layer 180. In an exemplary embodiment, the diffraction pattern layer 170 may be provided by etching an upper surface of the second inorganic layer 183.

Figure 50:
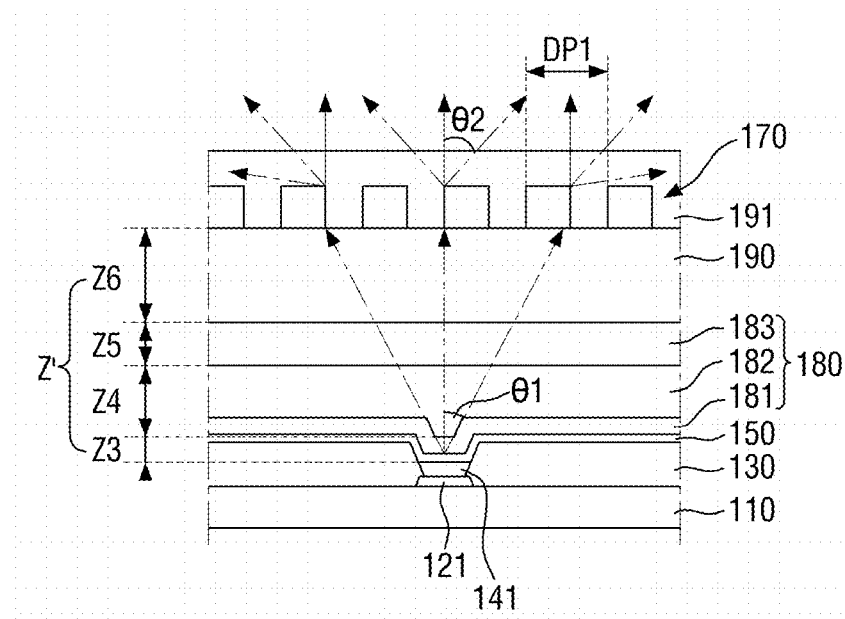
FIG. 50 is a view for explaining factors that determine a diffraction distance in the organic light emitting display device of FIG. 49.

FIG. 50 is a view for explaining factors that determine a diffraction distance in the organic light emitting display device of FIG. 49. For simplicity, a redundant description of components identical to those described above with reference to FIG. 14 will be omitted. In addition, for ease of description, the refraction of light emitted from a first organic light emitting element 141 by the encapsulation layer 180 is not illustrated in FIG. 50.

A distance Z' between the first organic light emitting element 141 and the diffraction pattern layer 170 may be defined as the sum of reference numerals z3, z4, z5 and z6 in FIG. 50.

Z3 is defined as a shortest distance from the first organic light emitting element 141 to a lowermost surface of the organic layer 182. Here, the lowermost surface of the organic layer 182 is a surface located at the shortest distance from the first organic light emitting element 141 among surfaces in direct contact with the first inorganic layer 181. Z4 is defined as a shortest distance from the lowermost surface of the organic layer 182 to an upper surface of the organic layer 182 in the first organic light emitting element 141. The upper surface of the organic layer 182 is a surface in direct contact with the second inorganic layer 183. Z5 is defined as a shortest distance from the upper surface of the organic layer 182 to the buffer layer 190. Z5 may also be defined as a thickness of the second inorganic layer 183. Z6 is defined as a shortest distance from an upper surface of the second inorganic layer 183 to the diffraction pattern layer 170. Z6 may also be defined as a thickness of the buffer layer 190.

In addition, respective refractive indices of the first inorganic layer 181, the organic layer 182, the second inorganic layer 183 and the buffer layer 190 will be indicated by n181, n182, n183 and n190, respectively.

Accordingly, a diffraction distance β may be given by Equation (19) below:

$$\beta = z3 \cdot \tan\left[\sin^{-1}\left(\frac{\lambda}{DP1} \cdot \frac{1}{n181}\right)\right] + \quad (19)$$
$$z4 \cdot \tan\left[\sin^{-1}\left(\frac{\lambda}{DP1} \cdot \frac{1}{n182}\right)\right] + z5 \cdot \tan\left[\sin^{-1}\left(\frac{\lambda}{DP1} \cdot \frac{1}{n183}\right)\right] + $$
$$z6 \cdot \tan\left[\sin^{-1}\left(\frac{\lambda}{DP1} \cdot \frac{1}{n190}\right)\right].$$

In an exemplary embodiment, when another component exists between the diffraction pattern layer 170 and the first organic light emitting element 141, the diffraction distance D may be changed in consideration of the refractive index and thickness of the component. In an exemplary embodiment, when the encapsulation layer 180 and the buffer layer 190 have the same refractive index (the refractive index of the encapsulation layer 180 is indicated by n180), a diffraction distance β" between the first organic light emitting element 141 and the diffraction pattern layer 170 may be given by Equation (20) below:

$$\beta'' = Z \cdot \tan\left[\sin^{-1}\left(\frac{\lambda}{DP1} \cdot \frac{1}{n180}\right)\right]. \quad (20)$$

The organic light emitting display device according to the exemplary embodiment may control the diffraction distance β by adjusting an emission color of the first organic light emitting element 141, the distance Z' between the diffraction pattern layer 170 and the organic light emitting elements 140, the refractive indices n181, n182, n183 and n190 of the components disposed between the diffraction pattern layer 170 and the organic light emitting elements 140, a first period DP1, the first diffraction angle θ1, and the second diffraction angle θ2.

Although not illustrated in the drawings, display elements that provide light to the diffraction pattern layer 170 are not limited to the organic light emitting elements 140. That is, the display elements may include liquid crystal display ("LCD") elements, light emitting diodes ("LEDs"), electroluminescent ("EL") elements, semiconductor light emitting elements, field emission display ("FED") elements, and quantum dot laser elements.

In addition, in the specification, a case where the encapsulation layer 160 (refer to FIG. 1) is a glass substrate and a case where the encapsulation layer 180 (refer to FIG. 49) is a stack of an organic layer and an inorganic layer have been described as an example. However, the invention is not limited to this example. That is, the encapsulation layer may be omitted or replaced with a general substrate or an insulating layer depending on the type of the display elements and the type of a display device.

Figure 51A:
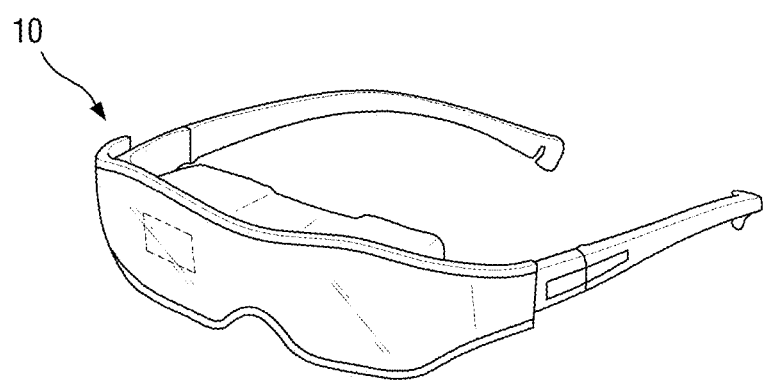
FIGS. 51A and 51B are a perspective view and a cross-sectional view of a head-mounted display device including the organic light emitting display device illustrated in FIG. 1.
Figure 51B:
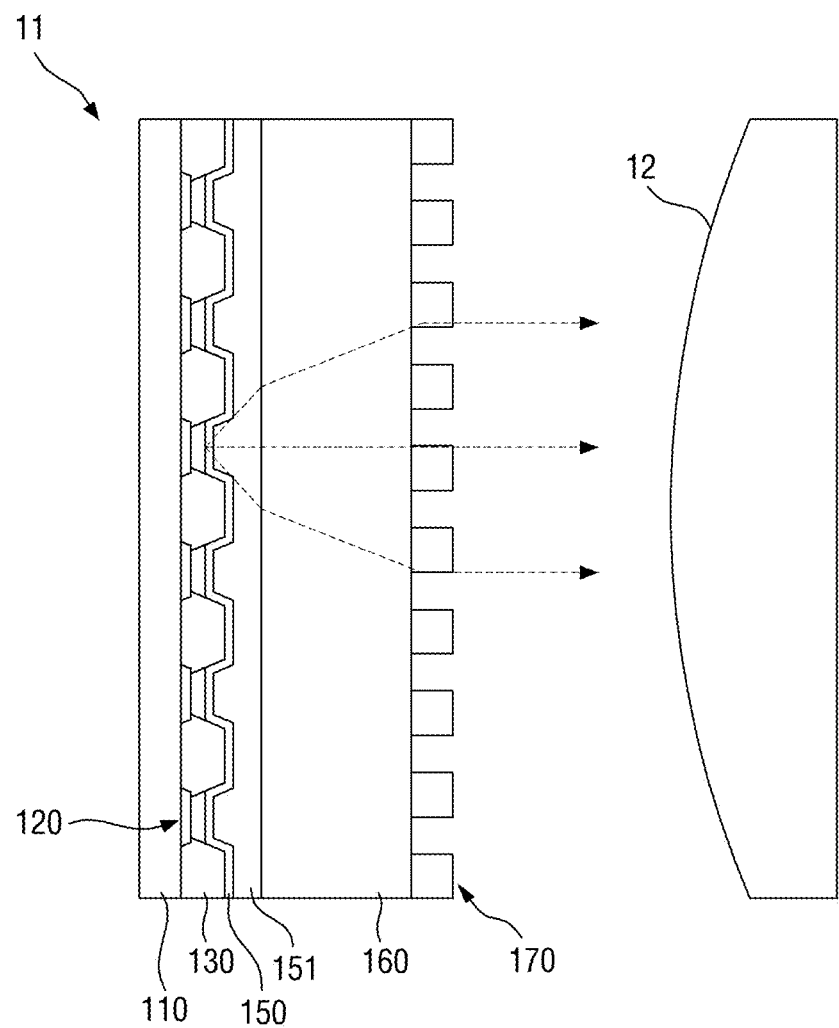

FIGS. 51A and 51B are a perspective view and a cross-sectional view of a head-mounted display device including the organic light emitting display device illustrated in FIG. 1. For simplicity, a redundant description of components identical to those described above with reference to FIGS. 1 through 50 will be omitted.

Referring to FIGS. 1, 51A and 51B, the head-mounted display device 10 according to the current embodiment may include a first display unit 11 and a lens unit 12. Although not illustrated in the drawings, the head-mounted display device 10 according to the current embodiment may further include a camera, an infrared sensor, a signal processing unit, and a frame that may be mounted on a user's head.

The lens unit 12 may receive light from the first display unit 11. The lens unit 12 may be disposed between an object and a user in an exemplary embodiment. The lens unit 12 may be configured as an opaque lens to realize virtual reality in an exemplary embodiment. The lens unit 12 may be configured as a transparent lens or a translucent lens to realize augmented reality in an exemplary embodiment. The lens unit 12 may be a convex lens in an exemplary embodiment.

The first display unit 11 may include a diffraction pattern layer 170 disposed on an encapsulation layer 160. Here, the encapsulation layer 160 may be a glass insulating substrate as an exemplary embodiment. The emission area of the first display unit 11 may be increased by a light interference phenomenon that may occur when light emitted from organic light emitting elements 140 passes through the diffraction pattern layer 170. This indicates that the effective emission area ratio may be increased.

A user may magnify an image of the first display unit 11 using the lens unit 12 and view the magnified image. However, the magnified environment may cause a screen door effect ("SDE"). That is, the magnified environment enables the user to visually recognize gaps between portions of a pixel defining layer in the first display unit 11. However, the region visually recognized by the user due to the magnified environment is a non-emission region.

As described above, the effective emission area ratio refers to the proportion of an emission region in a region. Increasing the effective emission area ratio denotes increasing the area of the emission region. This may be expressed as a decrease in the area of the non-emission region.

That is, the head-mounted display device 10 according to the current embodiment may reduce the area of the non-emission region and reduce the area of the non-emission region visible to a user due to the magnified environment. As a result, the SDE may be improved.

Figure 52A:
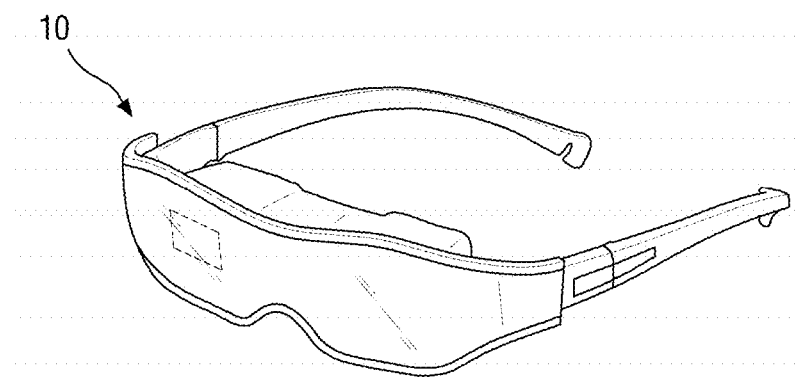
FIGS. 52A and 52B are a perspective view and a cross-sectional view of a head-mounted display device including the organic light emitting display device illustrated in FIG. 49.
Figure 52B:
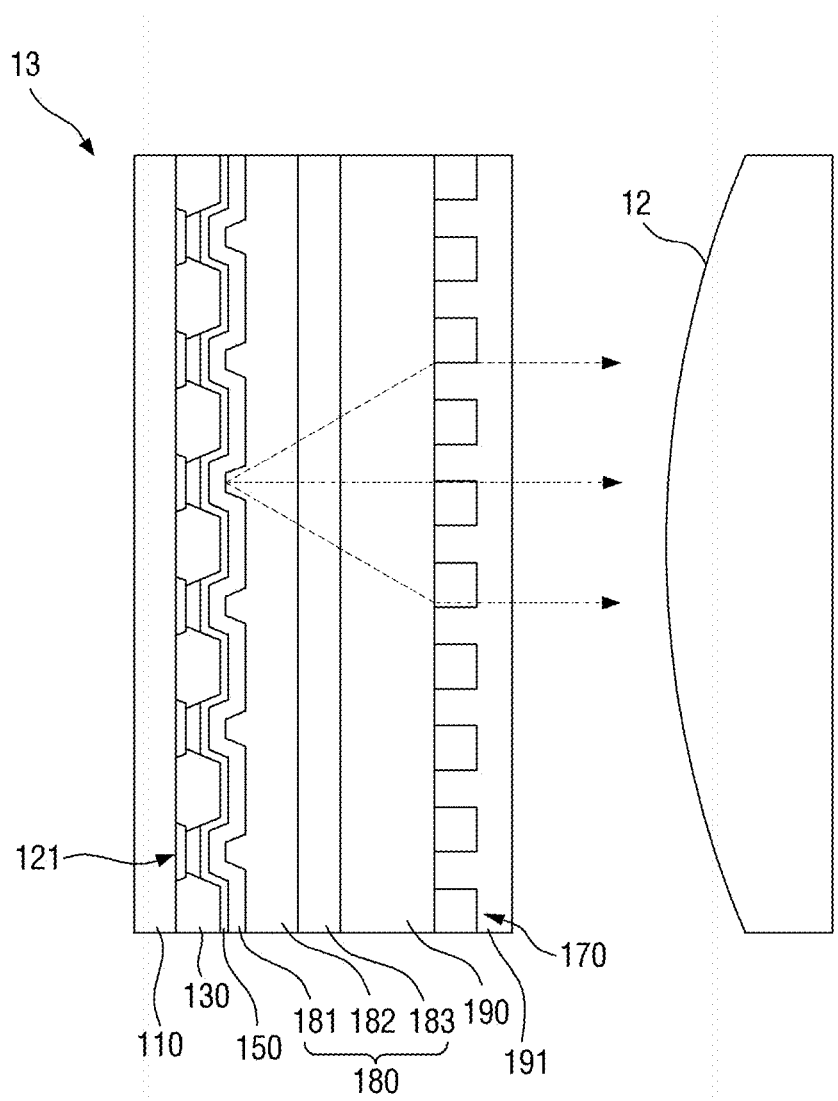

FIGS. 52A and 52B are a perspective view and a cross-sectional view of a head-mounted display device including the organic light emitting display device illustrated in FIG.

49. For simplicity, a redundant description of components identical to those described above with reference to FIG. 51 will be omitted.

Referring to FIG. 52B, a second display unit 13 may include an encapsulation layer 180 and a buffer layer 190 disposed on the encapsulation layer 180. The encapsulation layer 180 may be provided by stacking organic and inorganic layers in an exemplary embodiment.

The emission area of the second display unit 13 may be increased by a light interference phenomenon that may occur when light emitted from organic light emitting elements 140 passes through a diffraction pattern layer 170. This indicates that the effective emission area ratio may be increased.

Therefore, the head-mounted display device 10 according to the current embodiment may improve the SDE by increasing the effective emission area ratio.

Figure 53:
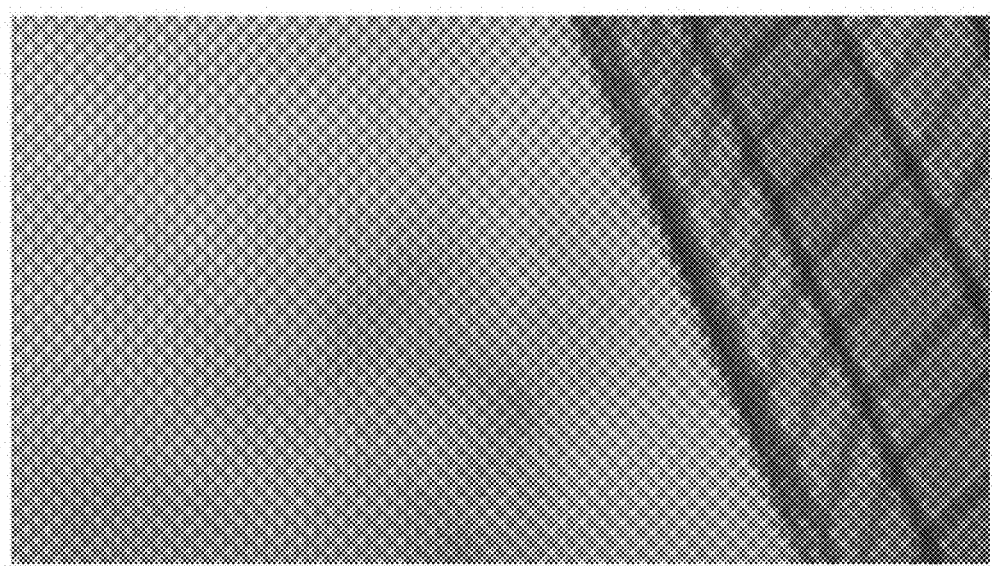
FIG. 53 illustrates a screen door effect ("SDE") in a conventional head-mounted display device.
Figure 54:
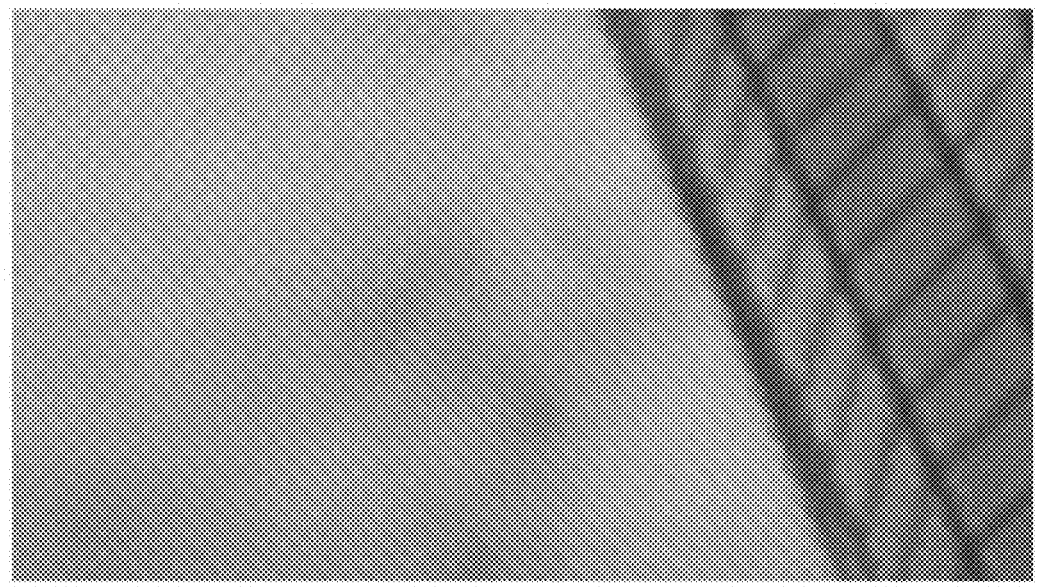
FIG. 54 illustrates an exemplary embodiment of an improvement in the SDE in a head-mounted display device.

FIG. 53 illustrates the SDE in a conventional head-mounted display device. FIG. 54 illustrates an improvement in the SDE in a head-mounted display device according to an exemplary embodiment.

Referring to FIG. 53, gaps between portions of a pixel defining layer are visually recognized as a web. That is, the SDE is recognized. Referring to FIG. 54, gaps between portions of a pixel defining layer are less visible as compared with FIG. 53. This indicates that the SDE has been improved.

According to embodiments, an effective emission area ratio may be increased.

In addition, the degree of blurring perceived may be minimized.

Furthermore, the SDE of a head-mounted display device may be improved.

What is claimed is:

1. A display device comprising:
a substrate;
a pixel electrode on the substrate;
a display element emitting a light and disposed on the pixel electrode;
a common electrode on the display element;
an encapsulation layer on the common electrode;
an air between the display element and the encapsulation layer; and
a plurality of diffraction patterns on the encapsulation layer,
wherein:
the plurality of diffraction patterns includes a first diffraction pattern and a second diffraction pattern arranged along a first direction with a first period,
a width of a cross section of each of the first diffraction pattern and the second diffraction pattern is defined as a first length,
the first length and the first period satisfy Inequality (1):

$$0.4 \leq d1/DP1 \leq 1, \tag{1}$$

where DP1 is the first period, and d1 is the first length.

2. The display device of claim 1, wherein the plurality of diffraction patterns further includes a third diffraction pattern, and
wherein the first diffraction pattern and the third diffraction pattern are arranged along a second direction crossing the first direction with a second period.

3. The display device of claim 1, wherein the plurality of diffraction patterns are protruded from the encapsulation layer.

4. The display device of claim 1, wherein the plurality of diffraction patterns are holes penetrating a diffraction pattern layer on the encapsulation layer.

5. The display device of claim 1, wherein each of the plurality of diffraction patterns has a quadrilateral shape in a plan view,
wherein the first length is a diagonal of the first diffraction pattern.

6. The display device of claim 1, wherein each of the plurality of diffraction patterns has a circle shape or an ellipse shape in a plan view.

7. The display device of claim 6, wherein the first length is a diameter when each of the plurality of diffraction patterns has a circle shape in a plan view.

8. The display device of claim 1, further comprising a protective layer on the diffraction patterns.

9. The display device of claim 1, wherein the encapsulation layer is a glass.

10. The display device of claim 1, wherein the encapsulation layer and the plurality of diffraction patterns comprise a same material.

11. The display device of claim 1, wherein the plurality of diffraction patterns are arranged in a rectangular array in a plan view.

12. The display device of claim 1, wherein each of the plurality of diffraction patterns has a first refractive index and the air has a second refractive index, wherein the first refractive index, the second refractive index, and a thickness of the first diffraction pattern satisfy Inequality (2):

$(m*\lambda)-60$ (nm)$\leq A$ (nm)$\leq (m*\lambda)+60$ (nm)

$$A \neq \Delta n \cdot t1 \text{ (nm)}, \tag{2}$$

where A is a value equal to or greater than $(m*\lambda)-60$ (nm) and equal to or less than $(m*\lambda)+60$ (nm), $\Delta n=|n1-n2|$, n1 is the first refractive index, n2 is the second refractive index, t1 is the thickness of each of the plurality of diffraction patterns, $\lambda$ is a wavelength of the light emitted from the display element, and m is an integer of 0 or more.

13. The display device of claim 1, wherein the plurality of diffraction patterns are arranged in a hexagonal array in a plan view.

14. A display device comprising:
a substrate;
a pixel electrode on the substrate;
a display element emitting a light and disposed on the pixel electrode;
a common electrode on the display element;
an encapsulation layer on the common electrode;
an air between the display element and the encapsulation layer; and
a plurality of diffraction patterns on the encapsulation layer, and, wherein:
a first duplicate emission pattern is generated from a reference emission pattern by the plurality of diffraction patterns, and
the first duplicate emission pattern is separated from the reference emission pattern by a diffraction distance,
wherein:
the air has a second refractive index,
the encapsulation layer has a third refractive index, and
the diffraction distance satisfies an equation (6):

$$\beta = z1 \cdot \tan\left[\sin^{-1}\left(\frac{\lambda}{DP1} \cdot \frac{1}{n151}\right)\right] + z2 \cdot \tan\left[\sin^{-1}\left(\frac{\lambda}{DP1} \cdot \frac{1}{nEN}\right)\right] \tag{6}$$

where β is the diffraction distance, z1 is a shortest distance between the common electrode and the encapsulation layer, z2 is a thickness of the encapsulation layer, DP1 is the first period, n151 is the second refractive index, nEN is the third refractive index, and λ is a wavelength of the light emitted from the display element.

15. A display device comprising:
a substrate;
a pixel electrode on the substrate;
a display element emitting a light and disposed on the pixel electrode;
a common electrode on the display element;
an encapsulation layer on the common electrode;
an air between the display element and the encapsulation layer; and
a plurality of diffraction patterns on the encapsulation layer,
wherein:
the plurality of diffraction patterns include a first diffraction pattern, a second diffraction pattern, and a third diffraction pattern,
the first diffraction pattern neighbors the third diffraction pattern along a first direction in a plan view, and
the first diffraction pattern neighbors the second diffraction pattern along a diagonal direction between the first direction and a second direction crossing the first direction and spaced apart from the second diffraction pattern with a predetermined distance in the plan view,
wherein:
a period between the first diffraction pattern and the second diffraction pattern is a $1a^{th}$ period,
a period between the first diffraction pattern and the third diffraction pattern is a $1b^{th}$ period,
a first duplicate emission pattern and a second duplicate emission pattern are generated from a reference emission pattern by the first diffraction pattern, the second diffraction pattern, and the third diffraction pattern,
the first duplicate emission pattern is separated from a reference emission pattern by a first diffraction distance,
the second duplicate emission pattern is separated from the reference emission pattern by a second diffraction distance,
the air has a second refractive index,
the encapsulation layer has a third refractive index,
the diffraction patterns have a tenth thickness, and
the first diffraction distance or the second diffraction distance is given by Equation (18):

$$\beta 4a = z1 \cdot \tan\left[\sin^{-1}\left(\frac{2\lambda}{\sqrt{3} \cdot DP12a} \cdot \frac{1}{n151}\right)\right] + z2 \cdot \tan\left[\sin^{-1}\left(\frac{2\lambda}{\sqrt{3} \cdot DP12a} \cdot \frac{1}{nEN}\right)\right] \quad (18)$$

where β4a is the first diffraction distance or the second diffraction distance, z1 is a shortest distance between the common electrode and the encapsulation layer, z2 is a thickness of the encapsulation layer, DP12a is the $1a^{th}$ period, DP12b is the $1b^{th}$ period, n151 is the second refractive index, nEN is the third refractive index, and λ is a wavelength of the light emitted from the display element.

16. The display device of claim 15, wherein the second diffraction pattern and the third diffraction pattern are arranged to have an angle of Φ1 with respect to the first diffraction pattern.

17. The display device of claim 16, wherein the angle of Φ1 is 60 degrees.

18. A display device comprising:
a substrate;
a pixel electrode on the substrate;
a display element emitting a light and disposed on the pixel electrode;
a common electrode on the display element;
an encapsulation layer on the common electrode; and
a plurality of diffraction patterns on the encapsulation layer, wherein: the plurality of diffraction patterns include a first diffraction pattern, a second diffraction pattern, and a third diffraction pattern,
a first duplicate emission pattern and a second duplicate emission pattern are generated from a reference emission pattern by the first diffraction pattern, the second diffraction pattern, and the third diffraction pattern,
the first duplicate emission pattern is separated from a reference emission pattern by a first diffraction distance, and
the second duplicate emission pattern is separated from the reference emission pattern by a second diffraction distance,
wherein:
the first diffraction pattern neighbors the third diffraction pattern along the first direction in a plan view,
the first diffraction pattern neighbors the second diffraction pattern along a diagonal direction between the first direction and the second direction and spaced apart from the second diffraction pattern with a predetermined distance in the plan view,
the second diffraction pattern and the third diffraction pattern are arranged to have an angle of ϕ1 with respect to the first diffraction pattern,
a period between the first diffraction pattern and the second diffraction pattern is a $1a^{th}$ period,
a period between the first diffraction pattern and the third diffraction pattern is a $1b^{th}$ period,
the air has a second refractive index,
the encapsulation layer has a third refractive index,
the diffraction patterns have a tenth thickness, and
the first diffraction distance or the second diffraction distance is given by Equation (18):

$$\beta 4a(\beta 4b) = z1 \cdot \tan\left[\sin^{-1}\left(\frac{2\lambda}{\sqrt{3} \cdot DP12a} \cdot \frac{1}{n151}\right)\right] + z2 \cdot \tan\left[\sin^{-1}\left(\frac{2\lambda}{\sqrt{3} \cdot DP12a} \cdot \frac{1}{nEN}\right)\right] \quad (18)$$

where β4a is the first diffraction distance or the second diffraction distance, z1 is a shortest distance between the common electrode and the encapsulation layer, z2 is a thickness of the encapsulation layer, DP12a is the $1a^{th}$ period, DP12b is the $1b^{th\lambda}$ period, n151 is the second refractive index, nEN is the third refractive index, and λ is a wavelength of the light emitted from the display element.

19. The display device of claim 18, wherein the angle of Φ1 is 60 degrees.

20. The display device of claim 18 further comprising an air between the display element and the encapsulation layer.

* * * * *